United States Patent
Coene

(10) Patent No.: US 7,403,138 B2
(45) Date of Patent: Jul. 22, 2008

(54) CODER AND A METHOD OF CODING FOR CODES HAVING A REPEATED MAXIMUM TRANSITION RUN CONSTRAINT OF 2

(75) Inventor: Willem Marie Julia Marcel Coene, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/575,079

(22) PCT Filed: Sep. 8, 2005

(86) PCT No.: PCT/IB2005/052933

§ 371 (c)(1),
(2), (4) Date: Mar. 12, 2007

(87) PCT Pub. No.: WO2006/030349

PCT Pub. Date: Mar. 23, 2006

(65) Prior Publication Data

US 2007/0257826 A1    Nov. 8, 2007

(30) Foreign Application Priority Data

Sep. 15, 2004    (EP)    ................... 04104449

(51) Int. Cl.
    *H03M 5/00*    (2006.01)
(52) U.S. Cl. .......................... 341/58; 341/50
(58) Field of Classification Search .............. 341/50–70
    See application file for complete search history.

(56) References Cited

U.S. PATENT DOCUMENTS

| 5,943,368 | A | 8/1999 | Bergmans et al. |
| 6,265,994 | B1 | 7/2001 | Kahlman |
| 6,469,645 | B2 * | 10/2002 | Coene .......................... 341/59 |
| 6,486,804 | B2 * | 11/2002 | Coene .......................... 341/50 |

(Continued)

FOREIGN PATENT DOCUMENTS

WO    0241500 A1    5/2002

OTHER PUBLICATIONS

Jackyun Moon; "Maximum Transition Run Codes for Data Storage Systems", IEEE Transactions on Magnetics, vol. 32, No. 5, Sep. 1996.

(Continued)

*Primary Examiner*—Lam T Mai
(74) *Attorney, Agent, or Firm*—Michael E. Belk

(57) ABSTRACT

Presently known codes have long trains consisting of 2T runs that reduce the performance of the bit detector. By using a code with an RMTR constraint of 2 an improvement in the bit detection is achieved. A code constructed is a systematic way that provides an RMTR constraint of 2 is presented. Several variations of such a code are disclosed where one or more sub-codes are used, where coding states are divided into coding classes and where code words are divided into code word types. Then, for a given sub-code, a code word type t can be concatenated with a code word of the next sub-code if the subsequent code word of the next sub-code belongs to one of coding states of the coding class with index $T_{max}+1-t$.

64 Claims, 6 Drawing Sheets

U.S. PATENT DOCUMENTS

| | | | | |
|---|---|---|---|---|
| 6,639,525 | B2 * | 10/2003 | Coene | 341/59 |
| 6,731,699 | B2 * | 5/2004 | Pozidis et al. | 375/340 |
| 7,119,721 | B2 * | 10/2006 | Coene | 341/59 |
| 2001/0040518 | A1 | 11/2001 | Coene | |

OTHER PUBLICATIONS

Takushi Nishiya et al; "Turbo-EEPRMI: An EEPR4 Channel With an Error-Correcting Post-Processor Designed for 16/17 Rate Quasi-MTR Code", Systems Development Lab, Hitachi Ltd, Yokohama, Japan, 1998 IEEE.

Zining Wu; Coding and Iterative Detection for Magnetic Recording Channels, Kluwer Academic Publishers, 2000. Book.

Eiji Yamada et al; "Turbo Decoding With Run Length Limited Code for Optical Storage", Jpn. J. Appl. Phys., vol. 41, Mar. 2002, pp. 1753-1756, Part 1, No. 3B.

Roy, L. Adler et al; "Algorithms for Sliding Block Codes", IEEE Transactions on Inf. Theory vol. IT 29, No. 1, Jan. 1983, pp. 5-22.

Eduard F. Stikvoort et al; "An All-Digital Bit Detector for Compact Disc Players", IEEE Journal on Selected Areas in Comm., vol. 10, No. 1, Jan. 1992, pp. 191-200.

Kees A Schouhamer Immink; "A Survey of Codes for Optical Disk Recording", IEEE Journal on Selected Areas in Comm., vol. 19, No. 4, Apr. 2001, pp. 756-764, XP002173088.

Kees A. Schouhamer Immink et al; "Efficient DC-Free RLL Codes for Optical Recording", IEEE Transactions on Communications, vol. 51, No. 3, Mar. 2003.

K.A.S. Immink; "Codes for Mass Data Storage Systems", The Netherlands, Shannon Foundation Publishers, 1999.

J.J. Ashley et all; "Time-Varying Encoders for Constrained Systems: An Approach to Limiting Error Propagation", IEEE Transactions on Information Theory, vol. 46, No. 3, pp. 1038-1043, May 2000.

* cited by examiner

CODER AND A METHOD OF CODING FOR CODES HAVING A REPEATED MAXIMUM TRANSITION RUN CONSTRAINT OF 2

INTRODUCTION

This invention relates to a method of converting a user bitstream into a coded bitstream by means of an overall channel code, to a recording device using said method of converting a user bitstream into a coded bitstream by means of an overall channel code and a playback device for decoding a user bit stream coded using the method of converting a user bitstream into a coded bitstream by means of an overall channel code.

BACKGROUND ART

In the literature of run length limited coding, the Repeated Maximum Transition Run, i.e. RMTR, constraint is often referred to as the MTR constraint. Originally, the maximum transition-run (MTR) constraint as introduced by J. Moon and B. Brickner, in "Maximum transition run codes for data storage systems", IEEE Transactions on Magnetics, Vol. 32, No. 5, pp. 3992-3994, 1996, (for a d=0 case) specifies the maximum number of consecutive "1"-bits in the NRZ bitstream (where a "1" indicates a transition in the related bi-polar channel bitstream). Equivalently, in the (bi-polar) NRZI bitstream, the MTR constraint limits the number of successive 1T runs. As argued above, the MTR constraint can also be combined with a d-constraint, in which case the MTR constraint limits the number of consecutive minimum runlengths, as is the case for the 17PP code which is used in the Blu-Ray disc (BD) format. The basic idea behind the use of MTR codes is to eliminate the so-called dominant error patterns, that is, those patterns that would cause most of the errors in the partial response maximum likelihood (PRML) sequence detectors used for high density recording. A highly efficient rate 16→17 MTR code limiting the number of consecutive transitions to at most two for d=0 has been described by T. Nishiya, K. Tsukano, T. Hirai, T. Nara, S. Mita, in "Turbo-EEPRML: An EEPRML channel with an error correcting post-processor designed for $^{16}/_{17}$ rate quasi MTR code", Proceedings Globecom '98, Sydney, pp. 2706-2711, 1998. Another argument in favor of the RMTR constraint is to limit the back-tracking depth (or trace-back depth) of the Viterbi (PRML) bit-detector. The disclosure of U.S. Pat. No. 5,943,368 aims to encode data into a channel bitstream that prohibits the generation of single-frequency components (which can be a long repetition of (minimum) runlengths).

The RMTR constraint has recently regained some interest in the optical recording community. The ETM-code disclosed in K. Kayanuma, C. Noda and T. Iwanaga, "Eight to Twelve Modulation Code for High Density Optical Disk", Technical Digest ISOM-2003, Nov. 3-7, 2003, Nara, Japan, paper We-F-45, pp. 160-161 has d=1, k=10 and r=5 constraints, this r constraint being just one lower than the RMTR of 17PP. For d=1 and RMTR r=2, the theoretical Shannon capacity amounts to:

$$C(d=1, k=\infty, r=2) = 0.679286. \quad (1)$$

So, a code with rate better than 2/3 is still feasible. For an even more aggressive RMTR constraint r=1, the theoretical Shannon capacity amounts to:

$$C(d=1, k=\infty, r=1) = 0.650900. \quad (2)$$

This shows that r=2 is the lowest RMTR constraint that is possible for a code rate not lower than that of the 17PP code.

Recently, in K. A. S. Schouhamer Immink, "Method and Apparatus for Coding Information, Method and Apparatus for Decoding Coded Information, Method of Fabricating a Recording Medium, the Recording Medium and Modulated Signal", PCT Patent WO 02/41500 A1, International Filing Date 11 Nov. 2000, and in K. A. S. Immink, J.-Y. Kim, S.-W. Suh, S. K. Ahn, "Efficient dc-Free RLL Codes for Optical Recording", IEEE Transactions on Communications, Vol. 51, No. 3, pp. 326-331, March 2003, some very efficient d=1 codes were disclosed with a code-rate that is very close to the Shannon capacity for d=1, given by C(d=1, k=∞, r=∞)=0.6942. As an example, a code with a rate of R=9/13 has been realized, which has a code efficiency $$\eta = \frac{R}{C}$$

such that 1−η=0.28%. However, these very efficient RLL codes suffer from the absence of an RMTR constraint (r=∞); therefore, the latter 9-to-13 d=1 code cannot yield the practical capacity benefit of 5% (through adapted PRML sequence detection) that is offered by d=1 codes with r=2.

The performance gain due to the RMTR constraint has been studied experimentally for high-density optical recording channels derived from the Blu-ray Disc (BD) system. Experiments have been performed using the increased-density BD rewritable system with the disc capacity increased from the standard 23.3-25-27 GB to 35 GB. PRML (Viterbi) bit detection has been employed.

Performance of the Viterbi bit detector has been measured based on the sequenced amplitude margin (SAM) analysis. In the relevant range of capacities around 35 GB, 1 dB gain in SAMSNR means almost 6% disc capacity increase.

Channel codes with different RMTR constraints have been compared to each other. In order to separate read-channel performance gain due to the imposed RMTR constraint from the corresponding write-channel gain, two different Viterbi bit detectors have been used: one which is aware of the RMTR constraint, and the other which is not. In the second case the performance gain can be attributed solely to the improved spectral content of the data written on the disc (such that it is better matched to the characteristics of the write channel used).

When the 17PP channel code with the RMTR constraint r=6 (as used in the BD system) is employed, SAMSNR of 11.66 dB is achieved for both RMTR-aware and RMTR-unaware bit detectors, i.e. no RMTR-related performance gain is observed in the read channel. When the channel code with r=2 is used, SAMSNR of 12.55 dB and 12.07 dB are achieved for the RMTR-aware and RMTR-unaware bit detectors correspondingly. As one can see, a total RMTR-related SAMSNR increase of about 0.9 dB is gained with respect to the case of r=6, which corresponds with about 5% disc capacity increase.

DISADVANTAGE OF THE PRIOR ART

At very high densities for a d=1 constrained storage system well beyond the 25 GB of Blu-ray Disc (e.g. capacities on a 12 cm disc in the range of 33-37 GB), consecutive 2T runs are the Achilles' heel for the bit-detection. Such sequences of 2T runs bounded by larger runlengths at both sides, are called 2T-trains.

Currently, the 17PP code of Blue-Disk has a so-called RMTR constraint (Repeated Maximum Transition Runlength) of r=6, which means that the number of consecutive minimum runlengths is limited to 6 or, equivalently, the maximum length of the 2T-train is 12 channel bits. The 17PP code is based on the parity-preserve principle for DC-control.

It is a disadvantage of the presently known codes that these long trains consisting of consecutive 2T runs reduce the performance of the bit detector.

OBJECTIVE OF THE INVENTION

It is therefore the objective of the present invention to provide a code with particularly chosen constraints that improves the performance of the bit-detector.

Solution

This objective is achieved by the present invention by performing the following steps:

M-bit information words are converted into N-bit code words, said overall channel code being realized through the concatenation of a number S of sub-codes in a cyclically repeated order with a predetermined repeat period, wherein each of the sub-codes receives $m_i$-bit information words, where $m_i$ is an integer characteristic for each of the sub-codes, that are converted into $n_i$-bit code words, where $n_i$ is an integer characteristic for each of the sub-codes, and where for each sub-code, said characteristic integer number $n_i$ is greater than said characteristic integer number $m_i$, such that the sum of the $m_i$-numbers of all sub-codes within said repeat period equals M, and that the sum of the $n_i$-numbers of all sub-codes within said repeat period equals N, and:

for each sub-code, its $n_i$-bit code words are being divided into a number of $T_{max}$ different code-word types and are being arranged into $T_{max}$ coding classes of coding states such that, for a given sub-code, an $n_i$-bit code word of type t (where t is an integer number between 1 and $T_{max}$) can be concatenated with an $n_{i+1}$-bit code word of the next sub-code if said subsequent code word of said next sub-code belongs to one of coding states of the coding class with index $T_{max}+1-t$.

Using the same d=1 constraint as for 17PP a reduced RMTR constraint of r=2 allows a better performance of the bit detection. The bit-detection performance is improved considerably, which in turn enables a significant capacity increase (about 5%) compared to the 17PP coding which employs r=6. In addition, an extra capacity increase of 1.25% up to 1.4% can be realized through a much more efficient code construction, yielding a better code rate then the R=2/3 of the 17PP code.

To construct such a code the code is divided into a number of sub-codes that together form the overall code. The sub-codes are used in a sequential order and are cyclically repeated. Each sub-code is used to process a received $m_i$-bit information word, converting the $m_i$-bit information word into an $n_i$-bit code word. This ensures the systematic coding of the information words into code words. To ensure that the d constraint together with the r constraint are complied with, the $n_i$-bit code words are being divided into a number of $T_{max}$ different code-word types and are being arranged into $T_{max}$ coding classes of coding states such that, for a given sub-code, an $n_i$-bit code word of type t (where t is an integer number between 1 and $T_{max}$) can be concatenated with an $n_{i+1}$-bit code word of the next sub-code if said subsequent code word of said next sub-code belongs to one of coding states of the coding class with index $T_{max}+1-t$. The code word type thus defines which coding class is used to select a coding state from. By prescribing this selection of coding class, the encoding of the next information word into a code word using the next sub-code will be performed in such a way that the code word, when appended to the current code word will comply with the d constraint together with the r constraint.

In an embodiment of the method the code-word type is determined by a number of trailing bits of said code-word.

The trailing bits of the code word can be used to determine the code word type since the trailing bits of the code word have a substantial impact on the compliance with the d constraint and the r constraint of the concatenation of the code word with those trailing bits and the next code word which is concatenated to the trailing bits of the code word.

In a further embodiment of the method the code-word type is determined by all bits of said code-word, together with a number of bits of at least one preceding code-word.

When the size of the code words is relatively short compared to the number of bits affected by the r constraint a single code word may no longer have sufficient (trailing) bits to uniquely define a code word type. To solve this problem multiple code words may considered together as an ensemble and the trailing bits of this ensemble then define the code word type of the ensemble for the purpose of determining the coding class to be used for obtaining the next code word.

In a further embodiment of the method the concatenated N-bit code words satisfy a dkr-constraint, where d and k refer to, respectively, the minimum number and the maximum number of zero-bits between two consecutive one-bits in the coded bitstream, and where r indicates the maximum number of consecutive minimum runs of d zero-bits each preceded by a one-bit.

The introduction of the k constraint allows the improved adaptation of the code to the channel, for instance, for the purpose of control loops for the required adaptation in a receiver, like is needed for timing recovery.

In a further embodiment of the method the number of different code-word types and non-empty coding classes, wherein a non-empty coding class is defined to have at least one coding state, which number is denoted T, is not larger than $T_{max}=1+(d+1)\times(r+1)$.

Limiting the number of non-empty coding classes to a value of T which is smaller or equal $T_{max}$ which is in turn defined by the d constraint and the r constraint by the formula $T_{max}=1+(d+1)\times(r+1)$ allows the design of compact and efficient codes that satisfy the d and r constraint with a minimum amount of coding classes and coding states to reduce the complexity compared to the situation where the number of coding classes is equal to its maximum value $T_{max}$.

In a further embodiment of the method the number of different code-word types and coding classes, denoted T, equals $T_{max}=1+(d+1)\times(r+1)$.

In the case of a code without empty coding classes the equation for the optimum number of coding classes T is $1+(d+1)\times(r+1)$ so that T equals $T_{max}$.

In a further embodiment of the method with constraints d=1 and r=2, $T_{max}$ equals 7.

A code with constraints d=1 and r=2 according to the invention can be realized with a maximum of 7 coding classes, thus limiting the number of coding classes to limit the complexity of encoding and decoding.

In a further embodiment of the method $T=T_{max}=7$ and the number of sub-codes S equals 6.

With the constraints d=1 and r=2, the maximum number of coding classes is 7 and a code using only 6 sub-codes can be constructed thus further limiting the complexity of the encoding and decoding.

In a further embodiment of the method five of the six sub-codes have a mapping with m=8 and n=12, and the sixth sub-code has a mapping with m=8 and n=11. Using at least one sub code with a mapping different from the mapping of the other five sub-codes allows the coding rate to be adjusted more closely to the channel capacity compared to the situation where all mappings for all sub-codes are identical.

The resulting overall code thus more closely approximates the channel capacity resulting in a more efficient use of the available channel capacity.

In a further embodiment of the method $T=T_{max}=7$ and the number of sub-codes S equals 3.

It has been found that a code can be constructed having 7 coding classes using a set of three sub-codes only. This again allows the limitation of the complexity of the encoding and decoding.

In a further embodiment of the method two of the three sub-codes have m=9 and n=13, and the third sub-code has m=9 and n=14.

Using at least one sub code with a mapping different from the mapping of the other two sub-codes allows the coding rate to be adjusted more closely to the channel capacity compared to the situation where all mappings for all sub-codes are identical. The resulting overall code thus more closely approximates the channel capacity resulting in a more efficient use of the available channel capacity.

In a further embodiment of the method $T=T_{max}=7$ and the number of sub-codes S equals 1.

It has been found that a code can be constructed having 7 coding classes using only one sub-code. This again allows the limitation of the complexity of the encoding and decoding.

In a further embodiment of the method the single sub-code has a mapping with m=4 and n=6.

A mapping with m=4 and n=6 constitutes a substantial reduction in complexity and allows a soft-decision decoding.

In a further embodiment of the method the single sub-code has a mapping with m=2 and n=3.

A mapping with m=2 and n=3 constitutes a substantial reduction in complexity and allows a soft-decision decoding.

In a further embodiment of the method, for each of the sub-codes, each of said $T \leq T_{max}$ non-empty coding classes of coding states comprises $p_1, p_2, \ldots, p_{max}$ coding states, wherein the trivial empty coding classes are omitted, such that for the numbers representing the non-zero number of states of the non-empty coding classes $p_1 \leq p_2 \leq \ldots \leq p_{max}$, and with $p_{max}$ giving the total number of coding states for said considered sub-code, and each of the $p_i$ coding states of a given considered class "i", is also a coding state of all classes that have an index larger than "i".

In a further embodiment of the method where d=1 and r=2, for each sub-code the trailing bits are specified for the different code word types by the following set of rules, that is, the n-bit code words of the 1st type end with

"00", the n-bit code words of the 2nd type end with

"0010", the n-bit code words of the 3rd type end with

"001010", the n-bit code words of the 4th type end with

"00101010", the n-bit code words of the 5th type end with

"001", the n-bit code words of the 6th type end with

"00101", the n-bit code words of the 7th type end with

"0010101", and wherein the leading bits of the code words belonging to the different coding classes are determined by the following set of rules, that is, the n-bit code words of a coding state of the 1st class start with

"00", the n-bit code words of a coding state of the 2nd class start with

"00" or "0100", the n-bit code words of a coding state of the 3rd class start with "00", "0100" or "010100", the n-bit code words of a coding state of the 4th class start with "00", "0100", "010100" or "01010100", the n-bit code words of a coding state of the 5th class start with "00", "0100", "010100", "010101000" or "100", the n-bit code words of a coding state of the 6th class start with "00", "0100", "010100", "0101010100", "100" or "10100", the n-bit code words of a coding state of the 7th class start with "00", "0100", "010100", "01010100", "100", "10100" or "1010100".

A method for converting information words into code words using a code with the constraints d=1 and r=2, having 7 coding classes results in a set of code word types defined by the trailing bits of the code words and a set of coding classes comprising coding states defined by the leading bits of the code words produced by that coding state.

In a further embodiment of the method, with the above case of 6 sub codes and 8 bit input words, for the first sub-code the number of coding states for each of the T=7 classes of coding states amounts to $p_1=11, p_2=15, p_3=17, p_4=17, p_5=24, p_6=27$ and $p_7=28$, and where for the second sub-code the number of coding states for each of the 7 classes of coding states amounts to $p_1=10, p_2=14, p_3=15, p_4=16, p_5=22, p_6=25$ and $p_7=26$, and where for the third sub-code the number of coding states for each of the 7 classes of coding states amounts to $p_1=9, p_2=13, p_3=14, p_4=14, p_5=20, p_6=23$ and $p_7=24$ and where for the fourth sub-code the number of coding states for each of the 7 classes of coding states amounts to $p_1=8, p_2=11, p_3=13, p_4=13, p_5=19, p_6=21$ and $p_7=22$ and where for the fifth sub-code the number of coding states for each of the 7 classes of coding states amounts to $p_1=8, p_2=11, p_3=12, p_4=12, p_5=17, p_6=19$ and $p_7=20$ and where for the sixth sub-code the number of coding states for each of the 7 classes of coding states amounts to $p_1=7, p_2=10, p_3=11, p_4=12, p_5=16, p_6=18$ and $p_7=19$.

For a coding method using 6 sub-codes these are the amount of coding states per coding class per sub-code. The design has been chosen such that the maximum number of coding states considered over all sub codes is minimized.

Each sub-code comprises the same amount of coding classes but the coding classes comprise different number of coding states, dependent on the considered sub-code. As can be seen above the number of coding states for each coding class for each sub-code increases along with the number of the coding class for that sub-code.

In a further embodiment of the method, with the above case of a three sub codes and 9 bit input words, for the first sub-code the number of coding states for each of the T=7 classes of coding states amounts to $p_1=7$, $p_2=10$, $p_3=11$, $p_4=11$, $p_5=16$, $p_6=18$ and $p_7=19$, and where for the second sub-code the number of coding states for each of the 7 classes of coding states amounts to $p_1=8$, $p_2=12$, $p_3=13$, $p_4=13$, $p_5=19$, $p_6=21$ and $p_7=22$, and where for the third sub-code the number of coding states for each of the 7 classes of coding states amounts to $p_1=10$, $p_2=14$, $p_3=15$, $p_4=16$, $p_5=22$, $p_6=25$ and $p_7=26$.

For a coding method using 3 sub-codes these are the amount of coding states per coding class per sub-code.

In a further embodiment of the method, with the above case of a single sub code and 4 bit input words, the number of coding states for each of the T=7 classes of coding states amounts to $p_1=3$, $p_2=4$, $p_{3=5}$, $p_4=5$, $p_5=7$, $p_6=8$ and $p_7=8$. For a coding method using a single sub-code these are the amount of coding states per coding class. The design has been chosen such that the maximum number of coding states considered over all sub codes is minimized.

In a further embodiment of the method a finite k-constraint is realized through an extra coding state. Introducing an extra coding state allows the method to select the new coding state to start the encoding of the next information word from in case that the all-zero code word is emitted from that state where in the code without extra state, a next all-zero codeword would be emitted. The Finite State Machine can then be designed using the extra coding state to ensure that the finite k-constraint is automatically met.

In a further embodiment of the method with the above case of a single sub-code and 2-bit input words, the number of non-trivial coding classes T equals 6, with coding class number 4 being the empty one, yielding $p_4=0$, and where the number of coding states for each of the 6 non-trivial coding classes of coding states amounts to $p_1=2$, $p_2=2$, $p_3=3$, $p_5=4$, $p_6=5$ and $p_7=5$.

This is an implementation of a coding method comprising a coding class that comprises no coding states, i.e. an empty coding class. Choosing this set of coding classes with the indicated number of coding states allows an efficient code with a 2-to-3 mapping to be constructed. The 2-to-3 mapping allows an efficient implementation of a soft decision detection since it reduces the complexity in terms of the number of branches that leaves from each state of the Finite State Machine, which number equals $2^m$.

In a further embodiment of the method the parity-preserve property is realized through a number of extra coding states.

Extra coding states in the coding classes provides a new, extra, coding state which can be used whenever the parity preserve property is violated in a current state, so that overall a parity preserving code is obtained.

In a further embodiment of the method a finite k-constraint is realized through an extra coding shell on top of the basic 2-to-3 mapping of the code.

In a further embodiment of the method with constraints d=2 and r=2, $T_{max}$ equals 10.

With 10 coding classes a method for converting information words into code words that complies with the constraints d=2 and r=2 can be constructed.

In a further embodiment of the method the number of coding classes T equals the maximum number of coding classes $T_{max}$ which equals 10 and the number of sub-codes S equals 4.

In a further embodiment of the method three of the four sub-codes have a mapping with m=8 and n=15, and the fourth sub-code has a mapping with m=8 and n=14. This allows a close approximation of the channel capacity In a further embodiment of the method where d=2 and r=2 for each sub-code the trailing bits are specified for the different code word types by the following set of rules, that is, the n-bit code words of the 1st type end with

"000", the n-bit code words of the 2nd type end with

"000100", the n-bit code words of the 3rd type end with

"000100100", the n-bit code words of the 4th type end with

"000100100100", the n-bit code words of the 5th type end with

"00010", the n-bit code words of the 6th type end with

"00010010", the n-bit code words of the 7th type end with

"00010010010", the n-bit code words of the 8th type end with

"0001", the n-bit code words of the 9th type end with

"0001001", the n-bit code words of the 10th type end with

"0001001001", and wherein the leading bits of the code words belonging to the different coding classes are determined by the following set of rules, that is, the n-bit code words of a coding state of the 1st class start with

"000", the n-bit code words of a coding state of the 2nd class start with

"000" or "001000", the n-bit code words of a coding state of the 3rd class start with "000", "001000" or "001001000", the n-bit code words of a coding state of the 4th class start with "000", "001000", "001001000" or "001001001000", the n-bit code words of a coding state of the 5th class start with "000", "001000", "001001000", "001001001000" or "01000", the n-bit code words of a coding state of the 6th class start with "000", "001000", "001001000", "001001001000", "01000" or "01001000", the n-bit code words of a coding state of the 7th class start with "000", "001000", "001001000", "001001001000", "01000", "01001000" or "01001001000", the n-bit code words of a coding state of the 8th class start with "000", "001000", "001001000", "001001001000", "01000", "01001000", "01001001000" or "1000", the n-bit code words of a coding state of the 9th class start with "000", "001000", "001001000", "001001001000", "01000", "01001000", "01001001000", "1000" or "1001000", the n-bit code words of a coding state of the 10th class start with "000", "001000", "001001000", "001001001000", "01000", "01001000", "01001001000", "1000", "1001000" or "1001001000".

In a further embodiment of the method with the above case for four sub-codes and 8 bit input words, for the first sub-code the number of coding states for each of the T=10 classes of coding states amounts to $p_1=8$, $p_2=11$, $p_3=12$, $p_4=12$, $p_5=16$, $p_6=17$, $p_7=18$, $p_8=24$, $p_9=26$ and $p_{10}=26$, and where for the second sub-code the number of coding states for each of the 10 classes of coding states amounts to $p_1=7$, $p_2=10$, $p_3=11$, $p_4=11$, $p_5=15$, $p_6=16$, $p_7=16$, $p_8=21$, $p_9=23$ and $p_{10}=24$, and where for the third sub-code the number of coding states for each of the 10 classes of coding states amounts to $p_1=7$, $p_2=9$, $p_3=10$, $p_4=10$, $p_5=13$, $p_6=14$, $p_7=15$, $p_8=19$, $p_9=21$ and $p_{10}=22$, and where for the fourth sub-code the number of coding states for each of the 10 classes of coding states amounts to $p_1=6$, $p_2=8$, $p_3=9$, $p_4=9$, $p_5=12$, $p_6=13$, $p_7=13$, $p_8=18$, $p_9=19$ and $p_{10}=20$.

For a coding method using 4 sub-codes these are the amount of coding states per coding class per sub-code. The design has been chosen such that the maximum number of coding states considered over all sub codes is minimized.

Each sub-code comprises the same amount of coding classes but the coding classes comprise different number of coding states, dependent on the considered sub-code. As can be seen above the number of coding states for each coding class for each sub-code increases along with the number of the coding class for that sub-code.

The invention will now be described based on figures and tables.

SECTION 1

A d=1 r=2 code for nine bit information words

As has been discussed above, the Shannon capacity of the combined RLL constraints d=1 and r=2 amounts to $C(d=1, k=\infty, r=2)=0.679286$. A code with mapping of user bits onto channel bits of 27-to-40 may be possible to construct, since it has a rate $R=0.675 \leq C(d=1,k=\infty,r=2)$: the efficiency of this new code $\eta=R/C(d=1,k=\infty,r=2)$ is such that only the small fraction $1-\eta=0.63\%$ is lost compared to the theoretical upper limit. Obviously, code books with 27-bit entries are much too large to be of any practical use. In order to circumvent this problem, a solution is proposed that follows the lines of the algorithm presented in J. J. Ashley and B. H. Marcus, "Time-Varying Encoders for Constrained Systems: an Approach to Limiting Error Propagation", IEEE Transactions on Information Theory, Vol. 46, No. 3, pp. 1038-1043, May 2000. The latter approach generalizes the well known state-splitting algorithm or ACH-algorithm as disclosed by R. L. Adler, D. Coppersmith, and M. Hassner, "Algorithms for Sliding Block Codes. An Application of Symbolic Dynamics to Information Theory", IEEE Transaction on Information Theory, Vol. IT-29, 1983, pp. 5-22, used for the construction of efficient sliding block codes, for a concatenation of a number of codes at multiple phases, where the encoding and decoding proceeds cyclically from one phase to the next. Practically, for the new code with rate $R=27/40$, the overall code can be realized as a cyclic concatenation of three sub-codes, denoted $C_1$, $C_2$ and $C_3$, with respective mappings 9-to-13, 9-to-13 and 9-to-14. Such a repetition is shown in FIG. 1.

Figure 1:
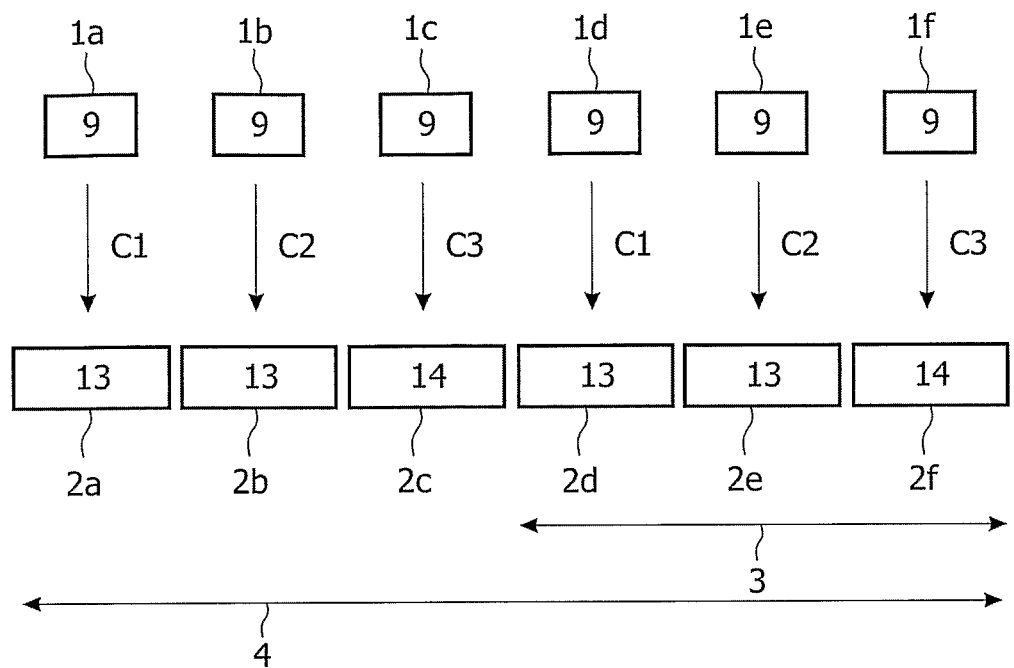
FIG. 1 shows a code comprising a repetition of three sub-codes.

FIG. 1 shows the repetition of the three subcodes C1, C2, C3. The user words 1a, 1b, 1c, 1d, 1e, 1f are 9 bit. The repeat period 3 of the sub-codes is indicated by the arrow and comprises a repetition of the three sub-codes C1, C2, C3. The user words 1a, 1b, 1c, 1d, 1e, 1f are converted into channel words 2a, 2b, 2c, 2d, 2e, 2f, which after concatenation form the coded bit stream 4. One of the sub-codes converts the 9 bit user word into a 14 bit channel word, i.e. code word, while the remaining sub-codes convert the user word into a 13 bit channel word.

In the general case, the overall code is realized by a number of S sub-codes. The generalized ACH-algorithm looks for a set of S approximate eigenvectors, one for each sub-code, with $v_i^k$ denoting the i-th coefficient of the approximate eigenvector for the k-th sub-code, that satisfies the set of inequalities, for all states i of the corresponding state-transition diagram (STD) that describes the RLL constraints, and for all sub-codes k (with a mapping $m_k$-to-$n_k$ for the k-th sub-code):

$$\Sigma_j D_{i,j}^{m_k} v_j^{k+1} \geq 2^{n_k} v_i^k. \tag{3}$$

Note that when k=S, the next sub-code with index k+1 due to the cyclic repeat-period of the sub-codes is the one with index equal to 1. In the above equation, D represent the so-called adjacency-matrix or connection-matrix for the STD: its matrix elements are equal to one if the corresponding two STD-states are connected in the graph, and are equal to zero if they are not connected. For the new code with RLL constraints d=1 and r=2, the three sub-codes have the parameters $m_1=m_2=m_3=9$, and $n_1=13$, $n_2=13$ and $n_3=14$. (Note that any scrambled order of these three mappings is also a valid order for the further code-construction, and falls within the scope of the current invention.) The cyclic repetition of the three sub-codes (denoted $C_1$, $C_2$ and $C_3$) is shown schematically in FIG. 1. This implies that the following inequalities have to be satisfied for the envisaged new overall code:

$$\Sigma_{j=1}^{7} D_{i,j}^{13} v_j^2 \geq 2^9 v_i^1, i=1,2,\ldots,7, \tag{4}$$

$$\Sigma_{j=1}^{7} D_{i,j}^{13} v_j^3 \geq 2^9 v_i^2, i=1,2,\ldots,7, \tag{5}$$

and $$\Sigma_{j=1}^{7} D_{i,j}^{14} v_j^1 \geq 2^9 v_i^3, i=1,2,\ldots,7. \tag{6}$$

Figure 2:
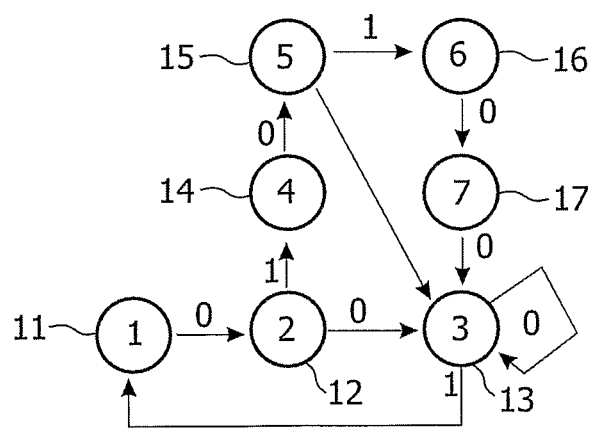
FIG. 2 shows the State Transition Diagram for d=1 and r=2 RLL constraints

For the RLL constraints d=1 and r=2, the STD is shown in FIG. 2: it comprises 7 STD states 11, 12, 13, 14, 15, 16, 17, denoted $\sigma_1, \sigma_2, \ldots, \sigma_7$. It should be noted that no k-constraint is considered in this STD. The k-constraint will be introduced at a later stage of the code design, but its introduction will not take place through an adaptation of the current STD. The fan-out of a given STD-state 11, 12, 13, 14, 15, 16, 17 is the collection of code words (of a given length) that can leave from that state. For STD-state $\sigma_i$, the fan-out is denoted $F_{\sigma_i}$. The leading bits of the channel words of the fan-out for the 7 STD-states are listed in Table 1; also the renumbered STD-states that are to be introduced later on, and which are denoted $\hat{\sigma}_i$, are also listed in Table 1. Finally, the different coding classes as will be introduced later on, are also listed in Table 1.

TABLE 1

Characteristics of Fan-Out for STD-states and Definition of Coding Classes.

| Coding Class Nr | Original STD-state | Renumbered STD-state | Leading Bits |
|---|---|---|---|
| 1 | $\sigma_6$ | $\hat{\sigma}_7$ | \|00 . . . |
| 2 | $\sigma_4$ | $\hat{\sigma}_6$ | \|00 . . .<br>\|0100 . . . |
| 3 | $\sigma_1$ | $\hat{\sigma}_5$ | \|00 . . .<br>\|0100 . . .<br>\|010100 . . . |
| 4 | $\sigma_7$ | $\hat{\sigma}_4$ | \|00 . . .<br>\|0100 . . .<br>\|010100 . . .<br>\|01010100 . . . |
| 5 | $\sigma_5$ | $\hat{\sigma}_3$ | \|00 . . .<br>\|0100 . . .<br>\|010100 . . .<br>\|01010100 . . .<br>\|100 . . . |
| 6 | $\sigma_2$ | $\hat{\sigma}_2$ | \|00 . . .<br>\|0100 . . .<br>\|010100 . . .<br>\|01010100 . . .<br>\|100 . . .<br>\|10100 . . . |
| 7 | $\sigma_3$ | $\hat{\sigma}_1$ | \|00 . . .<br>\|0100 . . .<br>\|010100 . . .<br>\|01010100 . . .<br>\|100 . . .<br>\|10100 . . .<br>\|1010100 . . . |

From Table 1, it is clear that the following hierarchy in fan-out applies (with STD-state $\sigma_3$ having the largest fan-out):

$$F_{\sigma_6} \subset F_{\sigma_4} \subset F_{\sigma_1} \subset F_{\sigma_7} \subset F_{\sigma_5} \subset F_{\sigma_2} \subset F_{\sigma_3}. \quad (7)$$

The new RLL code is constructed on the basis of a plurality of coding states, one set of coding states for each sub-code. According to the present invention, these coding states are arranged into seven classes as follows:

the n-bit code words of the 1st class of coding states belong to $F_{\sigma_6}$ (or $F_{\sigma_7}$);

the n-bit code words of the 2nd class of coding states belong to $F_{\sigma_4}$ (or $F_{\sigma_6}$);

the n-bit code words of the 3rd class of coding states belong to $F_{\sigma_1}$ (or $F_{\sigma_5}$);

the n-bit code words of the 4th class of coding states belong to $F_{\sigma_7}$ (or $F_{\sigma_4}$);

the n-bit code words of the 5th class of coding states belong to $F_{\sigma_5}$ (or $F_{\sigma_3}$);

the n-bit code words of the 6th class of coding states belong to $F_{\sigma_2}$ (or $F_{\sigma_2}$);

the n-bit code words of the 7th class of coding states belong to $F_{\sigma_3}$ (or $F_{\sigma_1}$).

Due to this specific ordering of the coding classes according to the present invention, a coding state of a coding class i is also a coding state of all coding classes with index j not smaller than i, that is, $j \geq i$. It is thus convenient to order the possible patterns of leading bits of code words as follows:

TABLE 2

Ordering of Leading Bit Patterns.

| i | Pattern |
|---|---|
| 1 | \|00 . . . |
| 2 | \|0100 . . . |
| 3 | \|010100 . . . |
| 4 | \|01010100 . . . |
| 5 | \|100 . . . |
| 6 | \|10100 . . . |
| 7 | \|1010100 . . . |

In addition, it is for the code-construction according to the present invention beneficial to consider the following ordering of the trailing bit patterns (with the arrival state of the STD also indicated, both the original one and the renumbered one) as outlined in Table 3. According to the present invention, code words can be divided into 7 different types as specified by their trailing bit pattern

TABLE 3

Ordering of Trailing Bit Patterns. Definition of Coding Types.

| Coding Type Nr (j) | Pattern | Original STD-state | Renumbered STD-state |
|---|---|---|---|
| 1 | . . . 00\| | $\sigma_3$ | $\hat{\sigma}_1$ |
| 2 | . . . 0010\| | $\sigma_2$ | $\hat{\sigma}_2$ |
| 3 | . . . 001010\| | $\sigma_5$ | $\hat{\sigma}_3$ |
| 4 | . . . 00101010\| | $\sigma_7$ | $\hat{\sigma}_4$ |
| 5 | . . . 001\| | $\sigma_1$ | $\hat{\sigma}_5$ |
| 6 | . . . 00101\| | $\sigma_4$ | $\hat{\sigma}_6$ |
| 7 | . . . 0010101\| | $\sigma_6$ | $\hat{\sigma}_7$ |

It should be noted that the ordered trailing bit patterns (of Table 3) are the mirrored versions of the corresponding ordered leading bit patterns (of Table 2). Next, the already mentioned renumbering of the STD-states is discussed. It is now convenient to renumber the states of the STD in terms of the ordering of the trailing bit-patterns as they were listed in Table 3. This new numbering is outlined in the last two columns of Table 3. The new renumbered states are denoted $\hat{\sigma}_i$. With this new numbering, code words of type i will arrive in the (renumbered) STD-state with the same index, that is, $\hat{\sigma}_i$; consequently, code words of type i can be concatenated with any code word that belongs to a coding state of class 8−i as a subsequent code word. It is to be noted that code words belonging to a coding state of class 8−i have leading bit patterns (from Table 2) with index l where $1 \leq l \leq 8-i$. As an example, code words of type 3 (end with trailing bit pattern . . . 001010\|) can be concatenated with code words from coding states of class 5, which implies that the latter code words may start with the leading bit patterns (Table 2) i=1, i=2, ..., i=5. This division of code words into 7 different types of code words, and the arrangement of coding states into 7 different coding classes, forms the basis for the further code construction: in this way, the RLL constraints d=1 and r=2 always remain satisfied (also upon concatenation of code words of cyclically consecutive sub-codes). From Table 3, it is clear that the following hierarchy in fan-out applies for the renumbered STD-states:

$$F_{\sigma 7} \subset F_{\sigma 6} \subset F_{\sigma 5} \subset F_{\sigma 4} \subset F_{\sigma 3} \subset F_{\sigma 2} \subset F_{\sigma 1}. \qquad (8)$$

The renumbered STD-state $\sigma_1$ has the largest fan-out of all, and $\sigma_7$ the smallest one, with an enumerative ranking according to the decreasing fan-out from $\sigma_1$ to $\sigma_7$. With the renumbered STD-states, and a correspondingly rearranged connection matrix, denoted D, the approximate eigenvector inequalities (for the "new" eigenvectors v) are rewritten as:

$$\Sigma_{j=1}^{7} D_{l,j}^{13} v_j^2 \geq 2^9 v_l^1, \, l=1,2,\ldots,7, \qquad (9)$$

$$\Sigma_{j=1}^{7} D_{l,j}^{13} v_j^3 \geq 2^9 v_l^2, \, l=1,2,\ldots,7, \qquad (10)$$

and $$\Sigma_{j=1}^{7} D_{l,j}^{14} v_j^1 \geq 2^9 v_l^3, \, l=1,2,\ldots,7. \qquad (11)$$

The leading bit patterns and trailing bit patterns of possible code words have been identified in Tables 2 and 3. The number of code words of length n that start with the leading bit pattern i and that end with the trailing bit pattern j is denoted $W_{i,j}[n]$. After close inspection, it turns out that:

$$D_{l,j}^{n} = \Sigma_{i=1}^{8-l} W_{i,j}[n]. \qquad (12)$$

With this knowledge, the approximate eigenvector inequalities can be rewritten into the form:

$$\Sigma_{i=1}^{l} \Sigma_{j=1}^{7} W_{i,j}[13] v_j^2 \geq 2^9 v_{8-l}^1, \, l=1,2,\ldots,7, \qquad (13)$$

$$\Sigma_{i=1}^{l} \Sigma_{j=1}^{7} W_{i,j}[13] v_j^3 \geq 2^9 v_{8-l}^2, \, l=1,2,\ldots,7, \qquad (14)$$

and $$\Sigma_{i=1}^{l} \Sigma_{j=1}^{7} W_{i,j}[14] v_j^1 \geq 2^9 v_{8-l}^3, \, l=1,2,\ldots,7. \qquad (15)$$

The number of coding states per coding class is denoted by the vector $p^s$ for the s-th sub-code (s=1,2,3). Its relation to the approximate eigenvector $v^s$ is given by (for the i-th component, with $1 \leq i \leq 7$):

$$p_i^s = v_{8-i}^s. \qquad (16)$$

Note that with this advantageous construction, the coding classes have a numbering system that is exactly complementary to the numbering system of the renumbered STD-states; this could already have been obvious from Table 1, where the renumbering of STD-states was mentioned, but not explained. Further, again due to the specific construction of the different coding classes, the following inequality holds (for each of the sub-codes s with s=1,2,3):

$$p_1^s \leq p_2^s \leq p_3^s \ldots \leq p_7^s. \qquad (17)$$

An example Code-Design: a code with k=∞

First, the case without k-constraint (k=∞) is considered. The number of code words with specific leading bit pattern (i) and trailing bit pattern (j), denoted $W_{i,j}[n]$, for length n=13 and n=14 are given by:

$$W[13] = \begin{pmatrix} 85 & 33 & 13 & 5 & 53 & 21 & 8 \\ 33 & 13 & 5 & 2 & 21 & 8 & 3 \\ 13 & 5 & 2 & 1 & 8 & 3 & 1 \\ 5 & 2 & 1 & 0 & 3 & 1 & 1 \\ 53 & 21 & 8 & 3 & 33 & 13 & 5 \\ 21 & 8 & 3 & 1 & 13 & 5 & 2 \\ 8 & 3 & 1 & 1 & 5 & 2 & 1 \end{pmatrix} \qquad (18)$$

and $$W[14] = \begin{pmatrix} 136 & 53 & 21 & 8 & 85 & 33 & 13 \\ 53 & 21 & 8 & 3 & 33 & 13 & 5 \\ 21 & 8 & 3 & 1 & 13 & 5 & 2 \\ 8 & 3 & 1 & 1 & 5 & 2 & 1 \\ 85 & 33 & 13 & 5 & 53 & 21 & 8 \\ 33 & 13 & 5 & 2 & 21 & 8 & 3 \\ 13 & 5 & 2 & 1 & 8 & 3 & 1 \end{pmatrix}. \qquad (19)$$

An example Code-Design: a code with a k-constraint

In order to generate a k-constraint without making use of an adapted STD with the k-constraint explicitly included, it is advantageous to limit the number of leading and trailing zeroes in the code words. The maximum number of leading zeroes in a code word is denoted $l_0$; the maximum number of trailing zeroes is denoted $r_0$. The number of code words with specific leading bit pattern i and trailing bit pattern j, with the additional constraint on $l_0$ and $r_0$, is denoted $W_{i,j}^{l_0,r_0}[n]$, for length n of the code word. It should be noted that the previously defined matrices can be identified as:

$$W_{i,j}[n] \equiv W_{i,j}^{\infty,\infty}. \qquad (20)$$

The additional constraint k=18 is realized with the choice $l_0 = r_0 = 9$. The matrices $W^{9,9}[n]$ for code word length n=13 and n=14, are given by:

$$W^{9,9}[13] = \begin{pmatrix} 82 & 32 & 13 & 5 & 52 & 20 & 8 \\ 32 & 13 & 5 & 2 & 21 & 8 & 3 \\ 13 & 5 & 2 & 1 & 8 & 3 & 1 \\ 5 & 2 & 1 & 0 & 3 & 1 & 1 \\ 52 & 21 & 8 & 3 & 33 & 13 & 5 \\ 20 & 8 & 3 & 1 & 13 & 5 & 2 \\ 8 & 3 & 1 & 1 & 5 & 2 & 1 \end{pmatrix} \qquad (21)$$

and $$W^{9,9}[14] = \begin{pmatrix} 131 & 52 & 20 & 8 & 83 & 32 & 13 \\ 52 & 21 & 8 & 3 & 33 & 13 & 5 \\ 20 & 8 & 3 & 1 & 13 & 5 & 2 \\ 8 & 3 & 1 & 1 & 5 & 2 & 1 \\ 83 & 33 & 13 & 5 & 53 & 21 & 8 \\ 32 & 13 & 5 & 2 & 21 & 8 & 3 \\ 13 & 5 & 2 & 1 & 8 & 3 & 1 \end{pmatrix}. \qquad (22)$$

A practical set of approximate eigenvectors of the rewritten approximate eigenvector inequalities is given by:

$$v^1 = \{19,18,16,11,11,10,7\}, \qquad (23)$$

$$v^2 = \{22,21,19,13,13,12,8\}, \qquad (24)$$

$$v^3 = \{26,25,22,16,15,14,10\}. \qquad (25)$$

The first sub-code, denoted $C_1$, with 9-to-13 mapping, has a total of 19 coding states; the second sub-code, denoted $C_2$, also with 9-to-13 mapping, has a total of 22 coding states; and the third sub-code, denoted $C_3$, with 9-to-14 mapping, has a total of 26 coding states. The distribution of the total number of coding states (for each sub-code) over the 7 different coding classes is governed by the approximate eigenvector (for the given sub-code), as indicated by Eq. (16).

The Construction of Code Tables for a code with k=18 The code-tables are further constructed in such a way that a code word (with all its possible next-states) can appear only in one particular coding state. For the decoding operation, this means that the next code word uniquely specifies the "next-state" function of a current code word.

Encoding

For encoding of a 9-bit user word, one needs to know:

(1) the sub-code $C_i$ with which the current user word has to be encoded; and:

(2) the state j of the sub-code $C_i$, denoted $C_i\text{-}S_j$ and the corresponding code table that is to be used for the encoding.

In the process of encoding, the encoder generates as output:

(1) the code word according to the code table that is to be used; and:

(2) the next sub-code that is to be used for the encoding of the next 9-bit user word, which is simply $C_{i+1}$ (which, for i=3, equals $C_1$ due to the cyclic repetition of the three sub-codes); and:

(3) the next state of the next sub-code $C_{i+1}$ according to the code table that is to be used upon encoding for the current user word, where this next state will specify which code table is to be used for the encoding of the next 9-bit user word with the next sub-code $C_{i+1}$.

Decoding

Figure 3:
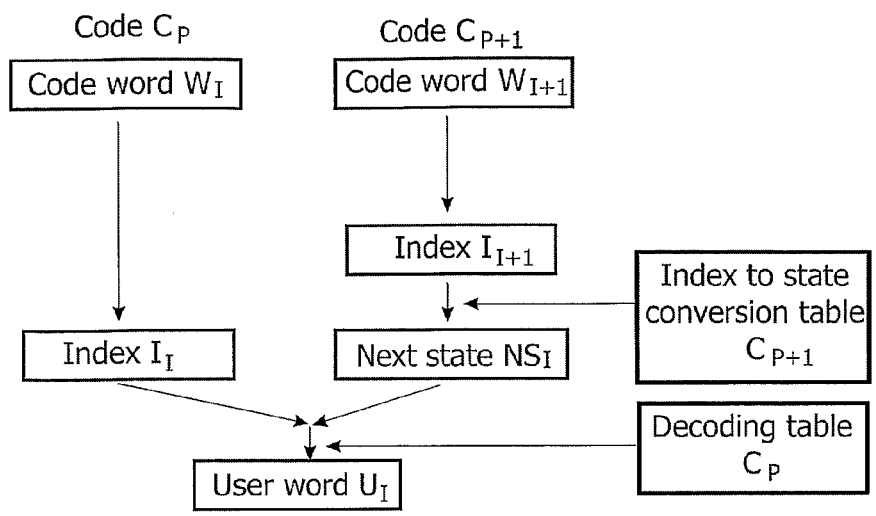
FIG. 3 shows the successive steps for decoding.

The process of decoding is described on the basis of FIG. 3. The decoding is state-independent, that is, it is not required to know the state in which the encoder encoded the 9-bit user word (that is now considered to be decoded). State-independent decoding is achieved by the fact that every code word and next-state combination that may occur, occurs only once in one single code table (among all the coding tables). Further, for the decoding of a code word into a user word, it is also required to know the next-state of the current code word. The latter next-state can be derived from the next code word that immediately follows the current code word. The fact that this is possible is obtained by the construction of the coding states, whereby each code word (independent of its next state) can only occur in a single code table among all the coding tables; so, the next code word unambiguously determines the next state of the current code word. It should be noted that the next state of a given code word, that was encoded with a sub-code $C_p$ is one out of the possible states of the next sub-code, that is, $C_{p+1}$.

The process of decoding is further explained as follows. At the input of the decoder, there are two code words, code word $W_i$ encoded with sub-code $C_p$, and code word $W_{i+1}$ encoded with the next sub-code $C_{p+1}$. For both code words, and independent on the sub-code that applies to each of the code words $W_i$ and $W_{i+1}$, an index can be derived (e.g. based on enumerative decoding for a d=1 RLL constraint: the index ranges from 0 to 609 for a code word of 13 channel bits, and from 0 to 986 for a code word of 14 channel bits). The respective indices are denoted $I_i$ and $I_{i+1}$ for the current and next code words. Next, the index $I_{i+1}$ is converted into a "next-state" of the current code word $W_i$ by means of a special conversion table (with is dependent on the sub-code that applies to the considered word $W_{i+1}$): this table maps each (index of a) code word onto the state to which it belongs for the considered sub-code (which is here $C_{p+1}$). This "next-state" is denoted $NS_i$. The combination of the index of the current code word $W_i$, that is $I_i$, in combination with its decoded next-state $NS_i$ are the input of a special decoding table for the given sub-code $C_p$, which yields the decoded (9-bit) user word.

DC-control through the use of guided scrambling

All RLL codes used in optical recording (EFM, EFMPlus and 17PP) are DC-free, that is, they have almost no content at low frequencies. This property is an example of a frequency domain constraint. Here, restrictions are enforced on the energy content per time unit of the sequence at certain frequencies, that is, on the power spectral density function of the sequence. (Constraints like runlength constraints are called time-domain constraints.) Most of these constraints belong to the family of spectral null constraints, where the power density function of the sequence must have a zero of a certain order at certain specific frequencies. The constraint that specifies a zero at DC, the zero frequency, is referred to as the DC-free constraint. The NRZI channel bits shall be represented by the bipolar values ±1. A sequence $x_1, x_2, \ldots$ is called DC-free if its running digital sum (RDS)

$$RDS_i = x_1 + \ldots + x_i$$

takes on only finitely many different values. In that case, the power spectral density function vanishes at DC.

The DC-free property is needed in optical recording for a number of reasons. Firstly, it is necessary to separate the data signal from low-frequency disc noise such as fingerprints, dust or defects. Secondly, DC-free coding is needed for control of the slicer level in the case of non-linearities in the physical signals like pit-land asymmetries as disclosed by A. F. Stikvoort and J. A. C. van Rens, in "An all-digital bit detector for compact disc players", *IEEE J. Sel. Areas Commun.*, 10, 1: 191-200, 1992. And thirdly, servo systems used for tracking of the laser spot position typically require a DC-free data signal.

Guided Scrambling

Guided Scrambling (GS) can be used for realizing DC-control as is described by K. A. S. Immink, in "*Codes for Mass Data Storage Systems*", The Netherlands: Shannon Foundation Publishers, 1999. Guided Scrambling works as follows. A number $N_{scr}$ of input words 41a, 41b, 41c, 41d, 41i forms a so-called scrambling block 40. The very first s bits of a scrambling block are scrambling bits, which can be chosen freely. Each of these $2^s$ options generate RLL encoded scrambling blocks after the following two operations: firstly, the input bits are passed through a scrambler that is implemented as a linear shift back register, based on a scrambler polynomial; secondly, the scrambled input bits are encoded with the new RLL code (with its three sub-codes) into an RLL channel bitstream. For each of the $2^s$ options, the DC-content is evaluated, e.g. in terms of the variance of the running digital sum, also known as the "sum variance". The option with the "best" DC-suppression properties is then selected.

Distribution of 9-bit ECC Symbols

Figure 4:
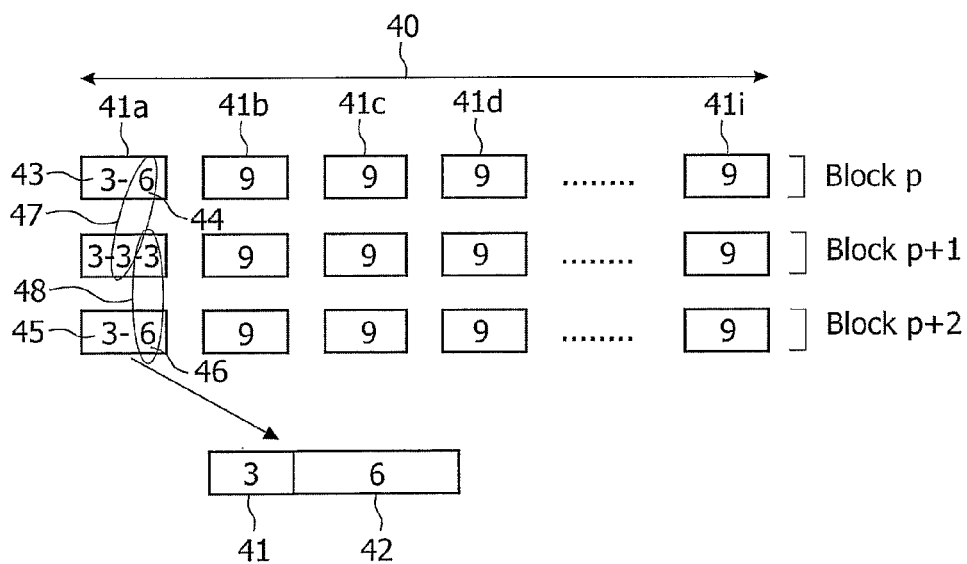
FIG. 4 shows a format for DC control using guided scrambling for 9 bit input words.

FIG. 4 shows a typical example of a format including s scrambling bits in a scrambling block. A scrambling block 40 comprises $N_{scr}$ 9-bit input symbols 41a, 41b, 41c, 41d, 41i (of the new RLL code and its three sub-codes). A possible format for the new RLL code with the same overhead for DC-control as is used in the Blu-ray Disc (BD) format with the 17PP code has $N_{scr}=15$ and $s=3$, which means that there are 8 possible scrambled channel bit streams for each scrambling block. For obvious reasons, it is advantageous for the new RLL code to use an algebraic error-correction code (ECC) based on Reed-Solomon codes with 9-bit ECC-symbols. The insertion of the $s=3$ scrambling bits at the beginning of a scrambling block, disturbs the regular order of the 9-bit symbols as they are used at the input of the encoder of the new RLL code. In order to limit error propagation, a measure as disclosed in U.S. Pat. No. 6,265,994 is adopted, as can be seen from FIG. 4: three successive scrambling blocks are drawn. All 41b, 41c, 41d, 41i but the first 9-bit input words 41a of each scrambling block 40 correspond one-to-one with a 9-bit ECC-symbol. The first input word 41a of the first scrambling block comprises $s=3$ scrambling bits 43, and 6 bits 44 out of a first special ECC-symbol (of 9-bits). Similarly, the first input word of the third scrambling block comprises $s=3$ scrambling bits 45, and 6 bits 46 out of a second special ECC-symbol. The two sets each of the remaining 3 bits of the two special ECC-symbols form, together with yet another set of $s=3$ scrambling bits, the first input word of the second scrambling block. The 9 bits of each of the two special ECC-symbols are indicated with the two ellipses 47, 48 in FIG. 4.

SECTION 2

A d=1 r=2 code for eight bit information words

As has been discussed above, the Shannon capacity of the combined RLL constraints d=1 and r=2 amounts to C(d=1, k=∞,r=2)=0.679286. A code with mapping of user bits onto channel bits of 48-to-71 may be possible to construct, since it has a rate $R=0.676056 \leq C(d=1,k=\infty,r=2)$: the efficiency of this new code $\eta=R/C(d=1,k=\infty,r=2)$ is such that only the small fraction $1-\eta=0.48\%$ is lost compared to the theoretical upper limit. Obviously, code books with 48-bit entries are much too large to be of any practical use. In order to circumvent this problem, a solution is proposed that follows the lines of the algorithm disclosed by J. J. Ashley and B. H. Marcus, in "Time-Varying Encoders for Constrained Systems: an Approach to Limiting Error Propagation", IEEE Transactions on Information Theory, Vol. 46, No. 3, pp. 1038-1043, May 2000. The latter approach generalizes the well known state-splitting algorithm or ACH-algorithm as disclosed by R. L. Adler, D. Coppersmith, and M. Hassner, in Algorithms for Sliding Block Codes. An Application of Symbolic Dynamics to Information Theory", IEEE Transaction on Information Theory, Vol. IT-29, 1983, pp. 5-22 used for the construction of efficient sliding block codes for a concatenation of a number of codes at multiple phases, where the encoding and decoding proceeds cyclically from one phase to the next. Practically, for the new code with rate $R=48/71$, the overall code can be realized as a cyclic concatenation of six sub-codes, denoted $C_1, C_2, C_3, C_4, C_5$ and $C_6$, with respective mappings 8-to-12, 8-to-12, 8-to-12, 8-to-12, 8-to-12 and 8-to-11.

In the general case, the overall code is realized by a number of S sub-codes. The generalized ACH-algorithm looks for a set of S approximate eigenvectors, one for each sub-code, with $v_i^k$ denoting the i-th coefficient of the approximate eigenvector for the k-th sub-code, that satisfies the set of inequalities, for all states i of the corresponding state-transition diagram (STD) that describes the RLL constraints, and for all sub-codes k (with a mapping $m_k$-to-$n_k$ for the k-th sub-code):

$$\Sigma_j D_{i,j}^{m_k} v_j^{k+1} \geq 2^{n_k} v_i^k. \quad (26)$$

Figure 5:
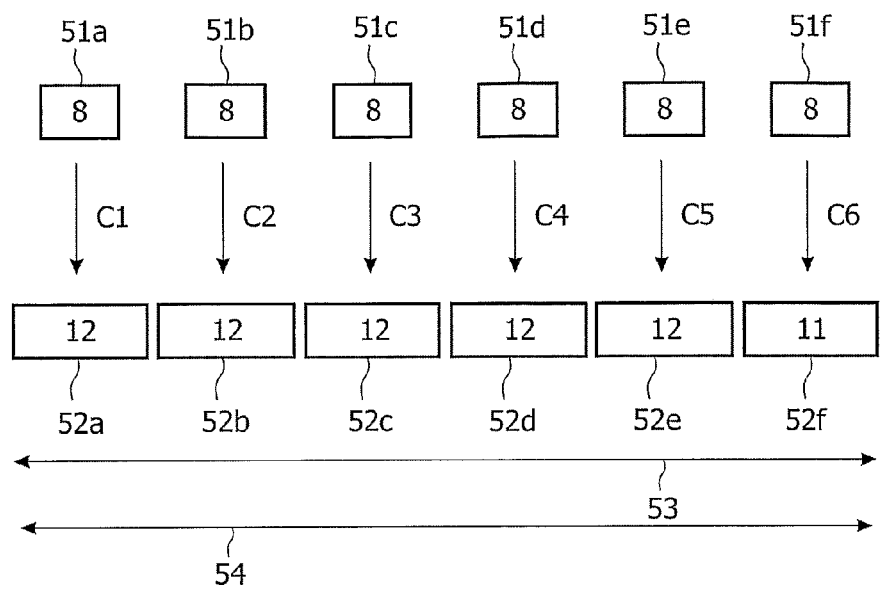
FIG. 5 shows a code comprising a repetition of six sub-codes.

Note that when k=S, the next sub-code with index k+1 due to the cyclic repeat-period of the sub-codes is the one with index equal to 1. In the above equation, D represent the so-called adjacency-matrix or connection-matrix for the STD: its matrix elements are equal to one if the corresponding two STD-states are connected in the graph, and are equal to zero if they are not connected. For the new code with RLL constraints d=1 and r=2, the six sub-codes have the parameters $m_1=m_2=m_3=m_4=m_5=m_6=8$, and $n_1=n_2=n_3=n_4=n_5=12$ and $n_6=11$. (Note that any scrambled order of these six mappings is also a valid order for the further code-construction, and falls within the scope of the current invention.) The cyclic repetition of the six sub-codes $C_1, C_2, C_3, C_4, C_5, C_6$ where each sub-code C1, C2, C3, C4, C5, C6 converts an 8 bit user word 51a, 51b, 51c, 51d, 51e, 51f into channel word 52a, 52b, 52c, 52d, 52e, 52f as is shown schematically in FIG. 5. One sub-code C6 converts the 8 bit user word 51f into an 11 bit channel word 52f, i.e. code word, while the remaining sub-codes C1, C2, C3, C4, C5 convert the 8 bit user words 51a, 51b, 51c, 51d, 51e into 12 bit channel words 52a, 52b, 52c, 52d, 52e. This implies that the following inequalities have to be satisfied for the envisaged new overall code:

$$\Sigma_{j=1}^{7} D_{i,j}^{12} v_j^2 \geq 2^8 v_i^1, i=1,2,\ldots,7, \quad (27)$$

$$\Sigma_{j=1}^{7} D_{i,j}^{12} v_j^3 \geq 2^8 v_i^2, i=1,2,\ldots,7, \quad (28)$$

$$\Sigma_{j=1}^{7} D_{i,j}^{12} v_j^4 \geq 2^8 v_i^3, i=1,2,\ldots,7, \quad (29)$$

$$\Sigma_{j=1}^{7} D_{i,j}^{12} v_j^5 \geq 2^8 v_i^4, i=1,2,\ldots,7, \quad (30)$$

$$\Sigma_{j=1}^{7} D_{i,j}^{12} v_j^6 \geq 2^8 v_i^5, i=1,2,\ldots,7, \quad (31)$$

and $$\Sigma_{j=1}^{7} D_{i,j}^{11} v_j^1 \geq 2^8 v_i^6, i=1,2,\ldots,7. \quad (32)$$

With the renumbered STD-states, and a correspondingly rearranged connection matrix, denoted D, the approximate eigenvector inequalities (for the "new" eigenvectors v) are rewritten as:

$$\Sigma_{j=1}^{7} D_{l,j}^{12} v_j^2 \geq 2^8 v_l^1, l=1,2,\ldots,7, \quad (33)$$

$$\Sigma_{j=1}^{7} D_{l,j}^{12} v_j^3 \geq 2^8 v_l^2, l=1,2,\ldots,7, \quad (34)$$

$$\Sigma_{j=1}^{7} D_{l,j}^{12} v_j^4 \geq 2^8 v_l^3, l=1,2,\ldots,7, \quad (35)$$

$$\Sigma_{j=1}^{7} D_{l,j}^{12} v_j^5 \geq 2^8 v_l^4, l=1,2,\ldots,7, \quad (36)$$

$$\Sigma_{j=1}^{7} D_{l,j}^{12} v_j^6 \geq 2^8 v_l^5, l=1,2,\ldots,7, \quad (37)$$

and $$\Sigma_{j=1}^{7} D_{l,j}^{11} v_j^1 \geq 2^8 v_l^6, l=1,2,\ldots,7. \quad (38)$$

The leading bit patterns and trailing bit patterns of possible code words have been identified in Tables 2 and 3. The number of code words of length n that start with the leading bit pattern i and that end with the trailing bit pattern j is denoted $W_{i,j}[n]$. After close inspection, it turns out that:

$$D_{l,j}^n = \Sigma_{i=1}^{8-l} W_{i,j}[n]. \quad (39)$$

With this knowledge, the approximate eigenvector inequalities can be rewritten into the form:

$$\Sigma_{i=1}^{l} \Sigma_{j=1}^{7} W_{i,j}[12] v_j^2 \geq 2^8 v_{8-l}^1, l=1,2,\ldots,7, \quad (40)$$

$$\Sigma_{i=1}^{l} \Sigma_{j=1}^{7} W_{i,j}[12] v_j^3 \geq 2^8 v_{8-l}^2, l=1,2,\ldots,7, \quad (41)$$

$$\Sigma_{i=1}^{l} \Sigma_{j=1}^{7} W_{i,j}[12] v_j^4 \geq 2^8 v_{8-l}^3, l=1,2,\ldots,7, \quad (42)$$

$$\Sigma_{i=1}^{l} \Sigma_{j=1}^{7} W_{i,j}[12] v_j^5 \geq 2^8 v_{8-l}^4, l=1,2,\ldots,7, \quad (43)$$

$$\sum_{i=1}^{7}\sum_{j=1}^{7}W_{i,j}[12]v_j^6 \geq 2^8 v_{8-l}^5, l=1,2,\ldots,7, \quad (44)$$

and $$\sum_{i=1}^{7}\sum_{j=1}^{7}W_{i,j}[11]v_j^1 \geq 2^8 v_{8-l}^6, l=1,2,\ldots,7. \quad (45)$$

The number of coding states per coding class is denoted by the vector $p^s$ for the s-th sub-code (s=1,2,3,4,5,6). Its relation to the approximate eigenvector $v^s$ is given by (for the i-th component, with $1 \leq i \leq 7$):

$$p_i^s = v_{8-i}^s. \quad (46)$$

Note that with this advantageous construction, the coding classes have a numbering system that is exactly complementary to the numbering system of the renumbered STD-states; this could already have been obvious from Table 1, where the renumbering of STD-states was mentioned, but not explained. Further, again due to the specific construction of the different coding classes, the following inequality holds (for each of the sub-codes s with s=1,2,3,4,5,6):

$$p_1^s \leq p_2^s \leq p_3^s \ldots \leq p_7^s. \quad (47)$$

An example Code-Design: a code with a k-constrain of k=∞

First, the case without k-constraint (k=∞) is considered. The number of code words with specific leading bit pattern (i) and trailing bit pattern (j), denoted $W_{i,j}[n]$, for length n=12 and n=11 are given by:

$$W[12] = \begin{pmatrix} 53 & 21 & 8 & 3 & 33 & 13 & 5 \\ 21 & 8 & 3 & 1 & 13 & 5 & 2 \\ 8 & 3 & 1 & 1 & 5 & 2 & 1 \\ 3 & 1 & 1 & 0 & 2 & 1 & 0 \\ 33 & 13 & 5 & 2 & 21 & 8 & 3 \\ 13 & 5 & 2 & 1 & 8 & 3 & 1 \\ 5 & 2 & 1 & 0 & 3 & 1 & 1 \end{pmatrix} \quad (48)$$

and $$W[11] = \begin{pmatrix} 33 & 13 & 5 & 2 & 21 & 8 & 3 \\ 13 & 5 & 2 & 1 & 8 & 3 & 1 \\ 5 & 2 & 1 & 0 & 3 & 1 & 1 \\ 2 & 1 & 0 & 0 & 1 & 1 & 0 \\ 21 & 8 & 3 & 1 & 13 & 5 & 2 \\ 8 & 3 & 1 & 1 & 5 & 2 & 1 \\ 3 & 1 & 1 & 0 & 2 & 1 & 0 \end{pmatrix}. \quad (49)$$

An example Code-Design: a code with a k-constraint In order to generate a k-constraint without making use of an adapted STD with the k-constraint explicitly included, it is advantageous to limit the number of leading and trailing zeroes in the code words. The maximum number of leading zeroes in a code word is denoted $l_0$; the maximum number of trailing zeroes is denoted $r_0$. The number of code words with specific leading bit pattern i and trailing bit pattern j, with the additional constraint on $l_0$ and $r_0$, is denoted $W_{i,j}^{l_0,r_0}[n]$, for length n of the code word. It should be noted that the previously defined matrices can be identified as:

$$W_{i,j}[n] \equiv W_{i,j}^{\infty,\infty}. \quad (50)$$

The additional constraint k=22 is realized with the choice $l_0=r_0=11$ for the sub-codes with mapping of 8-to-12, and with the choice $l_0=r_0=10$ for the single sub-code with mapping of 8-to-11. The matrices $W^{11,11}[12]$ and $W^{10,10}[11]$ are given by:

$$W^{11,11}[12] = \begin{pmatrix} 52 & 21 & 8 & 3 & 33 & 13 & 5 \\ 21 & 8 & 3 & 1 & 13 & 5 & 2 \\ 8 & 3 & 1 & 1 & 5 & 2 & 1 \\ 3 & 1 & 1 & 0 & 2 & 1 & 0 \\ 33 & 13 & 5 & 2 & 21 & 8 & 3 \\ 13 & 5 & 2 & 1 & 8 & 3 & 1 \\ 5 & 2 & 1 & 0 & 3 & 1 & 1 \end{pmatrix} \quad (51)$$

and $$W^{10,10}[11] = \begin{pmatrix} 32 & 13 & 5 & 2 & 21 & 8 & 3 \\ 13 & 5 & 2 & 1 & 8 & 3 & 1 \\ 5 & 2 & 1 & 0 & 3 & 1 & 1 \\ 2 & 1 & 0 & 0 & 1 & 1 & 0 \\ 21 & 8 & 3 & 1 & 13 & 5 & 2 \\ 8 & 3 & 1 & 1 & 5 & 2 & 1 \\ 3 & 1 & 1 & 0 & 2 & 1 & 0 \end{pmatrix}. \quad (52)$$

Note that with this choice of the number of leading and trailing zeroes in a code word (of length n=12 or n=11), only the all-zero code word is omitted (which implies that the matrix element at position (1,1) is decreased by unity as compared to the previous set of both matrices). A practical set of approximate eigenvectors of the rewritten approximate eigenvector inequalities is given by:

$$v^1 = \{28,27,24,17,17,15,11\}, \quad (53)$$

$$v^2 = \{26,25,22,16,15,14,10\}, \quad (54)$$

$$v^3 = \{24,23,20,14,14,13,9\}, \quad (55)$$

$$v^4 = \{22,21,19,13,13,11,8\}, \quad (56)$$

$$v^5 = \{20,19,17,12,12,11,8\}, \quad (57)$$

$$v^6 = \{19,18,16,12,11,10,7\}. \quad (58)$$

The first sub-code, denoted $C_1$, with 8-to-12 mapping, has a total of 28 coding states; the second sub-code, denoted $C_2$, also with 8-to-12 mapping, has a total of 26 coding states; the third sub-code, denoted $C_3$, also with 8-to-12 mapping, has a total of 24 coding states; the fourth sub-code, denoted $C_4$, also with 8-to-12 mapping, has a total of 22 coding states; the fifth sub-code, denoted $C_5$, also with 8-to-12 mapping, has a total of 20 coding states; and the sixth sub-code, denoted $C_6$, with 8-to-11 mapping, has a total of 19 coding states. The distribution of the total number of coding states (for each sub-code) over the 7 different coding classes is governed by the approximate eigenvector (for the given sub-code), as indicated by Eq. (46).

Construction of Code Tables for a Code with k=22

The code-tables are further constructed in such a way that a code word (with all its possible next-states) can appear only in one particular coding state. For the decoding operation, this means that the next code word uniquely specifies the "next-state" function of a current code word.

Encoding

For encoding of a 8-bit user word, one needs to know:

(1) the sub-code $C_i$ with which the current user word has to be encoded; and:

(2) the state j of the sub-code $C_i$, denoted $C_i$-$S_j$ and the corresponding code table that is to be used for the encoding.

In the process of encoding, the encoder generates as output:

(1) the code word according to the code table that is to be used; and:

(2) the next sub-code that is to be used for the encoding of the next 8-bit user word, which is simply $C_{i+1}$ (which, for i=6, equals $C_1$ due to the cyclic repetition of the six sub-codes); and:

(3) the next state of the next sub-code $C_{i+1}$ according to the code table that is to be used upon encoding for the current user word, where this next state will specify which code table is to be used for the encoding of the next 8-bit user word with the next sub-code $C_{i+1}$.

Decoding

The process of decoding is described on the basis of FIG. 3. The decoding is state-independent, that is, it is not required to know the state in which the encoder encoded the 8-bit user word (that is now considered to be decoded). State-independent decoding is achieved by the fact that every code word and next-state combination that may occur, occurs only once in one single code table (among all the coding tables). Further, for the decoding of a code word into a user word, it is also required to know the next-state of the current code word. The latter next-state can be derived from the next code word that immediately follows the current code word. The fact that this is possible is obtained by the construction of the coding states, whereby each code word (independent of its next state) can only occur in a single code table among all the coding tables; so, the next code word unambiguously determines the next state of the current code word. It should be noted that the next state of a given code word (that was encoded with a sub-code $C_p$) is one out of the possible states of the next sub-code, that is, $C_{p+1}$.

The process of decoding is further explained as follows. At the input of the decoder, there are two code words, code word $W_i$ encoded with sub-code $C_p$, and code word $W_{i+1}$, encoded with the next sub-code $C_{p+1}$. For both code words, and independent on the sub-code that applies to each of the code words $W_i$ and $W_{i+1}$, an index can be derived (e.g. based on enumerative decoding for a d=1 RLL constraint: the index ranges from 0 to 376 for a code word of 12 channel bits, and from 0 to 232 for a code word of 11 channel bits). The respective indices are denoted $I_i$ and $I_{i+1}$ for the current and next code words. Next, the index $I_{i+1}$ is converted into a "next-state" of the current code word $W_i$ by means of a special conversion table (with is dependent on the sub-code that applies to the considered word $W_{i+1}$): this table maps each (index of a) code word onto the state to which it belongs for the considered sub-code (which is here $C_{p+1}$). This "next-state" is denoted $NS_i$. The combination of the index of the current code word $W_i$, that is $I_i$, in combination with its decoded next-state $NS_i$ are the input of a special decoding table for the given sub-code $C_p$, which yields the decoded (8-bit) user word.

DC-control Through the use of Guided Scrambling

Just like with the 9-bit oriented code discussed previously guided scrambling can be used for DC-control.

Distribution of 8-bit ECC Symbols

Figure 6:
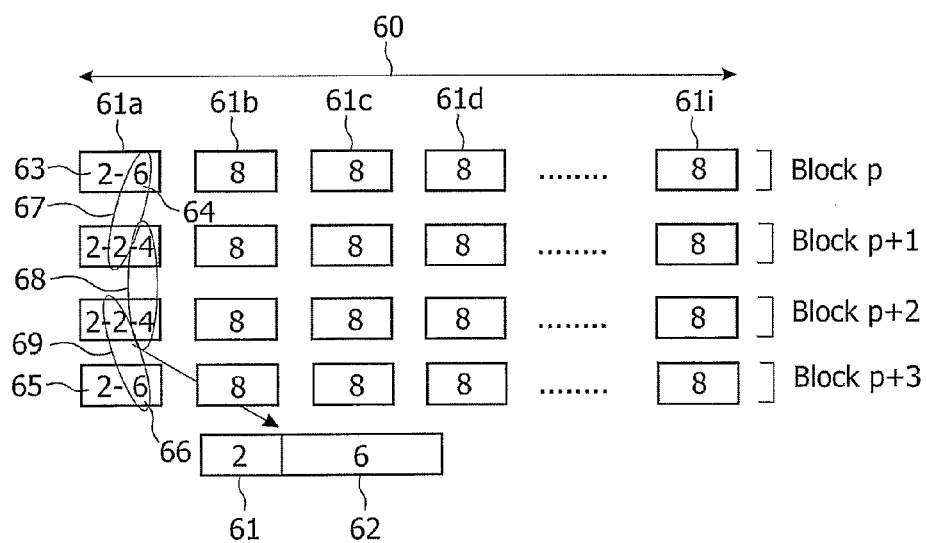
FIG. 6 shows a format for DC control using guided scrambling for 8 it input words.

FIG. 6 shows a typical example of a format including s scrambling bits in a scrambling block. A scrambling block comprises $N_{scr}$ 8-bit input symbols (of the new RLL code and its six sub-codes). A possible format for the new RLL code with a similar overhead for DC-control as is used in the Blu-ray Disc (BD) format with the 17PP code has $N_{scr}$=11 and s=2, which means that there are 4 possible scrambled channel bit streams for each scrambling block. For obvious reasons, it is advantageous for the new RLL code to use an algebraic error-correction code (ECC) based on Reed-Solomon codes with 8-bit ECC-symbols (bytes). The insertion of the s=2 scrambling bits at the beginning of a scrambling block, disturbs the regular order of the 8-bit symbols as they are used at the input of the encoder of the new RLL code. In order to limit error propagation, a measure as disclosed in U.S. Pat. No. 6,265,994 is adopted, as can be seen from FIG. 6: four successive scrambling blocks 60 are drawn. All 61b, 61c, 61d, 61i but the first 8-bit input words 61a of each scrambling block 60 correspond one-to-one with a 8-bit ECC-symbol. The first input word 61a of the first scrambling block 60 comprises s=2 scrambling bits 63, and 6 bits 64 out of a first special ECC-symbol (of 8-bits). Similarly, the first input word of the fourth scrambling block comprises s=2 scrambling bits 65, and 6 bits 66 out of a second special ECC-symbol. The two other scrambling blocks have the following bits in the first input word: first, a set of s=2 scrambling bits, then one of the two sets that each comprise the remaining 2 information bits of the first two special ECC-symbols, and finally half of the information bits (thus 4) of a third special ECC-symbol. The 8 bits of each of these three special ECC-symbols are indicated with the three ellipses 67, 68, 69 in FIG. 6.

SECTION 3

A code with a more compact mapping of 4-to-6 d=1 & r=2 RLL Codes suitable for Soft-Decision RLL Decoding

The r=2 RLL constraint is advantageous for the performance of the channel detector (which can be a PRML bit-detector for hard-decision bit-detection, and a BCJR channel detector for soft-decision bit-detection). For instance, for hard-decision bit-detection, the r=2 constraint yields a capacity gain of about 5% over the situation with r≧6. It is therefore the aim of the current ID to generate a d=1 RLL code with the following properties:

it has an RMTR-constraint r=2;

it has a limited number of coding states;

it must not have an extremely high efficiency, since opting for the latter may lead to a too large complexity of the code, which makes it unsuitable for soft-decision SISO-RLL decoding; so, a code rate R=⅔ may still be satisfactory;

it has a concise mapping, e.g. 4-to-6, limiting the fan-out of branches from each of the coding states of the code to $2^4$=16;

in addition, it must preferably have a k-constraint as well.

All of the above properties have been realized with the code-construction that will be are going to describe from here onwards.

A Code with compact 4-to-6 mapping.

It is the purpose of the current code-design to have a channel code with a compact mapping of user bits onto channel bits, so that the hardware complexity of, for example, the soft-decision SISO-RLL decoder (in terms of the total number of branches) can be kept low. The new code has a mapping of 4-to-6 of user bits onto channel bits (thus a code rate R=⅔). As has been discussed above, the Shannon capacity of the combined RLL constraints d=1 and r=2 amounts to C(d=1, k=∞,r=2)=0.679286. A code with mapping of user bits onto channel bits of 4-to-6 may be possible to construct, since it has a rate R=0.6667≦C(d=1,k=∞,r=2).

Construction of a sliding-block code is based on the ACH-algorithm as disclosed by R. L. Adler, D. Coppersmith, and M. Hassner, in "Algorithms for Sliding Block Codes. An Application of Symbolic Dynamics to Information Theory", IEEE Transaction on Information Theory, Vol. IT-29, 1983, pp. 5-22. This algorithm looks for a set of approximate eigenvectors, with $v_i$ denoting the i-th coefficient of the approximate eigenvector that satisfies the set of inequalities for all states i of the corresponding state-transition diagram (STD) that describes the RLL constraints (for a code with m-to-n mapping):

$$\sum_j D_{i,j}^n v_j \geq 2^m v_i. \tag{59}$$

In the above equation, D represent the so-called adjacency-matrix or connection-matrix for the STD: its matrix elements are equal to one if the corresponding two STD-states are connected in the graph, and are equal to zero if they are not connected. For the new code with RLL constraints d=1 and r=2, the code has the parameters m=4 and n=6. This implies that the following inequalities have to be satisfied for the envisaged new code:

$$\sum_{j=1}^{7} D_{i,j}^{6} v_j \geq 2^4 v_i, i=1,2,\ldots 7. \tag{60}$$

With the renumbered STD-states, and a correspondingly rearranged connection matrix, denoted D, the approximate eigenvector inequalities (for the "new" eigenvectors v) are rewritten as:

$$\sum_{j=1}^{7} D_{l,j}^{6} v_j \geq 2^4 v_l, l=1,2,\ldots,7. \tag{61}$$

The leading bit patterns and trailing bit patterns of possible code words have been identified in Tables 2 and 3. The number of code words of length n that start with the leading bit pattern i and that end with the trailing bit pattern j is denoted $W_{i,j}[n]$. After close inspection, it turns out that:

$$D_{l,j}^n = \sum_{i=1}^{8-l} W_{i,j}[n]. \tag{62}$$

With this knowledge, the approximate eigenvector inequalities can be rewritten into the form:

$$\sum_{i=1}^{l} \sum_{j=1}^{7} W_{i,j}[6] v_j \geq 2^4 v_{8-l}, l=1,2,\ldots,7. \tag{63}$$

The number of coding states per coding class is denoted by the vector p. Its relation to the approximate eigenvector v is given by (for the i-th component, with $1 \leq i \leq 7$):

$$p_i = v_{8-i}. \tag{64}$$

Note that with this advantageous construction, the coding classes have a numbering system that is exactly complementary to the numbering system of the renumbered STD-states; this could already have been obvious from Table 1, where the renumbering of STD-states was mentioned, but not explained. Further, again due to the specific construction of the different coding classes, the following inequality holds:

$$p_1 \leq p_2 \leq p_3 \ldots \leq p_7. \tag{65}$$

Additional Measures for One-Symbol Look-Ahead Sliding-Block Decoder

Figure 7:
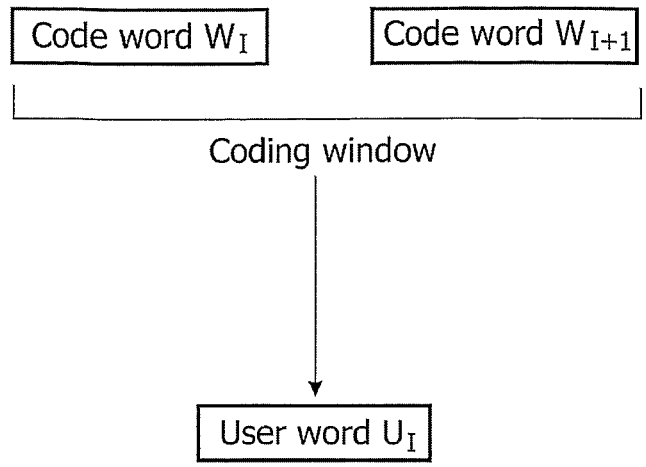
FIG. 7 shows one-symbol look-ahead sliding-block decoding.

In order to limit error propagation, the new code is constructed such that the decoder needs to look ahead one channel word of 6 channel bits, that is, for the decoding of a given user word, one needs the corresponding 6-bit channel word $W_i$ together with the next 6-bit channel word $W_{i+1}$ as shown in see FIG. 7. This is realized by a code construction where each 6-bit channel word occurs only in one single particular coding state (whereby all coding states together constitute the code); of course, the considered 6-bit channel word can occur multiple times within that single coding state, taking into account the fact that the channel word can have (and usually does) more than one possible "next-state". In total, there are $v_1$ coding states. Let us denote by $n_{i,j}^p$ the number of code words with leading bit-pattern i and trailing bit-pattern j that is used in the p-th coding state. Then, this results in, since none of the code words can be used in more than one coding state (for simplicity, the dependency of $W_{i,j}$ on the number of channel bits, n, in a code word is omitted):

$$\sum_{p=1}^{v_1} n_{i,j}^p \leq W_{i,j}. \tag{66}$$

Per coding class, a number of coding states is associated. The adapted approximate eigenvector inequality has to be rewritten as:

$$\sum_{i=1}^{l} \sum_{j=1}^{7} n_{i,j}^p v_j \geq 2^4, \tag{67}$$

$p=1+v_{8-l+1},\ldots,v_{8-l}$, and $l=1,2,\ldots,7$.

In the latter equation, it is assumed that $v_8=0$; further, the inequality applies only in the case that the left-limit of the running index p is not larger than its right-limit (otherwise, for a given l where the left-limit of p is larger than the right-limit of p, no extra coding states need to be considered).

An example Code-Design: a code with a k-constraint of k=∞

First, the case without k-constraint (k=∞) is considered. The number of code words with specific leading bit pattern (i) and trailing bit pattern (j), denoted $W_{i,j}[n]$, for length n=6 is given by:

$$W[6] = \begin{pmatrix} 3 & 1 & 1 & 0 & 2 & 1 & 0 \\ 1 & 1 & 0 & 0 & 1 & 0 & 0 \\ 1 & 0 & 0 & 0 & 0 & 0 & 0 \\ 0 & 0 & 0 & 0 & 0 & 0 & 1 \\ 2 & 1 & 0 & 0 & 1 & 1 & 0 \\ 1 & 0 & 0 & 0 & 1 & 0 & 0 \\ 0 & 0 & 0 & 1 & 0 & 0 & 0 \end{pmatrix}. \tag{68}$$

The total number of code words with length n=6 equals 21 (as it should be since the number of d=1 sequences of length 6 equals $N_{d=1}(6)=21$). They are listed in Table 4, together with the index i, j (referring to leading and trailing bit-patterns), and together with the word multiplicity as prescribed by the approximate eigenvector that satisfied Eq. (63). The code words are listed in a lexicographic ordering according to the following indexing (starting from index 1 up to 21; with I the index of a 6-bit code word with bits $b_j$):

$$I = 1 + \sum_{j=1}^{6} b_j N_{d=1}(6-j). \tag{69}$$

TABLE 4

6-bit Code Words

| nr | Code Word | Index i, j | arrival state | multiplicity AE |
|---|---|---|---|---|
| 1 | 000000 | 1, 1 | $\hat{\sigma}_1$ | 8 |
| 2 | 000001 | 1, 5 | $\hat{\sigma}_5$ | 5 |
| 3 | 000010 | 1, 2 | $\hat{\sigma}_2$ | 8 |
| 4 | 000100 | 1, 1 | $\hat{\sigma}_1$ | 8 |
| 5 | 000101 | 1, 6 | $\hat{\sigma}_6$ | 4 |
| 6 | 001000 | 1, 1 | $\hat{\sigma}_1$ | 8 |
| 7 | 001001 | 1, 5 | $\hat{\sigma}_5$ | 5 |
| 8 | 001010 | 1, 3 | $\hat{\sigma}_3$ | 7 |
| 9 | 010000 | 2, 1 | $\hat{\sigma}_1$ | 8 |
| 10 | 010001 | 2, 5 | $\hat{\sigma}_5$ | 5 |

TABLE 4-continued 6-bit Code Words

| nr | Code Word | Index i, j | arrival state | multiplicity AE |
|---|---|---|---|---|
| 11 | 010010 | 2, 2 | $\overset{\circ}{\sigma}_2$ | 8 |
| 12 | 010100 | 3, 1 | $\overset{\circ}{\sigma}_1$ | 8 |
| 13 | 010101 | 4, 7 | $\overset{\circ}{\sigma}_7$ | 3 |
| 14 | 100000 | 5, 1 | $\overset{\circ}{\sigma}_1$ | 8 |
| 15 | 100001 | 5, 5 | $\overset{\circ}{\sigma}_5$ | 5 |
| 16 | 100010 | 5, 2 | $\overset{\circ}{\sigma}_2$ | 8 |
| 17 | 100100 | 5, 1 | $\overset{\circ}{\sigma}_1$ | 8 |
| 18 | 100101 | 5, 6 | $\overset{\circ}{\sigma}_6$ | 4 |
| 19 | 101000 | 6, 1 | $\overset{\circ}{\sigma}_1$ | 8 |
| 20 | 101001 | 6, 5 | $\overset{\circ}{\sigma}_5$ | 5 |
| 21 | 101010 | 7, 4 | $\overset{\circ}{\sigma}_4$ | 5 |

Approximate Eigenvector AE

A approximate eigenvector (denoted AE) satisfying Eq. (63) is given by:

$$v = \{8,8,7,5,5,4,3\}. \tag{70}$$

It leads to a code with word allocations that satisfy Eq. (67). This is explained in the remainder of this paragraph. The 8 different coding states are generated step-by-step, according to successive values of the parameter l in Eq. (67).

TABLE 5

Code-Construction according to Eq. (67)

| nr | Code Word | i, j | AE | l = 1 3 St. | l = 2 1 St. | l = 3 1 St. | l = 4 — | l = 5 2 St. | l = 6 1 St. | — | l = 7 |
|---|---|---|---|---|---|---|---|---|---|---|---|
| 1 | 000000 | 1, 1 | 8 | S1 | | | | | | | |
| 2 | 000001 | 1, 5 | 5 | S3 | | | | | | | |
| 3 | 000010 | 1, 2 | 8 | S1 | | | | | | | |
| 4 | 000100 | 1, 1 | 8 | S2 | | | | | | | |
| 5 | 000101 | 1, 6 | 4 | 4 | | 4 | S5 | | | | |
| 6 | 001000 | 1, 1 | 8 | S2 | | | | | | | |
| 7 | 001001 | 1, 5 | 5 | S3 | | | | | | | |
| 8 | 001010 | 1, 3 | 7 | S3 | | | | | | | |
| 9 | 010000 | 2, 1 | 8 | | 8 | S4 | | | | | |
| 10 | 010001 | 2, 5 | 5 | | 5 | | 5 | S5 | | | |
| 11 | 010010 | 2, 2 | 8 | | 8 | S4 | | | | | |
| 12 | 010100 | 3, 1 | 8 | | 8 | | 8 | S5 | | | |
| 13 | 010101 | 4, 7 | 3 | | 3 | | 3 | 3 | 3 | S7 | |
| 14 | 100000 | 5, 1 | 8 | | 8 | | 8 | 8 | 8 | S6 | |
| 15 | 100001 | 5, 5 | 5 | | 5 | | 5 | 5 | 5 | S7 | |
| 16 | 100010 | 5, 2 | 8 | | 8 | | 8 | 8 | 8 | S6 | |
| 17 | 100100 | 5, 1 | 8 | | 8 | | 8 | 8 | 8 | S7 | |
| 18 | 100101 | 5, 6 | 4 | | 4 | | 4 | 4 | 4 | 4 | S8 |
| 19 | 101000 | 6, 1 | 8 | | 8 | | 8 | 8 | 8 | 8 | S8 |
| 20 | 101001 | 6, 5 | 5 | | 5 | | 5 | 5 | 5 | 5 | S8 |
| 21 | 101010 | 7, 4 | 5 | | 5 | | 5 | 5 | 5 | 5 | 5 | 5 |

STAGE-(a) l=1, 3 coding states p=1,2,3

All code words with i=1 can be used. Two coding states are realized through the combination 8+8(=16) (two times), the 3rd coding state is realized through the combination 5+5+7=17, so that effectively one entry is lost for further use (in next coding states, at higher values of l). One code word (with multiplicity 4) is not used, but will be of use later on in the code construction.

STAGE-(b) l=2, 1 coding state p=4

All code words with a leading bit-pattern index not larger than i=2 can be used. The 4th coding state S4 can be realized through the combination 8+8(=16). In addition to the one code word that was left over at stage (a), again one code word (with multiplicity 5) is not used in this stage, and will be used later on.

STAGE-(c) l=3, 1 coding state p=5

All code words with a leading bit-pattern index not larger than i=3 can be used. The 5th coding state S5 can be realized through the combination 8+5+4(=17). This means that one entry is lost for further use (in next coding states, at higher values of l). In addition all remaining code words from the two previous steps have been used.

STAGE-(d) l=4, no coding states. The code word with index i=4 will be used in the subsequent stage.

STAGE-(e) l=5, 2 coding states p=6,7

All code words with a leading bit-pattern index not larger than i=5 can be used. The two states S6 and S7 can be realized through the combinations 8+8(=16) and 8+5+3(=16). The last code word (nr. 18) will be used in the next stage.

STAGE-(f) l=6, 1 coding state p=8

All code words with a leading bit-pattern index not larger than i=6 can be used. The last coding state S8 is realized through the combination 8+5+4(=17), which implies that one entry is lost.

This completes the construction of all 8 coding states S1, S2, ... up to S8. Note that the last code word (nr. 21, |101010|) is not used at all in this code construction.

The parameters $n_{i,j}^p$ (as used in Eq. (66) and Eq. (67)) are listed for the 8 different coding states (only the non-zero elements are noted) in table 6:

TABLE 6

State S1 (p = 1)
$n_{1,1}^1 = 1,$
$n_{1,2}^1 = 1.$
State S2 (p = 2)
$n_{1,1}^2 = 2.$
State S3 (p = 3)
$n_{1,3}^3 = 1,$
$n_{1,5}^3 = 2.$ TABLE 6-continued State S4 (p = 4)
$n_{2,1}^4 = 1,$
$n_{2,2}^4 = 1.$
State S5 (p = 5)
$n_{1,6}^5 = 1,$
$n_{2,5}^5 = 1,$
$n_{3,1}^5 = 1.$
State S6 (p = 6)
$n_{5,1}^6 = 1,$
$n_{5,2}^6 = 1.$
State S7 (p = 7)
$n_{4,7}^7 = 1,$
$n_{5,1}^7 = 1,$
$n_{5,5}^7 = 1.$
State S8 (p = 8)
$n_{5,6}^8 = 1,$
$n_{6,1}^8 = 1,$
$n_{6,5}^8 = 1.$ All other parameters $n_{i,j}^p$ (that are not listed) are zero. It can be readily verified that for all indices i, j (with the exception of i,j=7,4), one has:

$$\Sigma_{p=1}^8 n_{i,j}^p = W_{i,j}, \quad (71)$$

so that the $\leqq$-condition of Eq. (66) is converted into equality for all the entries involved. The only exception is that, for all coding states p, $n_{7,4}^p=0$, whereas $W_{7,4}=1$. The corresponding word, with index nr. 21 and equal to |101010|, must thus not be used to reach a valid code. One possible allocation of code words to coding states is shown in Table 7.

TABLE 7

Allocation of Code Words to
Coding States for RLL Code with
d = 1, r = 2 and k = ∞.

| State | Code Word | Multiplicity (AE) |
|---|---|---|
| S1 | 000000 | 8 |
|    | 000010 | 8 |
| S2 | 000100 | 8 |
|    | 001000 | 8 |
| S3 | 000001 | 5 |
|    | 001001 | 5 |
|    | 001010 | 7 |
| S4 | 010000 | 8 |
|    | 010010 | 8 |
| S5 | 000101 | 4 |
|    | 010001 | 5 |
|    | 010100 | 8 |
| S6 | 100000 | 8 |
|    | 100010 | 8 |
| S7 | 010101 | 3 |
|    | 100001 | 5 |
|    | 100100 | 8 |
| S8 | 100101 | 4 |
|    | 101000 | 8 |
|    | 101001 | 5 |

An example Code-Design: a code with a k-constraint of k=14

In this section, it is our aim to generate a k-constraint without making use of an adapted STD with the k-constraint explicitly included. Long sequences of zeroes can be generated by many successive repetitions of the all-zero word |000000| (which is used in coding state S1). The all-zero word has also one table entry in coding state S1 with as next state S1: in this way, the all-zero word can be used repetitively, thus prohibiting a finite k-constraint on the maximum number of zeroes in a runlength. The word allocation in coding state S1 according to Table 7 is given in Table 8.

TABLE 8

Allocation of Code Words
in State S1 for RLL Code with k = ∞.

| Entry nr. | Code Word | Next-State |
|---|---|---|
| 0 | 000000 | S1 |
| 1 | 000000 | S2 |
| 2 | 000000 | S3 |
| 3 | 000000 | S4 |
| 4 | 000000 | S5 |
| 5 | 000000 | S6 |
| 6 | 000000 | S7 |
| 7 | 000000 | S8 |
| 8 | 000010 | S1 |
| 9 | 000010 | S2 |
| 10 | 000010 | S3 |
| 11 | 000010 | S4 |
| 12 | 000010 | S5 |
| 13 | 000010 | S6 |
| 14 | 000010 | S7 |
| 15 | 000010 | S8 |

A finite k-constraint can be realized through the following steps:

Step-1. Duplicating coding state S1 into an extra coding state S9, where the first 5 entries (which use the all-zero code word) are replaced by the code word that has not been used until now in the code construction (that is, code word nr. 21), while their next-state is maintained unaltered.

Step-2. In all coding states, code words that end with at least two zeroes . . . 00| and that have S1 as next state, are deviated to S9 as next state.

Table 9 yields two coding states, S1 and the new one S9, after implementation of Steps 1 and 2. The aspects that are crucial have been underlined. The complete table with all 9 coding states (and for each state, its 16 entries) can be found below in table 10.

TABLE 9

Allocation of Code Words in States S1 and S9
for RLL Code with k = 14.

| State S1 | | | State S9 | | |
|---|---|---|---|---|---|
| Entry nr. | Code Word | Next-State | Entry nr. | Code Word | Next-State |
| 0 | 000000 | <u>S9</u> | 0 | <u>101010</u> | S1 |
| 1 | 000000 | S2 | 1 | <u>101010</u> | S2 |
| 2 | 000000 | S3 | 2 | <u>101010</u> | S3 |
| 3 | 000000 | S4 | 3 | <u>101010</u> | S4 |
| 4 | 000000 | S5 | 4 | <u>101010</u> | S5 |
| 5 | 000000 | S6 | 5 | 000000 | S6 |
| 6 | 000000 | S7 | 6 | 000000 | S7 |
| 7 | 000000 | S8 | 7 | 000000 | S8 |
| 8 | 000010 | S1 | 8 | 000010 | S1 |
| 9 | 000010 | S2 | 9 | 000010 | S2 |
| 10 | 000010 | S3 | 10 | 000010 | S3 |
| 11 | 000010 | S4 | 11 | 000010 | S4 |
| 12 | 000010 | S5 | 12 | 000010 | S5 |
| 13 | 000010 | S6 | 13 | 000010 | S6 |
| 14 | 000010 | S7 | 14 | 000010 | S7 |
| 15 | 000010 | S8 | 15 | 000010 | S8 |

The maximum number of consecutive zeroes equal to (14) is realized as follows:

$-010|_{entry-0}{}^{S1}000000|_{entry-6}{}^{S9}000000|{}^{S7}010101|0-.$

TABLE 10

Code table for 9 state FSM with d = 1 r = 2 k = 14 4-to-6 RLL code

| State-S1 | State-S2 | State-S3 | State-S4 |
|---|---|---|---|
| 0 000000 9 | 0 000010 1 | 0 001010 1 | 0 010010 1 |
| 1 000000 2 | 1 000010 2 | 1 001010 2 | 1 010010 2 |
| 2 000000 3 | 2 000010 3 | 2 001010 3 | 2 010010 3 |
| 3 000000 4 | 3 000010 4 | 3 001010 4 | 3 010010 4 |
| 4 000000 5 | 4 000010 5 | 4 001010 5 | 4 010010 5 |
| 5 000000 6 | 5 000010 6 | 5 001010 6 | 5 010010 6 |
| 6 000000 7 | 6 000010 7 | 6 001010 7 | 6 010010 7 |
| 7 000000 8 | 7 000010 8 | 7 001001 1 | 7 010010 8 |
| 8 001000 9 | 8 000100 9 | 8 000101 1 | 8 010000 9 |
| 9 001000 2 | 9 000100 2 | 9 000101 2 | 9 010000 2 |
| 10 001000 3 | 10 000100 3 | 10 000101 3 | 10 010000 3 |
| 11 001000 4 | 11 000100 4 | 11 000101 4 | 11 010000 4 |
| 12 001000 5 | 12 000100 5 | 12 000101 5 | 12 010000 5 |
| 13 001000 6 | 13 000100 6 | 13 000101 2 | 13 010000 6 |
| 14 001000 7 | 14 000100 7 | 14 000101 3 | 14 010000 7 |
| 15 001000 8 | 15 000100 8 | 15 000101 4 | 15 010000 8 |

| State-S5 | State-S6 | State-S7 | State-S8 |
|---|---|---|---|
| 0 010100 9 | 0 100100 9 | 0 100010 1 | 0 101000 9 |
| 1 010100 2 | 1 100100 2 | 1 100010 2 | 1 101000 2 |
| 2 010100 3 | 2 100100 3 | 2 100010 3 | 2 101000 3 |
| 3 010100 4 | 3 100100 4 | 3 100010 4 | 3 101000 4 |
| 4 010100 5 | 4 100100 5 | 4 100010 5 | 4 101000 5 |
| 5 010100 6 | 5 100100 6 | 5 100010 6 | 5 101000 6 |
| 6 010100 7 | 6 100100 7 | 6 100010 7 | 6 101000 7 |
| 7 010100 8 | 7 100100 8 | 7 100010 8 | 7 101000 8 |
| 8 010001 1 | 8 100000 9 | 8 100001 1 | 8 101001 1 |
| 9 010001 2 | 9 100000 2 | 9 100001 2 | 9 101001 2 |
| 10 010001 3 | 10 100000 3 | 10 100001 3 | 10 101001 3 |
| 11 010001 4 | 11 100000 4 | 11 100001 4 | 11 101001 4 |
| 12 010001 5 | 12 100000 5 | 12 100001 5 | 12 101001 5 |
| 13 000001 1 | 13 100000 6 | 13 100101 1 | 13 010101 1 |
| 14 000001 2 | 14 100000 7 | 14 100101 2 | 14 010101 2 |
| 15 000001 3 | 15 100000 8 | 15 100101 3 | 15 010101 3 |

| State-S9 |
|---|
| 0 101010 1 |
| 1 101010 2 |
| 2 101010 3 |
| 3 101010 4 |
| 4 101010 5 |
| 5 000000 6 |
| 6 000000 7 |
| 7 000000 8 |
| 8 001000 9 |
| 9 001000 2 |
| 10 001000 3 |
| 11 001000 4 |
| 12 001000 5 |
| 13 001000 6 |
| 14 001000 7 |
| 15 001000 8 |

A Practical Method for Decoding

Figure 8:
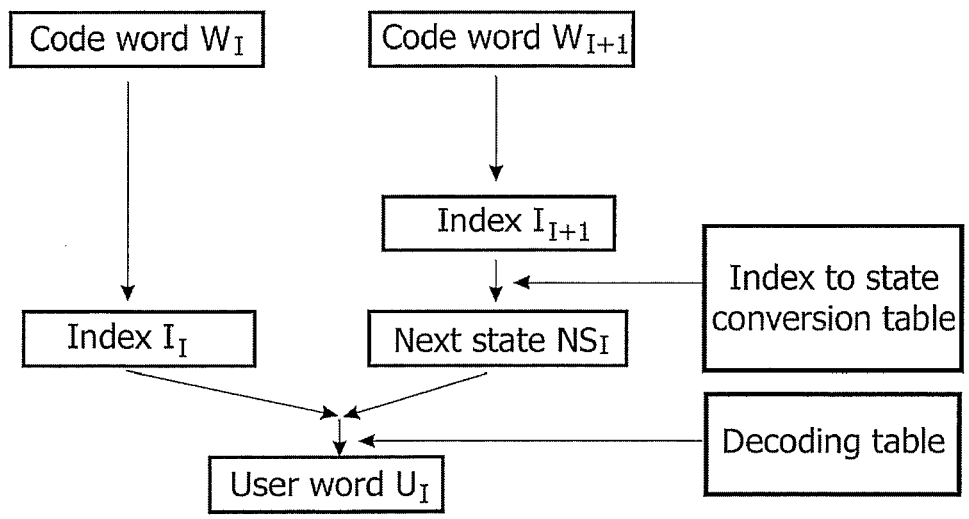
FIG. 8 shows the successive steps for decoding.

The process of decoding is described on the basis of FIG. 8. The decoding is state-independent, that is, it is not required to know the state in which the encoder encoded the 4-bit user word (that is now considered to be decoded). State-independent decoding is achieved by the fact that every code word and next-state combination that may occur, occurs only once in one single code table (among all the coding tables). Further, for the decoding of a code word $W_i$, $W_{i+1}$ into a user word, it is also required to know the next-state of the current code word $W_i$. The latter next-state can be derived from the next code word $W_{i+1}$ that immediately follows the current code word $W_i$. The fact that this is possible is obtained by the construction of the coding states, whereby each code word $W_i$, $W_{i+1}$ (independent of its next state) can only occur in a single code table among all the coding tables; so, the next code word unambiguously determines the next state of the current code word.

The process of decoding is further explained as follows. At the input of the decoder, there are two code words, code word $W_i$ and code word $W_{i+1}$. For both code words, an index can be derived (e.g. based on enumerative decoding for a d=1 RLL constraint: the index ranges from 0 to 20 for a code word of 6 channel bits). The respective indices are denoted $I_i$ and $I_{i+1}$ for the current and next code words. Next, the index $I_{i+1}$ is converted into a "next-state" of the current code word $W_i$ by means of a special conversion table: this table maps each (index of a) code word onto the state to which it belongs. This "next-state" is denoted $NS_i$. The combination of the index of the current code word $W_i$, that is $I_i$, in combination with its decoded next-state $NS_i$ are the input of a special decoding table, which yields the decoded (4-bit) user word.

DC-control Through the use of Guided Scrambling

Just like with the 9-bit oriented code and byte oriented code discussed previously guided scrambling can be used for DC-control.

Distribution of 8-bit ECC Symbols

FIG. 6 shows a typical example of a format including s scrambling bits in a scrambling block. A scrambling block comprises $2N_{scr}$ 4-bit input symbols (of the new RLL code). A possible format for the new RLL code with a similar overhead for DC-control as is used in the Blu-ray Disc (BD) format with the 17PP code has $N_{scr}$=22 and s=2, which means that there are 4 possible scrambled channel bit streams for each scrambling block. For obvious reasons, it is advantageous for the new RLL code to use an algebraic error-correction code (ECC) based on Reed-Solomon codes with 8-bit ECC-symbols (bytes). The insertion of the s=2 scrambling bits at the beginning of a scrambling block, disturbs the regular order of the 4-bit symbols as they are used at the input of the encoder of the new RLL code. In order to limit error propagation, a measure as disclosed in U.S. Pat. No. 6,265, 994 is adopted, as can be seen from FIG. 6: four successive scrambling blocks are drawn. The argumentation is given here in terms of the 8-bit ECC symbols, that each comprise two 4-bit input words (at the input of the new RLL code). All but the first two 4-bit input words of each scrambling block correspond one-to-one with a 8-bit ECC-symbol. The first two input words of the first scrambling block comprises s=2 scrambling bits, and 6 bits out of a first special ECC-symbol (of 8-bits). Similarly, the first two input words of the fourth scrambling block comprises s=2 scrambling bits, and 6 bits out of a second special ECC-symbol. The two other scrambling blocks have the following bits in the first two input words: first, a set of s=2 scrambling bits, then one of the two sets that each comprise the remaining 2 information bits of the first two special ECC-symbols, and finally half of the information bits (thus 4) of a third special ECC-symbol. The 8 bits of each of these three special ECC-symbols are indicated with the three ellipses in FIG. 6.

Complexity Considerations for SISO-RLL Decoding

Figure 9:
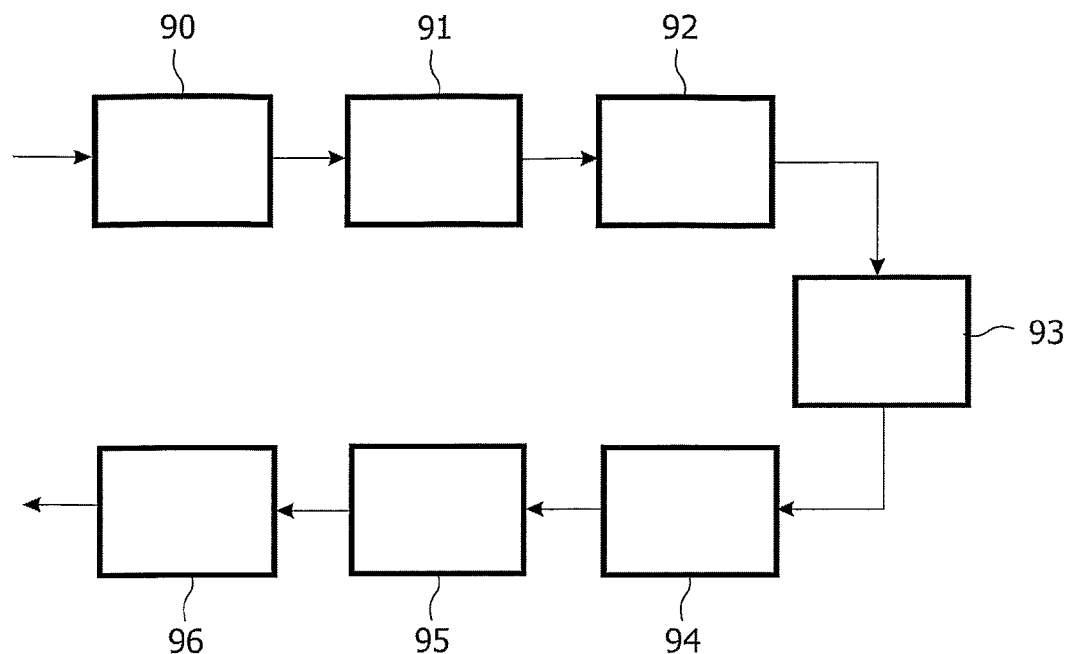
FIG. 9 shows a recording and playback system using Soft-Decision bit detection and Soft-Input-Soft-Output RLL decoder.

The combination of soft-decision (SISO) bit-detection with runlength limited (RLL) coding is disclosed by E. Yamada, T. Iwaki and T. Yamaguchi, in "Rurbo Decoding with Run Length Limited Code for Optical Storage", Japanese Journal of Applied Physics, Part-1, Vol. 41, pp. 1753-1756, 2002. For the sake of clarity, only the two-stage approach with separate SISO-channel detector and SISO-RLL decoder is considered as shown in FIG. 9. FIG. 9 shows an LDPC encoder 90 that accepts source bits and encodes these source bits into user bits. The user bits are then provided by the LDPC encoder 90 to the RLL encoder 91 that converts the user bits intor NRZ channel bits. These NRZ channel bits are then provided to NRZI encoder 92 to obtain NRZI channel bits that can be transmitted via a channel or stored on a record carrier 93.

After retrieval from the channel or record carrier 93 the SISO-channel detector processes the HF signal thus retrieved, converts the HF signal into NRZ channel bits and provides the NRZ channel bits to the SISO-RLL decoder 95. The SISO RLL decoder 95 converts the NRZ channel bits into user bits, after which the user bits are processed by the LDPC decoder 96 to obtain the source bits.

The traditional PRML detector is replaced by a SISO-Channel Detector 94, which produces LLRs (log-likelihood-ratios) for the NRZ channel bits. Note that, apart from the BCJR-algorithm, also other algorithms exist for producing the LLR soft-info on the NRZ channel bits: in this sense, the reference made to SISO-Channel Detector 94 in the FIG. 9 should be understood in a broader sense, also representing the alternative algorithms like MAP, Max-log-MAP, SOVA etc. (see e.g. Zining Wu, "Coding and Iterative Detection for Magnetic Recording Channels", Kluwer Academic Publishers, 2000 for more detailed descriptions). The next building block of a soft-decision bit-detector is a so-called soft-in soft-out (SISO) RLL decoder 95: it has as input soft-decision information (LLR) on the NRZ channel bits, and as output, soft-decision information (LLR) on the user bits. Stated differently, the SISO-RLL decoder 95 transform the soft-decision information that applies to the NRZ channel bitstream $c_k$ towards soft-decision information that applies to the user bitstream $u_k$. Note that a standard RLL decoder has as input the hard bit-decisions on the NRZ channel bits $c_k$, and as output, the as-detected (hard) user-bits $u_k$. Such a SISO-RLL decoder 95 as disclosed by E. Yamada, T. Iwaki and T. Yamaguchi, in "Turbo Decoding with Run Length Limited Code for Optical Storage", Japanese Journal of Applied Physics, Part-1, Vol. 41, pp. 1753-1756, 2002 needs a finite-state machine (FSM) description of the RLL code. A good indication for the hardware complexity of a given RLL-SISO decoder is given by the number of branches in the decoding step.

The 17PP code is not constructed on the basis of the ACH-algorithm; it is a synchronous variable-length code with different mappings, all with code rate R=⅔. The practical mappings of the 17PP code are (from user bits to channel bits): 2-to-3, 4-to-6, 6-to-9 and 8-to-12. It has been pointed out by T. Miyauchi and Y. Iida, in "Soft-Output Decoding of 17PP Code", Technical Digest ISOM 2003 (International Symposium on Optical Memory), Nara, Japan, paper We-PP-13, pp. 314-315 that the 17PP RLL code as used in the BD standard, when transformed from a variable-length code structure into a FSM-based code structure (for the purpose of decoding only), has a high state-complexity with 21 states and 79 branches (per stage of the trellis with 2 input bits and 3 channel bits along the branches). For each group of 4 user bits, this implies the double complexity, that is, 158 branches.

The new RLL code of the current invention has 9 coding states, and per coding state a number of 16 branches, making a total of 144 branches. This implies that the new RLL code has 10% less hardware complexity for SISO-RLL decoding than the 17PP code of BD; and it should be recalled that the new RLL code has on top of that, the advantageous r=2 constraint, whereas 17PP has only r=6.

Alternative Code Words

It is clear from the above code construction that some combinations of 6-bit code words do not occur in the encoded channel bitstream. This relates to some of the entries of a given code word that have been "lost" during code construction. Each of the "lost" entries can be used as an alternative coding entry for exactly one entry in the coding state where said code word occurs (it does not need to be the same code word). This insight generates some freedom at the encoder side, which can be used as a side-channel, or for some other statistical properties of the encoded channel bitstream (like DC-control).

SECTION 4

Generalization of the Code According to the Invention

For the above codes, a new construction method for RLL codes with d=1 and r=2 has been derived. It turns out that the new construction method is generic, in the sense that it can be applied to any combination of the d and r constraint.

The method relates to the conversion of a user bitstream into a coded bitstream (also known as channel bitstream) by means of an overall channel code. Such a channel code converts a group of M information bits into a group of N code word bits. The first group of bits is also commonly referred to as an information word, the second group of bits is known as a code word or channel word. The overall channel code may be realized through the concatenation of a number S of sub-codes in a well-defined order that is cyclically repeated with a predetermined repeat period: each of the sub-codes receives $m_i$-bit information words at its input, that are converted into $n_i$-bit code words, where $m_i$ and $n_i$ are integers characteristic for each of the considered sub-codes. Further, for each sub-code, the second characteristic integer number $n_i$ is greater than the first characteristic integer number in $m_i$; also, the sum of the $m_i$-numbers of all sub-codes within the repeat period of the overall code equals M, and the sum of the $n_i$-numbers of all sub-codes within the repeat period of the overall code equals N. The key-feature in the new construction method is that, for each i-th sub-code, its $n_i$-bit code words are being divided into a number of T different types and are being arranged into T classes of coding states such that, for the given i-th sub-code, an $n_i$-bit code word of type t (where t is an integer number between 1 and T) can be concatenated with an $n_{i+1}$-bit code word of the next sub-code if this subsequent code word of the next sub-code belongs to one of coding states of the class with index T+1−t. For RLL code construction comprising the d and r constraints, it can be derived that $T=1+(d+1)\times(r+1)$.

The latter statement will be first explained for the number of different code word types. A code-word type is defined in terms of the trailing bits of a code-word. Further, a code-word type with a low index puts less restrictions of the leading bits of the subsequent code-word than a code-word type with a high index. The code-word type nr. 1 allows concatenation with any subsequent code-word. Code-words belonging to code-word type 1 all end with d+1 zeroes, that is:

| ... $0^{d+1}$|nr. 1

Subsequently, code-words belonging to code-word type 2, 3, ..., r+2 all end with $10^d$. Note that this last run is a run with minimum run length (d+1 channel bits). Preceding this last run $10^d$, one can distinguish r+1 cases: code-word type 2 has a run larger than the minimum run length, code-word type 3 has exactly one minimum run length preceding the last run $10^d$, code-word type 4 has exactly two minimum run lengths preceding the last run $10^d$, ..., and code-word type r+2 has exactly r minimum run lengths preceding the last run $10^d$. These r+1 different cases are listed below:

$|... 0^{d+1} \underline{10^d}|$ nr. 2

$|... 0^{d+1} \overset{1\times}{\underline{10^d}} \underline{10^d}|$ nr. 3

... ... ...

$|... 0^{d+1} \overset{r\times}{\overline{\underline{10^d} \underline{10^d} ... \underline{10^d}}} \underline{10^d}|$ nr. r+2

Next, code-words belonging to code-word type (r+2)+1, (r+2)+2, ..., (r+2)+(r+1) all end with $10^{d-1}$. Note that this last run cannot be a complete run since its run length is exactly one bit shorter than the minimum run length (of length (d+1) channel bits). Preceding this last run $10^{d-1}$, one can distinguish r+1 cases: code-word type (r+2)+1 has a run larger than the minimum run length, code-word type (r+2)+2 has exactly one minimum run length preceding the last run $10^{d-1}$, code-word type (r+2)+3 has exactly two minimum run lengths preceding the last run $10^{d-1}$, ..., and code-word type (r+2)+(r+1) has exactly r minimum run lengths preceding the last run $10^{d-1}$. These r+1 different cases are listed below:

$|... 0^{d+1} \underline{10^{d-1}}|$ nr. 1+(r+1)+1

$|... 0^{d+1} \overset{1\times}{\underline{10^d}} \underline{10^{d-1}}|$ nr. 1+(r+1)+2

... ... ...

$|... 0^{d+1} \overset{r\times}{\overline{\underline{10^d} \underline{10^d} ... \underline{10^d}}} \underline{10^{d-1}}|$ nr. 1+(r+1)+r+1

This enumeration of different code-word types is continued along the same lines as above: each time, the number of channel bits in the start of the last run is reduced by exactly one channel bit. At a given stage, one arrives at the situation that the start of the last run comprises exactly two bits, given by 10. The number of different code-word types (r+1) are listed below:

$|... 0^{d+1} \underline{10}|$ nr. 1+(d-1)×(r+1)+1

$|... 0^{d+1} \overset{1\times}{\underline{10^d}} \underline{10}|$ nr. 1+(d-1)×(r+1)+2

... ... ...

$|... 0^{d+1} \overset{r\times}{\overline{\underline{10^d} \underline{10^d} ... \underline{10^d}}} \underline{10}|$ nr. 1+(d-1)×(r+1)+r+1

Finally, the last step in this enumeration of different code-word types is reached when one arrive at the situation that the start of the last run comprises exactly one bit given by 1. The number of different code-word types (r+1) are listed below:

$|... 0^{d+1} \underline{1}|$ nr. 1+d×(r+1)+1

$|... 0^{d+1} \overset{1\times}{\underline{10^d}} \underline{1}|$ nr. 1+d×(r+1)+2

... ... ...

$|... 0^{d+1} \overset{r\times}{\overline{\underline{10^d} \underline{10^d} ... \underline{10^d}}} \underline{1}|$ nr. 1+d×(r+1)+r+1

In total, there are (d+1) enumeration steps (enumerating the different code-word types); for each enumeration step, there are r+1 different code-word types. In total, this amounts to the number of different code-word types given above, T=1+(d+1)×(r+1).

Before introducing the concept of a coding class, the leading bit-patterns are enumerated in a similar way as the code-word types (but with the respective leading bit-pattern obtained as the mirrored version from right to left of the trailing bit-pattern of the corresponding code-word type). This results in a catalogue of the possible leading bit-patterns:

$| 0^{d+1} ...$     nr. 1

$| \underline{0^d} 10^{d+1} ...$     nr. 2

$| \underline{0^d 1} \underline{0^d} 10^{d+1} ...$     nr. 3

... ... ...

$| \underline{0^d 1} \underline{0^d 1} ... \underline{0^d} 10^{d+1} ...$     nr. r+2

$| 0^{d-1} 10^{d+1} ...$     nr. 1+(r+1)+1

$| \underline{0^{d-1} 1} \underline{0^d} 10^{d+1} ...$     nr. 1+(r+1)+2

... ... ...

$| \underline{0^{d-1} 1} \underline{0^d 1} ... \underline{0^d} 10^{d+1} ...$     nr. 1+(r+1)+(r+1)

... ... ...

... ... ...

$| \underline{01} 0^{d+1} ...$     nr. 1+(d-1)×(r+1)+1

$| \underline{01} \underline{0^d} 10^{d+1} ...$     nr. 1+(d-1)×(r+1)+2

... ... ...

$| \underline{01} \underline{0^d 1} ... \underline{0^d} 10^{d+1} ...$     nr. 1+(d-1)×(r+1)+(r+1)

$| \underline{1} 0^{d+1} ...$     nr. 1+d×(r+1)+1

$| \underline{1} \underline{0^d} 10^{d+1} ...$     nr. 1+d×(r+1)+2

... ... ...

$| \underline{1} \underline{0^d 1} ... \underline{0^d} 10^{d+1} ...$     nr. 1+d×(r+1)+(r+1)

An RLL channel code comprises a number of coding states. In the current invention, each coding state is at least a member of one coding class. A coding class with index t comprises all code-words that have a leading bit-pattern with index i such that $1 \leq i \leq t$. The structure of code-word types on the one hand, and coding classes on the other hand, leads to the following property, as is used in the new code construction method: a code-word belonging to code-word type t can only be followed by a code-word if that code-word belongs to one of the coding states of coding class T+1−t.

It is further convenient to note that, due to the structure of code-word types and coding states as outlined above, that each of the $p_i$ coding states of a given considered coding class i, is also a coding state of all coding classes that have an index larger than i.

For the cases of the above examples in section 1 and 2 (d=1 and r=2), there are T=7 different coding classes and code word types. Practical codes have been derived as outlined in the above sections for a 9 bit oriented code, a byte oriented code and a code with a compact 4-to-6 mapping, all with d=1 and r=2.

For the case with d=2 and r=2, there are T=10 different coding classes and code word types. For the latter case, a practical code construction is described in the next sub section.

An Extremely Efficient RLL Code for d=2 and r=2

The Shannon capacity of the combined RLL constraints d=2 and 7=2 amounts to C(d=2,k=∞,r=2)=0.544997. A code with mapping of user bits onto channel bits of 32-to-59 may be possible to construct, since it has a rate R=0.542373≦C (d=2,k=∞,r=2): the efficiency of this new code η=R/C(d=2, k=∞,r=2) is such that only the small fraction 1−η=0.48% is lost compared to the theoretical upper limit. Obviously, code books with 32-bit entries are much too large to be of any practical use. In order to circumvent this problem, a solution is proposed that follows the lines of the algorithm presented by] J. J. Ashley and B. H. Marcus, in "Time-Varying Encoders for Constrained Systems: an Approach to Limiting Error Propagation", IEEE Transactions on Information Theory, Vol. 46, No. 3, pp. 1038-1043, May 2000. The latter approach generalizes the well known state-splitting algorithm or ACH-algorithm as disclosed by R. L. Adler, D. Coppersmith, and M. Hassner, in "Algorithms for Sliding Block Codes. An Application of Symbolic Dynamics to Information Theory", IEEE Transaction on Information Theory, Vol. IT-29, 1983, pp. 5-22, (used for the construction of efficient sliding block codes) for a concatenation of a number of codes (at multiple phases), where the encoding and decoding proceeds cyclically from one phase to the next (or, from one code to the next). Practically, for the new code with rate R=32/59, the overall code can be realized as a cyclic concatenation of four sub-codes, denoted $C_1$, $C_2$, $C_3$, and $C_4$, with respective mappings 8-to-15, 8-to-15, 8-to-15 and 8-to-14.

In the general case, the overall code is realized by a number of S sub-codes. The generalized ACH-algorithm looks for a set of S approximate eigenvectors, one for each sub-code, with $v_i^k$ denoting the i-th coefficient of the approximate eigenvector for the k-th sub-code, that satisfies the set of inequalities, for all states i of the corresponding state-transition diagram (STD) that describes the RLL constraints, and for all sub-codes k (with a mapping $m_k$-to-$n_k$ for the k-th sub-code):

$$\Sigma_j D_{i,j}^{m_k} v_j^{k+1} \geq 2^{n_k} v_i^k. \tag{72}$$

Figure 10:
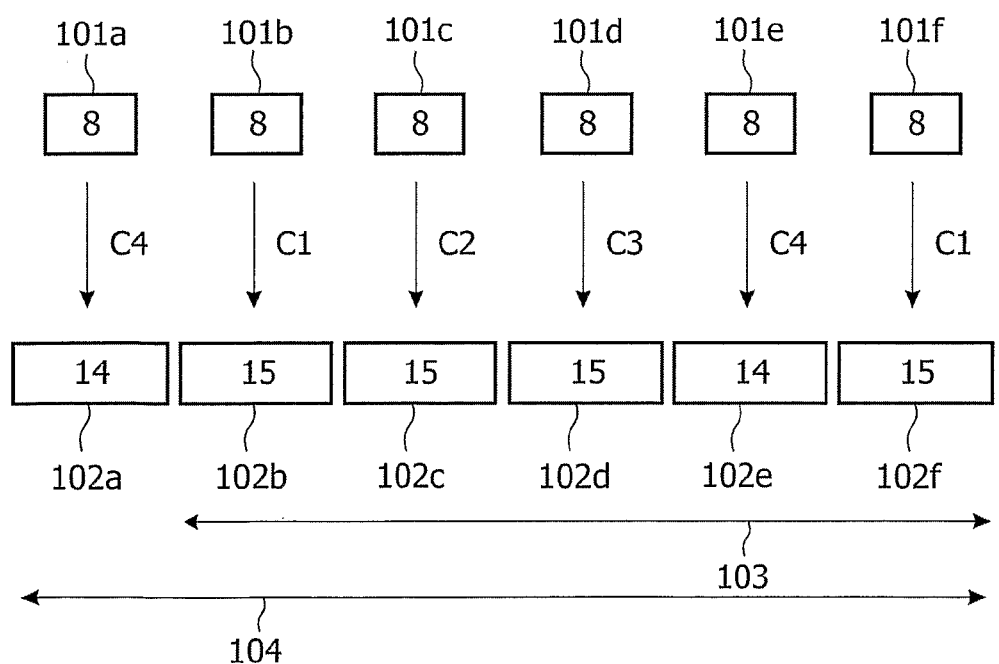
FIG. 10 shows a code comprising a repetition of four sub-codes.

Note that when k=S, the next sub-code with index k+1 due to the cyclic repeat-period of the sub-codes is the one with index equal to 1. In the above equation, D represent the so-called adjacency-matrix or connection-matrix for the STD: its matrix elements are equal to one if the corresponding two STD-states are connected in the graph, and are equal to zero if they are not connected. For the new code with RLL constraints d=2 and r=2, the four sub-codes have the parameters $m_1=m_2=m_3=m_4=8$, and $n_1=n_2=n_3=15$ and $n_4=14$. (Note that any scrambled but fixed order of these four mappings is also a valid order for the further code-construction, and falls within the scope of the current invention.) The cyclic repetition of the four sub-codes (denoted $C_1$, $C_2$, $C_3$ and $C_4$) is shown schematically in FIG. 10. FIG. 10 shows the repetition of the four subcodes C1, C2, C3, C4. The user words 101a, 101b, 101c, 101d, 101e, 101f are 8 bit. The repeat period 103 of the sub-codes C1, C2, C3, C4 is indicated by the arrow and comprises a repetition of the four sub-codes C1, C2, C3, C4. The user words 101a, 101b, 101c, 101d, 101e, 101f are converted into channel words 102a, 102b, 102c, 102d, 102e, 102f, which after concatenation form the coded bit stream 104. One of the sub-codes C4 converts the 8 bit user word 101e into a 14 bit channel word 102e, i.e. code word, while the remaining sub-codes C1, C2, C3 convert the user word 101b, 101c, 101d into a 15 bit channel word 102b, 102c, 102d.

This implies that the following inequalities have to be satisfied for the envisaged new overall code:

$$\Sigma_{j=1}^{10} D_{i,j}^{15} v_j^2 \geq 2^8 v_i^1, i=1,2,\ldots,10, \tag{73}$$

$$\Sigma_{j=1}^{10} D_{i,j}^{15} v_j^3 \geq 2^8 v_i^2, i=1,2,\ldots,10, \tag{74}$$

$$\Sigma_{j=1}^{10} D_{i,j}^{15} v_j^4 \geq 2^8 v_i^3, i=1,2,\ldots,10, \tag{75}$$

and $$\Sigma_{j=1}^{10} D_{i,j}^{14} v_j^1 \geq 2^8 v_i^4, i=1,2,\ldots,10. \tag{76}$$

Figure 11:
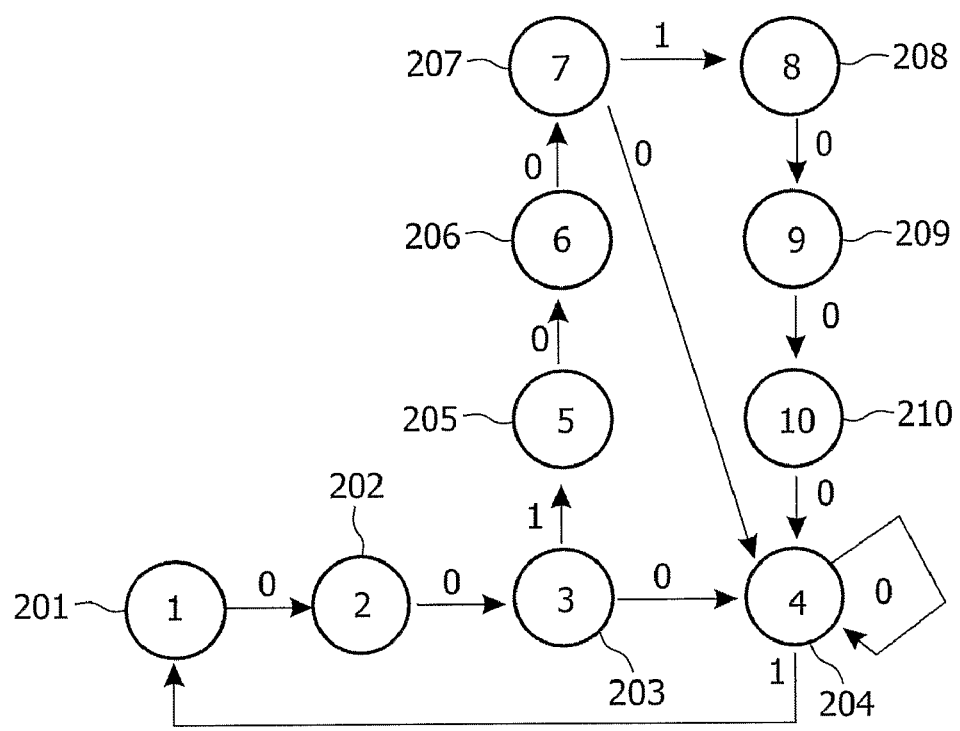
FIG. 11 shows the State Transition Diagram for d=2 and r=2 RLL constraints.

Some parameters of the above equations are now explained. For the RLL constraints d=2 and r=2, the STD is shown in FIG. 11: it comprises 10 states 201, 202, 203, 204, 205, 206, 207, 208, 209, 210. In FIG. 1 the state numbers are indicated as a number in the circle symbolizing the state, while in the text the states are denoted $\sigma_1, \sigma_2, \ldots, \sigma_{10}$. It should be noted that no k-constraint is considered in this STD. The k-constraint will be introduced at a later stage of the code design, but its introduction will not take place through an adaptation of the current STD. The fan-out of a given STD-state is the collection of code words (of a given length) that can leave from that state. For STD-state $\sigma_i$, the fan-out is denoted $F_{\sigma_i}$. The leading bits of the channel words of the fan-out for the 10 STD-states are listed in Table 11 (two parts, Part-I for the first 5 states and Part-II for the last 5 states); also the renumbered STD-states that are to be introduced later on, and which are denoted $\dot{\sigma}_i$, are also listed in Table 11. Finally, the different coding classes as will be introduced later on, are also listed in Table 11 (Part-I and Part-II).

TABLE 11

(Part-I).
Characteristics of
Fan-Out for STD-states and Definition of Coding
Classes. Case d = 2 & r = 2.

| Coding Class Nr | Original STD-state | Renumbered STD-state | Leading Bits |
|---|---|---|---|
| 1 | $\sigma_8$ | $\dot{\sigma}_{10}$ | \|000 . . . |
| 2 | $\sigma_5$ | $\dot{\sigma}_9$ | \|000 . . . |
|   |   |   | \|001000 . . . |
| 3 | $\sigma_1$ | $\dot{\sigma}_8$ | \|000 . . . |
|   |   |   | \|001000 . . . |
|   |   |   | \|001001000 . . . |
| 4 | $\sigma_9$ | $\dot{\sigma}_7$ | \|000 . . . |
|   |   |   | \|001000 . . . |
|   |   |   | \|001001000 . . . |
|   |   |   | \|001001001000 . . . |
| 5 | $\sigma_6$ | $\dot{\sigma}_6$ | \|000 . . . |
|   |   |   | \|001000 . . . |
|   |   |   | \|001001000 . . . |
|   |   |   | \|001001001000 . . . |
|   |   |   | \|01000 . . . |

TABLE 11

(Part-II).
Characteristics of
Fan-Out for STD-states and Definition
of Coding Classes. Case d = 2 & r = 2.

| Coding Class Nr | Original STD-state | Renumbered STD-state | Leading Bits |
|---|---|---|---|
| 6 | $\sigma_2$ | $\grave{\sigma}_5$ | \|000...<br>\|001000...<br>\|001001000...<br>\|001001001000...<br>\|01000...<br>\|01001000... |
| 7 | $\sigma_{10}$ | $\grave{\sigma}_4$ | \|000...<br>\|001000...<br>\|001001000...<br>\|001001001000...<br>\|01000...<br>\|01001000...<br>\|01001001000... |
| 8 | $\sigma_7$ | $\grave{\sigma}_3$ | \|000...<br>\|001000...<br>\|001001000...<br>\|001001001000...<br>\|01000...<br>\|01001000...<br>\|01001001000...<br>\|1000... |
| 9 | $\sigma_3$ | $\grave{\sigma}_2$ | \|000...<br>\|001000...<br>\|001001000...<br>\|001001001000...<br>\|01000...<br>\|01001000...<br>\|01001001000...<br>\|1000...<br>\|1001000... |
| 10 | $\sigma_4$ | $\grave{\sigma}_1$ | \|000...<br>\|001000...<br>\|001001000...<br>\|001001001000...<br>\|01000...<br>\|01001000...<br>\|01001001000...<br>\|1000...<br>\|1001000...<br>\|1001001000... |

From Table 11, it is clear that the following hierarchy in fan-out applies (with STD-state $\sigma_4$ having the largest fan-out):

$$F_{\sigma_8} \subset F_{\sigma_5} \subset F_{\sigma_1} \subset F_{\sigma_9} \subset F_{\sigma_6} \subset F_{\sigma_2} \subset F_{\sigma_{10}} \subset F_{\sigma_7} \subset F_{\sigma_3} \subset F_{\sigma_4}. \quad (77)$$

The new RLL code is constructed on the basis of a plurality of coding states, one set of coding states for each sub-code. According to the present invention, these coding states are arranged into $T=1+(d+1)\times(r+1)=10$ (since d=r=2) classes as follows:

the n-bit code words of the 1st class of coding states belong to $F_{\sigma_8}$ (or $F_{\sigma_{10}}$);

the n-bit code words of the 2nd class of coding states belong to $F_{\sigma_5}$ (or $F_{\sigma_9}$);

the n-bit code words of the 3rd class of coding states belong to $F_{\sigma_1}$ (or $F_{\sigma_8}$);

the n-bit code words of the 4th class of coding states belong to $F_{\sigma_9}$ (or $F_{\sigma_7}$);

the n-bit code words of the 5th class of coding states belong to $F_{\sigma_6}$ (or $F_{\sigma_6}$);

the n-bit code words of the 6th class of coding states belong to $F_{\sigma_2}$ (or $F_{\sigma_5}$);

the n-bit code words of the 7th class of coding states belong to $F_{\sigma_{10}}$ (or $F_{\sigma_4}$);

the n-bit code words of the 8th class of coding states belong to $F_{\sigma_7}$ (or $F_{\sigma_3}$);

the n-bit code words of the 9th class of coding states belong to $F_{\sigma_3}$ (or $F_{\sigma_2}$);

the n-bit code words of the 10th class of coding states belong to $F_{\sigma_4}$ (or $F_{\sigma_1}$).

Due to this specific ordering of the coding classes according to the present invention, a coding state of a coding class i is also a coding state of all coding classes with index j not smaller than i, that is, $j \geq i$. It is thus convenient to order the possible patterns of leading nits of code words as follows:

TABLE 12

Ordering of
Leading Bit Patterns.
Case d = 2 & r = 2.

| i | Pattern |
|---|---|
| 1 | \|000... |
| 2 | \|001000... |
| 3 | \|001001000... |
| 4 | \|001001001000... |
| 5 | \|01000... |
| 6 | \|01001000... |
| 7 | \|01001001000... |
| 8 | \|1000... |
| 9 | \|1001000... |
| 10 | \|1001001000... |

In addition, it is for the code-construction according to the present invention beneficial to consider the following ordering of the trailing bit patterns (with the arrival state of the STD also indicated, both the original one and the renumbered one) as outlined in Table 13. According to the present invention, code words can be divided into T=10 different code-word types as specified by the trailing bit pattern of the corresponding code-words.

TABLE 13

Ordering of Trailing Bit Patterns.
Definition of Code-Word Types.
Case d = 2 & r = 2.

| Coding Type Type Nr (j) | Pattern | Original STD-state | Renumbered STD-state |
|---|---|---|---|
| 1 | ...000\| | $\sigma_4$ | $\grave{\sigma}_1$ |
| 2 | ...000100\| | $\sigma_3$ | $\grave{\sigma}_2$ |
| 3 | ...000100100\| | $\sigma_7$ | $\grave{\sigma}_3$ |
| 4 | ...000100100100\| | $\sigma_{10}$ | $\grave{\sigma}_4$ |
| 5 | ...00010\| | $\sigma_2$ | $\grave{\sigma}_5$ |
| 6 | ...00010010\| | $\sigma_6$ | $\grave{\sigma}_6$ |
| 7 | ...00010010010\| | $\sigma_9$ | $\grave{\sigma}_7$ |
| 8 | ...0001\| | $\sigma_1$ | $\grave{\sigma}_8$ |
| 9 | ...0001001\| | $\sigma_5$ | $\grave{\sigma}_9$ |
| 10 | ...0001001001\| | $\sigma_8$ | $\grave{\sigma}_{10}$ |

It should be noted that the ordered trailing bit patterns (of Table 13) are the mirrored versions of the corresponding ordered leading bit patterns (of Table 12). Next, the already mentioned renumbering of the STD-states is discussed. It is now convenient to renumber the states of the STD in terms of the ordering of the trailing bit-patterns as they were listed in Table 13. This new numbering is outlined in the last two columns of Table 13. The new renumbered states are denoted $\sigma_i$. With this new numbering, code words of type i will arrive in the (renumbered) STD-state with the same index, that is, $\sigma_i$; consequently, code words of type i can be concatenated with any code word that belongs to a coding state of class T+1−i=11−i as a subsequent code word. It is to be noted that code words belonging to a coding state of class T+1−i=11−i have leading bit patterns (from Table 12) with index l where $1 \leq l \leq 11-i$. As an example, code words of type 3 (end with trailing bit pattern . . . 000100100|) can be concatenated with code words from coding states of class 8, which implies that the latter code words may start with the leading bit patterns (Table 12) i=1, i=2, . . . , i=8. This division of code words into T=10 different types of code words, and the arrangement of coding states into T=10 different coding classes, forms the basis for the further code construction: in this way, the RLL constraints d=2 and r=2 always remain satisfied, also upon concatenation of code words of cyclically consecutive subcodes. From Table 13, it is clear that the following hierarchy in fan-out applies for the renumbered STD-states:

$$F_{\sigma_{10}} \subset F_{\sigma_9} \subset F_{\sigma_8} \subset F_{\sigma_7} \subset F_{\sigma_6} \subset F_{\sigma_5} \subset F_{\sigma_4} \subset F_{\sigma_3} \subset F_{\sigma_2} \subset F_{\sigma_1}. \tag{78}$$

The renumbered STD-state $\sigma_1$ has the largest fan-out of all, and $\sigma_{10}$ the smallest one, with an enumerative ranking according to the decreasing fan-out from $\sigma_1$ to $\sigma_{10}$. With the renumbered STD-states, and a correspondingly rearranged connection matrix, denoted D, the approximate eigenvector inequalities (for the "new" eigenvectors v) are rewritten as:

$$\Sigma_{j=1}^{10} D_{l,j}^{15} v_j^2 \geq 2^8 v_l^1 \ l=1,2,\ldots,10, \tag{79}$$

$$\Sigma_{j=1}^{10} D_{l,j}^{15} v_j^3 \geq 2^8 v_l^2 \ l=1,2,\ldots,10, \tag{80}$$

$$\Sigma_{j=1}^{10} D_{l,j}^{15} v_j^4 \geq 2^8 v_l^3 \ l=1,2,\ldots,10, \tag{81}$$

and $$\Sigma_{j=1}^{10} D_{l,j}^{14} v_j^1 \geq 2^8 v_l^4 \ l=1,2,\ldots,10. \tag{82}$$

The leading bit patterns and trailing bit patterns of possible code words have been identified in Tables 12 and 13. The number of code words of length n that start with the leading bit pattern i and that end with the trailing bit pattern j is denoted $W_{i,j}[n]$. After close inspection, it turns out that:

$$D_{i,j}^n = \Sigma_{i=1}^{11-l} W_{i,j}[n]. \tag{83}$$

(where the number 11 is obtained from T+1 with T=10). With this knowledge, the approximate eigenvector inequalities can be rewritten into the form:

$$\Sigma_{i=1}^l \Sigma_{j=1}^{10} W_{i,j}[15] v_j^2 \geq 2^8 v_{11-l}^1, \ l=1,2,\ldots,10, \tag{84}$$

$$\Sigma_{i=1}^l \Sigma_{j=1}^{10} W_{i,j}[15] v_j^3 \geq 2^8 v_{11-l}^2, \ l=1,2,\ldots,10, \tag{85}$$

$$\Sigma_{i=1}^l \Sigma_{j=1}^{10} W_{i,j}[15] v_j^4 \geq 2^8 v_{11-l}^3, \ l=1,2,\ldots,10, \tag{86}$$

and $$\Sigma_{i=1}^l \Sigma_{j=1}^{10} W_{i,j}[14] v_j^1 \geq 2^8 v_{11-l}^4, \ l=1,2,\ldots,10. \tag{87}$$

The number of coding states per coding class is denoted by the vector $p^s$ for the s-th sub-code (s=1,2,3,4). Its relation to the approximate eigenvector $v^s$ is given by (for the i-th component, with $1 \leq i \leq 10$):

$$p_i^s = v_{11-i}^s. \tag{88}$$

Note that with this advantageous construction, the coding classes have a numbering system that is exactly complementary to the numbering system of the renumbered STD-states; this could already have been obvious from Table 11, where the renumbering of STD-states was mentioned, but not explained. Further, again due to the specific construction of the different coding classes, the following inequality holds (for each of the sub-codes s with s=1,2,3,4):

$$p_1^s \leq p_2^s \leq p_3^s \ldots \leq p_{10}^s. \tag{89}$$

Code-Design: Case with k=∞

First, the case without k-constraint (k=∞) is considered. The number of code words with specific leading bit pattern (i) and trailing bit pattern (j), denoted $W_{i,j}[n]$, for length n=15 and n=14 are given by:

$$W[15] = \begin{pmatrix} 41 & 13 & 4 & 1 & 19 & 6 & 2 & 28 & 9 & 3 \\ 13 & 4 & 1 & 1 & 6 & 2 & 1 & 9 & 3 & 1 \\ 4 & 1 & 1 & 0 & 2 & 1 & 0 & 3 & 1 & 0 \\ 1 & 1 & 0 & 0 & 1 & 0 & 0 & 1 & 0 & 0 \\ 19 & 6 & 2 & 1 & 9 & 3 & 1 & 13 & 4 & 1 \\ 6 & 2 & 1 & 0 & 3 & 1 & 0 & 4 & 1 & 1 \\ 2 & 1 & 0 & 0 & 1 & 0 & 0 & 1 & 1 & 0 \\ 28 & 9 & 3 & 1 & 13 & 4 & 1 & 19 & 6 & 2 \\ 9 & 3 & 1 & 0 & 4 & 1 & 1 & 6 & 2 & 1 \\ 3 & 1 & 0 & 0 & 1 & 1 & 0 & 2 & 1 & 0 \end{pmatrix} \tag{90}$$

and $$W[14] = \begin{pmatrix} 28 & 9 & 3 & 1 & 13 & 4 & 1 & 19 & 6 & 2 \\ 9 & 3 & 1 & 0 & 4 & 1 & 1 & 6 & 2 & 1 \\ 3 & 1 & 0 & 0 & 1 & 1 & 0 & 2 & 1 & 0 \\ 1 & 0 & 0 & 0 & 1 & 0 & 0 & 1 & 0 & 0 \\ 13 & 4 & 1 & 1 & 6 & 2 & 1 & 9 & 3 & 1 \\ 4 & 1 & 1 & 0 & 2 & 1 & 0 & 3 & 1 & 0 \\ 1 & 1 & 0 & 0 & 1 & 0 & 0 & 1 & 0 & 0 \\ 19 & 6 & 2 & 1 & 9 & 3 & 1 & 13 & 4 & 1 \\ 6 & 2 & 1 & 0 & 3 & 1 & 0 & 4 & 1 & 1 \\ 2 & 1 & 0 & 0 & 1 & 0 & 0 & 1 & 1 & 0 \end{pmatrix}. \tag{91}$$

Code-Design: Case with k-constraint

In order to generate a k-constraint without making use of an adapted STD with the k-constraint explicitly included, it is advantageous to limit the number of leading and trailing zeroes in the code words. The maximum number of leading zeroes in a code word is denoted $l_0$; the maximum number of trailing zeroes is denoted $r_0$. The number of code words with specific leading bit pattern i and trailing bit pattern j, with the additional constraint on $l_0$ and $r_0$, is denoted $W_{i,j}^{l_0,r_0}[n]$, for length n of the code word. It should be noted that the previously defined matrices can be identified as:

$$W_{i,j}[n] = W_{i,j}^{\infty,\infty}. \tag{92}$$

The additional constraint k=26 is realized with the choice $l_0 = r_0 = 13$ for the four sub-codes. The matrices $W^{13,13}[15]$ and $W^{13,13}[14]$ are given by:

$$W^{13,13}[15] = \begin{pmatrix} 40 & 13 & 4 & 1 & 19 & 6 & 2 & 27 & 9 & 3 \\ 13 & 4 & 1 & 1 & 6 & 2 & 1 & 9 & 3 & 1 \\ 4 & 1 & 1 & 0 & 2 & 1 & 0 & 3 & 1 & 0 \\ 1 & 1 & 0 & 0 & 1 & 0 & 0 & 1 & 0 & 0 \\ 19 & 6 & 2 & 1 & 9 & 3 & 1 & 13 & 4 & 1 \\ 6 & 2 & 1 & 0 & 3 & 1 & 0 & 4 & 1 & 1 \\ 2 & 1 & 0 & 0 & 1 & 0 & 0 & 1 & 1 & 0 \\ 27 & 9 & 3 & 1 & 13 & 4 & 1 & 19 & 6 & 2 \\ 9 & 3 & 1 & 0 & 4 & 1 & 1 & 6 & 2 & 1 \\ 3 & 1 & 0 & 0 & 1 & 1 & 0 & 2 & 1 & 0 \end{pmatrix} \quad (93)$$

and $$W^{13,13}[14] = \begin{pmatrix} 27 & 9 & 3 & 1 & 13 & 4 & 1 & 19 & 6 & 2 \\ 9 & 3 & 1 & 0 & 4 & 1 & 1 & 6 & 2 & 1 \\ 3 & 1 & 0 & 0 & 1 & 1 & 0 & 2 & 1 & 0 \\ 1 & 0 & 0 & 0 & 1 & 0 & 0 & 1 & 0 & 0 \\ 13 & 4 & 1 & 1 & 6 & 2 & 1 & 9 & 3 & 1 \\ 4 & 1 & 1 & 0 & 2 & 1 & 0 & 3 & 1 & 0 \\ 1 & 1 & 0 & 0 & 1 & 0 & 0 & 1 & 0 & 0 \\ 19 & 6 & 2 & 1 & 9 & 3 & 1 & 13 & 4 & 1 \\ 6 & 2 & 1 & 0 & 3 & 1 & 0 & 4 & 1 & 1 \\ 2 & 1 & 0 & 0 & 1 & 0 & 0 & 1 & 1 & 0 \end{pmatrix} \quad (94)$$

Note that with this choice of the number of leading and trailing zeroes in a code word of length n=14, only the all-zero code word is omitted (which implies that the matrix element at position (1,1) is decreased by unity as compared to the matrix without k-constraint); for the case of n=15, in addition the two code words $|10^{14}|$ and $|0^{14}1|$ are also omitted. A practical set of approximate eigenvectors of the rewritten approximate eigenvector inequalities is given by:

$$v^1 = \{26, 26, 24, 18, 17, 16, 12, 12, 11, 8\}, \quad (95)$$

$$v^2 = \{24, 23, 21, 16, 16, 15, 11, 11, 10, 7\}, \quad (96)$$

$$v^3 = \{22, 21, 19, 15, 14, 13, 10, 10, 9, 7\}, \quad (97)$$

$$v^4 = \{20, 19, 18, 13, 13, 12, 9, 9, 8, 6\}. \quad (98)$$

The first sub-code, denoted $C_1$, with 8-to-15 mapping, has a total of 26 coding states; the second sub-code, denoted $C_2$, also with 8-to-15 mapping, has a total of 24 coding states; the third sub-code, denoted $C_3$, also with 8-to-14 mapping, has a total of 22 coding states; the fourth sub-code, denoted $C_4$, with 8-to-14 mapping, has a total of 20 coding states. The distribution of the total number of coding states (for each sub-code) over the T=10 different coding classes is governed by the approximate eigenvector (for the given sub-code).

Construction of Code Tables for Case with k=26

The code-tables are further constructed in such a way that a code word (with all its possible next-states) can appear only in one particular coding state. For the decoding operation, this means that the next code word uniquely specifies the "next-state" function of a current code word.

Encoding and Decoding with Code for Case with k=26
Encoding
For encoding of a 8-bit user word, one needs to know:

(1) the sub-code $C_i$ with which the current user word has to be encoded; and:

(2) the state j of the sub-code $C_i$, denoted $C_i$-$S_j$ and the corresponding code table that is to be used for the encoding.

In the process of encoding, the encoder generates as output:

(1) the code word according to the code table that is to be used; and:

(2) the next sub-code that is to be used for the encoding of the next 8-bit user word, which is simply $C_{i+1}$ (which, for i=4, equals $C_1$ due to the cyclic repetition of the four sub-codes); and:

(3) the next state of the next sub-code $C_{i+1}$ according to the code table that is to be used upon encoding for the current user word, where this next state will specify which code table is to be used for the encoding of the next 8-bit user word with the next sub-code $C_{i+1}$.

Decoding

The decoding is state-independent, that is, it is not required to know the state in which the encoder encoded the 8-bit user word (that is now considered to be decoded). State-independent decoding is achieved by the fact that every code word and next-state combination that may occur, occurs only once in one single code table (among all the coding tables). Further, for the decoding of a code word into a user word, it is also required to know the next-state of the current code word. The latter next-state can be derived from the next code word that immediately follows the current code word. The fact that this is possible is obtained by the construction of the coding states, whereby each code word (independent of its next state) can only occur in a single code table among all the coding tables; so, the next code word unambiguously determines the next state of the current code word. It should be noted that the next state of a given code word (that was encoded with a sub-code $C_p$) is one out of the possible states of the next sub-code, that is, $C_{p+1}$.

The process of decoding is further explained as follows. At the input of the decoder, there are two code words, code word $W_i$ encoded with sub-code $C_p$, and code word $W_{i+1}$ encoded with the next sub-code $C_{p+1}$. For both code words, and independent on the sub-code that applies to each of the code words $W_i$ and $W_{i+1}$, an index can be derived (e.g. based on enumerative decoding for a d=2 RLL constraint). The respective indices are denoted $I_i$ and $I_{i+1}$ for the current and next code words. Next, the index $I_{i+1}$ is converted into a "next-state" of the current code word $W_i$ by means of a special conversion table (with is dependent on the sub-code that applies to the considered word $W_{i+1}$): this table maps each (index of a) code word onto the state to which it belongs for the considered sub-code (which is here $C_{p+1}$). This "next-state" is denoted $NS_i$. The combination of the index of the current code word $W_i$, that is $I_i$, in combination with its decoded next-state $NS_i$ are the input of a special decoding table for the given sub-code $C_p$, which yields the decoded (8-bit) user word.

SECTION 5

RLL Codes with d=1 and RMTR-constraint r=2 with a compact 2-to-3 mapping

In relation to hard-decision bit-detection, some new d=1 RLL codes with an RMTR-constraint of r=2 were proposed above, which have a very high efficiency for 9-bit user words at the input of the RLL encoder in section 1, and for 8-bit user words or bytes at the input of the RLL encoder in section 2. These codes have a large complexity in terms of number of coding states; further, they have at their input user words of length 8 or 9 bits. The latter two aspects make these highly efficient d=1 & r=2 RLL codes not suited for soft-decision RLL decoding, since, in order to limit the hardware complexity in such case, one can only allow a limited number of coding states and should have a concise code mapping from user bits onto channel bits. However, the insights that have lead to the code-construction of the latter two d=1 & r=2 RLL codes with extremely high efficiency, will be exploited also in the current ID to generate a new code, that has all properties as specified in the next section, and which make it much better suited for soft-decision SISO-RLL decoding. A first attempt for this purpose has resulted into a new code with 4-to-6 mapping, as outlined above. The current second attempt involves the most compact mapping that is possible, that is, a code with a 2-to-3 mapping.

d=1 & r=2 RLL Codes Suitable for Soft-Decision RLL Decoding

The r=2 RLL constraint is advantageous for the performance of the channel detector (which can be a PRML bit-detector for hard-decision bit-detection, and a BCJR channel detector or Max-log-MAP channel detector for soft-decision bit-detection). For instance, for hard-decision bit-detection, the r=2 constraint yields a capacity gain of about 5% over the situation with r≧6. It is therefore the aim of the current ID to generate a d=1 RLL code with the following properties:

it has an RMTR-constraint r=2;
it has a limited number of coding states;
it must not have an extremely high efficiency, since opting for the latter may lead to a too large complexity of the code, which makes it unsuitable for soft-decision SISO-RLL decoding; so, a code rate R=⅔ may still be OK;
it has a concise mapping, e.g. 2-to-3, limiting the fan-out of branches from each of the coding states of the code to $2^2=4$;
in addition, it must preferably have a k-constraint as well.

All of the above properties have been realized with the code-construction as follows.

General Aspects

It is the purpose of the current code-design to have a channel code with a compact mapping of user bits onto channel bits, so that the hardware complexity of the soft-decision SISO-RLL decoder (in terms of the total number of branches) can be kept low. The new code has a mapping of 2-to-3 of user bits onto channel bits (thus a code rate R=⅔). As has been discussed before, the Shannon capacity of the combined RLL constraints d=1 and r=2 amounts to C(d=1,k=∞,r=2) =0.679286. A code with mapping of user bits onto channel bits of 2-to-3 may be possible to construct, since it has a rate R=0.6667≦C(d=1,k=∞,r=2).

Construction of a sliding-block runlength limited (RLL) code is based on the ACH-algorithm as disclosed by R. L. Adler, D. Coppersmith, and M. Hassner, in "Algorithms for Sliding Block Codes. An Application of Symbolic Dynamics to Information Theory", IEEE Transaction on Information Theory, Vol. IT-29, 1983, pp. 5-22. This algorithm looks for an approximate eigenvector, with $v_i$ denoting the i-th coefficient of the approximate eigenvector that satisfies the set of inequalities for all states i of the corresponding state-transition diagram (STD) that describes the RLL constraints (for a code with m-to-n mapping):

$$\Sigma_j D_{i,j}^n v_j \geq 2^m v_i. \quad (89)$$

In the above equation, D represent the so-called adjacency-matrix or connection-matrix for the STD: its matrix elements are equal to one if the corresponding two STD-states are connected in the graph, and are equal to zero if they are not connected. For the new code with RLL constraints d=1 and r=2, the code has the parameters m=2 and n=3. This implies that the following inequalities have to be satisfied for the envisaged new code (with the numbers of states in the state-transition diagram describing the RLL constraints being equal to 7; see next subsection):

$$\Sigma_{j=1}^7 D_{i,j}^3 v_j \geq 2^2 v_i, i=1,2,\ldots,7. \quad (90)$$

State-Transition Diagram (STD)

It should be noted that the state-transition diagram (STD) describes the basic runlength constraints that have to be satisfied by the channel bitstream. An RLL code that satisfies these runlength constraints is based on a finite-state machine (FSM) comprising a certain number of states. Along the branches of the FSM of the code, the code-words of the RLL code are shown. Consider the RLL-encoder to be in a given FSM-state; for each of the $2^m=4$ input words, there is a unique branch leaving said FSM-state. Each of the branches is uniquely characterized by a branch-label, which is the code-word, together with the "next state" which is the arrival state of said branch. Concatenation of the code-words according to the structure of the FSM leads to a channel bitstream that satisfies the runlength constraints as outlined in the STD.

For the RLL constraints d=1 and r=2, the STD is shown in FIG. 2: it comprises 7 states, denoted $\sigma_1, \sigma_2, \ldots, \sigma_7$. It should be noted that no k-constraint is considered in this STD.

Next, the fan-out of each STD-state is analyzed. The fan-out of a given STD-state is the collection of code words (of a given length) that can leave from that state. For STD-state $\sigma_i$, the fan-out is denoted $F_{\sigma_i}$. The leading bits of the channel words of the fan-out for the 7 STD-states are listed in Table 14. Since the aim is for a code with 2-to-3 mapping, that is, with 3-bit channel words or code-words, the analysis is slightly adapted compared to the previously designed codes which have longer code-words. The characteristic bit-patterns in the code-words for the fan-out of a given STD-state comprises in some cases more than 3 channel bits; in such case, the fan-out of a given STD-state also limits the possibilities of the 3-bit code-word directly after the current 3-bit code-word that is emitted from the considered STD-state, and this because of the r=2 constraint. In Table 14, the renumbered STD-states are also listed, and which are denoted $\tilde{\sigma}_i$. Finally, the different coding classes as will be introduced later on, are also listed in Table 14. For the sake of completeness, it should be noted that the word boundaries between consecutive 3-bit codewords are indicated by the vertical lines "|".

TABLE 14

Characteristics of Fan-Out for STD-states and Definition of Coding Classes. ("x" denotes a "don't care bit").

| Coding Class Nr | Original STD-state | Renumbered STD-state | Leading Bits of Fan-Out |
|---|---|---|---|
| 1 | $\sigma_6$ | $\tilde{\sigma}_7$ | \|00x\|xxx\|xx . . . |
| 2 | $\sigma_4$ | $\tilde{\sigma}_6$ | \|00x\|xxx\|xx . . . |
|  |  |  | \|010\|0xx\|xx . . . |
| 3 | $\sigma_1$ | $\tilde{\sigma}_5$ | \|00x\|xxx\|xx . . . |
|  |  |  | \|010\|0xx\|xx . . . |
|  |  |  | \|010\|100\|xx . . . |

TABLE 14-continued

Characteristics of
Fan-Out for STD-states and
Definition of Coding Classes.
("x" denotes a "don't care bit").

| Coding Class Nr | Original STD-state | Renumbered STD-state | Leading Bits of Fan-Out |
|---|---|---|---|
| 4 | $\sigma_7$ | $\mathring{\sigma}_4$ | \|00x\|xxx\|xx . . . |
|   |   |   | \|010\|0xx\|xx . . . |
|   |   |   | \|010\|100\|xx . . . |
|   |   |   | \|010\|101\|00 . . . |
| 5 | $\sigma_5$ | $\mathring{\sigma}_3$ | \|00x\|xxx\|xx . . . |
|   |   |   | \|010\|0xx\|xx . . . |
|   |   |   | \|010\|100\|xx . . . |
|   |   |   | \|010\|101\|00 . . . |
|   |   |   | \|100\|xxx\|xx . . . |
| 6 | $\sigma_2$ | $\mathring{\sigma}_2$ | \|00x\|xxx\|xx . . . |
|   |   |   | \|010\|0xx\|xx . . . |
|   |   |   | \|010\|100\|xx . . . |
|   |   |   | \|010\|101\|00 . . . |
|   |   |   | \|100\|xxx\|xx . . . |
|   |   |   | \|101\|00x\|xx . . . |
| 7 | $\sigma_3$ | $\mathring{\sigma}_1$ | \|00x\|xxx\|xx . . . |
|   |   |   | \|010\|0xx\|xx . . . |
|   |   |   | \|010\|100\|xx . . . |
|   |   |   | \|010\|101\|00 . . . |
|   |   |   | \|100\|xxx\|xx . . . |
|   |   |   | \|101\|00x\|xx . . . |
|   |   |   | \|101\|010\|0x . . . |

From Table 14, it is clear that the following hierarchy in fan-out applies (with STD-state $\sigma_3$ having the largest fan-out):

$$F_{\sigma_6} \subset F_{\sigma_4} \subset F_{\sigma_1} \subset F_{\sigma_7} \subset F_{\sigma_5} \subset F_{\sigma_2} \subset F_{\sigma_3}. \tag{91}$$

The new RLL code is constructed on the basis of a plurality of coding states. According to the present invention, these coding states are arranged into (a maximum of) seven classes ($T_{max}=1+(d+1)\times(r+1)$ which equals 7 for d=1 and r=2) as follows:

the n-bit code words of the 1st class of coding states belong to $F_{\sigma_6}$ (or $F_{\sigma_7}$);

the n-bit code words of the 2nd class of coding states belong to $F_{\sigma_4}$ (or $F_{\sigma_6}$);

the n-bit code words of the 3rd class of coding states belong to $F_{\sigma_1}$ (or $F_{\sigma_5}$);

the n-bit code words of the 4th class of coding states belong to $F_{\sigma_7}$ (or $F_{\sigma_4}$);

the n-bit code words of the 5th class of coding states belong to $F_{\sigma_5}$ (or $F_{\sigma_3}$);

the n-bit code words of the 6th class of coding states belong to $F_{\sigma_2}$ (or $F_{\sigma_2}$);

the n-bit code words of the 7th class of coding states belong to $F_{\sigma_3}$ (or $F_{\sigma_1}$).

Due to this specific ordering of the coding classes according to the present invention, a coding state of a coding class i is also a coding state of all coding classes with index j not smaller than i, that is, $j \geq i$. It is thus convenient to order the possible patterns of leading bits of code words as follows (where in some cases, it is also required to indicate the relevant bits of one or even two of the subsequent code-words):

TABLE 15

Ordering of
Leading Bit Patterns.
("x" denotes a "don't care bit").

| i | Pattern |
|---|---|
| 1 | \|00x\|xxx\|xx . . . |
| 2 | \|010\|0xx\|xx . . . |
| 3 | \|010\|100\|xx . . . |
| 4 | \|010\|101\|00 . . . |
| 5 | \|100\|xxx\|xx . . . |
| 6 | \|101\|00x\|xx . . . |
| 7 | \|101\|010\|0x . . . |

In addition, it is for the code-construction according to the present invention beneficial to consider the following ordering of the trailing bit patterns (with the arrival state of the STD also indicated, both the original one and the renumbered one) as outlined in Table 16. According to the present invention, code words can be divided into 7 different types as specific by their trailing bit pattern. With the short code-word length of only 3 bits (for the 2-to-3 mapping), a code-word type will depend on the bits of the current code word, and also on some (if not all) bits of the previously emitted code-word.

TABLE 16

Ordering of Trailing Bit Patterns.
Definition of Coding Types for 3-bit Code-Words.
("x" denotes a "don't care bit").

| Coding Type Nr (j) | Pattern Previous Word | Pattern Current Word | Original STD-state | Renumbered STD-state |
|---|---|---|---|---|
| 1 | \|xxx\| | \|x00\| | $\sigma_3$ | $\mathring{\sigma}_1$ |
| 2 | \|xx0\| | \|010\| | $\sigma_2$ | $\mathring{\sigma}_2$ |
| 3 | \|001\| | \|010\| | $\sigma_5$ | $\mathring{\sigma}_3$ |
| 4 | \|101\| | \|010\| | $\sigma_7$ | $\mathring{\sigma}_4$ |
| 5 | \|xxx\| | \|001\| | $\sigma_1$ | $\mathring{\sigma}_5$ |
| 6 | \|x00\| | \|101\| | $\sigma_4$ | $\mathring{\sigma}_6$ |
| 7 | \|010\| | \|101\| | $\sigma_6$ | $\mathring{\sigma}_7$ |

It should be noted that the ordered trailing bit patterns (of Table 16) are the mirrored versions of the corresponding ordered leading bit patterns (of Table 15). Next, the already mentioned renumbering of the STD-states is discussed. It is now convenient to renumber the states of the STD in terms of the ordering of the trailing bit-patterns as they were listed in Table 16. This new numbering is outlined in the last two columns of Table 16. The new renumbered states are denoted $\mathring{\sigma}_i$. With this new numbering, code words of type i will arrive in the (renumbered) STD-state with the same index, that is, $\mathring{\sigma}_i$; consequently, a basic rule is that:

code words of type i can be concatenated with any code word that belongs to a coding state of class 8−i as a subsequent code word.

It is to be noted that code words belonging to a coding state of class 8−i have leading bit patterns (from Table 15) with index l where $1 \leq l \leq 8-i$. As an example, code words of type 3 (end with trailing bit pattern . . . 001010\|) can be concatenated with code words from coding states of class 5, which implies that the latter code words may start with the leading bit patterns (Table 15) i=1, i=2, . . . , i=5. This division of code words into 7 different types of code words, and the arrangement of coding states into 7 different coding classes, forms the basis for the further code construction: in this way, the RLL constraints d=1 and r=2 always remain satisfied (also upon concatenation of code words). From Table 16, it is clear that the following hierarchy in fan-out applies for the renumbered STD-states:

$$F_{\sigma_7} \subset F_{\sigma_6} \subset F_{\sigma_5} \subset F_{\sigma_4} \subset F_{\sigma_3} \subset F_{\sigma_2} \subset F_{\sigma_1}. \quad (92)$$

The renumbered STD-state $\sigma_1$ has the largest fan-out of all, and $\sigma_7$ the smallest one, with an enumerative ranking according to the decreasing fan-out from $\sigma_1$ to $\sigma_7$. With the renumbered STD-states, and a correspondingly rearranged connection matrix, denoted D, the approximate eigenvector inequalities (for the "new" eigenvectors v) are rewritten as:

$$\Sigma_{j=1}^{7} D_{l,j}{}^3 v_j \geq 2^2 v_l, \; l=1,2,\ldots,7. \quad (93)$$

The number of coding states per coding class is denoted by the vector p. Its relation to the approximate eigenvector v is given by (for the i-th component, with $1 \leq i \leq 7$):

$$p_i = v_{8-i}. \quad (94)$$

Note that with this advantageous construction, the coding classes have a numbering system that is exactly complementary to the numbering system of the renumbered STD-states; this could already have been obvious from Table 14, where the renumbering of STD-states was mentioned, but not explained. Further, again due to the specific construction of the different coding classes, the following inequality holds:

$$p_1 \leq p_2 \leq p_3 \ldots \leq p_7. \quad (95)$$

The Concept of Trivial Coding Classes

In the above reasoning, it has been assumed that all STD-states are visited as arrival states when emitting code-words from the FSM-codes of the RLL encoder. This corresponds with the situation of an approximate eigenvector where all its components are non-zero. However, in a code-construction by means of the ACH-algorithm, it is possible that some STD-states have a component of the approximate eigenvector that equals 0. Let us consider just for the sake of simplicity, the case where there is only one such STD-state, with index 8−j such that $v_{8-j}=0$ (the case with more than one such an STD-state is a trivial extension). The corresponding coding class has then index j, with $p_j=0$, that is, the coding class is empty, since it contains no coding states. Such an empty coding class is referred to as trivial coding class. Therefore, the actual number of non-trivial (non-empty) coding classes, denoted $N_{cc}$, must satisfy the relation $N_{cc} \leq T_{max} = 1+(d+1)\times(r+1)$. The hierarchy in the number of coding states for the different coding classes as outlined in Eq. (95), only applies for the non-trivial coding classes. This is explained for the practical example with d=1 and r=2 where coding class j is a trivial coding class ($p_j=0$). The hierarchy in the numbers $p_i$ of the non-trivial coding classes then reads as (for the general case with the maximum number of coding classes equal to $T_{max}=1+(d+1)\times(r+1)$):

$$p_1 \leq p_2 \leq \ldots \leq p_{j-1} \leq p_{j+1} \leq \ldots \leq p_{T_{max}}. \quad (96)$$

Practical Design Choices.

As a convenient approximate eigenvector, one can chose $v=\{3,5,5,2,4,2,0\}$, or, $v=\{5,5,4,0,3,2,2\}$. For the numbers $p_j$, which is the number of coding states in a coding class, one gets $p=\{2,2,3,0,4,5,5\}$. There is one trivial empty coding class, that is, the one with index j=4. So, the number of non-trivial coding classes, denoted T or $N_{cc}$, equals 6. Denoting the coding classes by $CC_i$, the following distribution of coding states over the coding classes results:

TABLE 17

Coding States for Coding Classes in 2-to-3 d = 1 and r = 2 RLL Code.

| Coding Class | Coding States |
|---|---|
| $CC_1$ | $\Sigma_1, \Sigma_2$ |
| $CC_2$ | $\Sigma_1, \Sigma_2$ |
| $CC_3$ | $\Sigma_1, \Sigma_2, \Sigma_3$ |
| $CC_4$ | none (trivial CC). |
| $CC_5$ | $\Sigma_1, \Sigma_2, \Sigma_3, \Sigma_4$ |
| $CC_6$ | $\Sigma_1, \Sigma_2, \Sigma_3, \Sigma_4, \Sigma_5$ |
| $CC_7$ | $\Sigma_1, \Sigma_2, \Sigma_3, \Sigma_4, \Sigma_5$ |

Following is a listing of Code-Words as they can be used in Each of the Coding Classes Coding Class $CC_1$

| Code-Word | "Next-States" | nr of entries |
|---|---|---|
| \|000\| | $\Sigma_1, \Sigma_2, \Sigma_3, \Sigma_4, \Sigma_5$ | 5 |
| \|001\| | $\Sigma_1, \Sigma_2, \Sigma_3$ | 3 |
| Total: | | 8 |
| | | fits exactly for first 2 states $\Sigma_1$ and $\Sigma_2$. |

Coding Class $CC_2$

Same as for $CC_1$.

Coding Class $CC_3$

| Code-Word | "Next-States" | nr of entries |
|---|---|---|
| \|010\| | $\Sigma_1, \Sigma_2, \Sigma_3, \Sigma_4$ | 4 |
| Total: | | 4 |
| | | fits exactly for 1 extra state $\Sigma_3$. |

Coding Class $CC_4$

Not applicable since trivial coding state.

Coding Class $CC_5$

| Code-Word | "Next-States" | nr of entries |
|---|---|---|
| \|010\| | $\Sigma_5$ | 1 |
| \|100\| | $\Sigma_1, \Sigma_2, \Sigma_3, \Sigma_4, \Sigma_5$ | 5 |
| Total: | | 6 |
| | | 2 left after use of 4 for 1 extra state $\Sigma_4$. |

Coding Class $CC_6$

| Code-Word | "Next-States" | nr of entries |
|---|---|---|
| \|101\| | $\Sigma_1, \Sigma_2$ | 2 |
| Total: | | 2 with 2 left from $CC_4$ fits exactly for 1 extra state $\Sigma_5$. |

Coding Class $CC_7$

Same as for $CC_6$.

Code Tables: Code with DC-control via Guided Scrambling

It should be noted that coding states $\Sigma_1$ and $\Sigma_2$ are using code words |000| and |001|; the three other coding states, $\Sigma_3$, $\Sigma_4$ and $\Sigma_5$ use the other three code-words, |010|, |100| and |101|. These are two disjoint sets of code-words. As such, this effect can be used to limit the decoding window for the look-ahead decoding (to three next 3-bit code-words, in addition to the current 3-bit code-word). The code-table derived from the above considerations is listed as "Code-Table (A)" below:

Code-Table (A) d = 1 r = 2 2-to-3 mapping 5-state FSM.

| User Dibit | $\Sigma_1$ | $\Sigma_2$ | $\Sigma_3$ | $\Sigma_4$ | $\Sigma_5$ |
|---|---|---|---|---|---|
| 00 | 000 $\Sigma_1$ | 000 $\Sigma_3$ | 010 $\Sigma_3$ | 100 $\Sigma_3$ | 100 $\Sigma_1$ |
| 01 | 000 $\Sigma_2$ | 000 $\Sigma_4$ | 010 $\Sigma_4$ | 100 $\Sigma_4$ | 100 $\Sigma_2$ |
| 10 | 001 $\Sigma_1$ | 000 $\Sigma_5$ | 010 $\Sigma_1$ | 100 $\Sigma_5$ | 101 $\Sigma_1$ |
| 11 | 001 $\Sigma_2$ | 001 $\Sigma_3$ | 010 $\Sigma_2$ | 010 $\Sigma_5$ | 101 $\Sigma_2$ |

Next, the parity-preserving property should be realized for this code in order to apply DC-control with it. As an intermediate step, Code-Table (A) is transformed into Code-Table (B) with some shuffles of table-entries within one and the same state. "Code-Table (B)" is listed below:

Code-Table (B) d = 1 r = 2 2-to-3 mapping 5-state FSM, prepared for transformation into PP-code.

| User Dibit | $\Sigma_1$ | $\Sigma_2$ | $\Sigma_3$ | $\Sigma_4$ | $\Sigma_5$ |
|---|---|---|---|---|---|
| 00 | 000 $\Sigma_1$ | 000 $\Sigma_3$ | 010 $\Sigma_1$ | 100 $\Sigma_5$ | 101 $\Sigma_1$ |
| 01 | 001 $\Sigma_1$ | 001 $\Sigma_3$ | 010 $\Sigma_3$ | 100 $\Sigma_3$ | 100 $\Sigma_1$ |
| 10 | 001 $\Sigma_2$ | 000 $\Sigma_5$ | 010 $\Sigma_4$ | 100 $\Sigma_4$ | 100 $\Sigma_2$ |
| 11 | 000 $\Sigma_2$ | 000 $\Sigma_4$ | 010 $\Sigma_2$ | 010 $\Sigma_5$ | 101 $\Sigma_2$ |

Code Tables with Parity-Preserve Property for DC-control

The above Code-Table (B) is not yet parity-preserving. By addition of two extra states, a parity-preserving RLL code is realized. The final Code-Table (C) becomes:

Code-Table (C) d = 1 r = 2 PP 2-to-3 mapping 7-state FSM.

| User Dibit | $\Sigma_1$ | $\Sigma_2$ | $\Sigma_3$ | $\Sigma_4$ | $\Sigma_5$ | $\Sigma_6$ | $\Sigma_7$ |
|---|---|---|---|---|---|---|---|
| 00 | 000 $\Sigma_1$ | 000 $\Sigma_3$ | 010 $\Sigma_6$ | 100 $\Sigma_5$ | 100 $\Sigma_1$ | 001 $\Sigma_1$ | 001 $\Sigma_3$ |
| 01 | 001 $\Sigma_1$ | 001 $\Sigma_3$ | 010 $\Sigma_3$ | 100 $\Sigma_3$ | 101 $\Sigma_1$ | 000 $\Sigma_1$ | 000 $\Sigma_3$ |
| 10 | 001 $\Sigma_2$ | 000 $\Sigma_5$ | 010 $\Sigma_4$ | 100 $\Sigma_4$ | 101 $\Sigma_2$ | 000 $\Sigma_2$ | 000 $\Sigma_4$ |
| 11 | 000 $\Sigma_2$ | 000 $\Sigma_4$ | 010 $\Sigma_7$ | 010 $\Sigma_5$ | 100 $\Sigma_2$ | 001 $\Sigma_2$ | 000 $\Sigma_5$ | k=13 constraint through an extra coding shell

It is obvious from the above coding tables (PP version and non-PP version of the code) that it is possible to emit an infinite stream of zeroes (infinite repetition of entry "0" with user di-bit "00" from FSM-state $\Sigma_1$). The objective is to realize a finite k-constraint through an extra coding shell to be carried out after the execution of the FSM-encoder. The description will now concentrate on the PP-version of the code, with its 7-state FSM. It can be analyzed from the coding table that a bit-pattern of |101|010| cannot be produced by this encoder. This aspect is used to perform substitutions on the channel bitstream based on this special pattern. At the encoder, this extra set of substitutions is carried out in an integrated way with the FSM-encoder; at the decoder, this extra set of substitutions is carried out before the sliding-block decoder (in case of hard-decision bit-detection). Describing this set of substitutions at the encoder as integrated with the FSM-encoder; the following 10 special cases have to be distinguished:

Extra Substitutions for k = 13.

| nr. | cs | di-bit input words | | | | ns |
|---|---|---|---|---|---|---|
| 1 | 1 | 00 | 00 | 00 | 00 | 1 |
| 2 | 6 | 01 | 00 | 00 | 00 | 1 |
| 3 | 1 | 00 | 00 | 00 | 11 | 2 |
| 4 | 6 | 01 | 00 | 00 | 11 | 2 |
| 5 | 1 | 00 | 00 | 11 | 00 | 3 |
| 6 | 6 | 01 | 00 | 11 | 00 | 3 |
| 7 | 1 | 00 | 00 | 11 | 10 | 5 |
| 8 | 6 | 01 | 00 | 11 | 10 | 5 |
| 9 | 1 | 00 | 00 | 11 | 11 | 4 |
| 10 | 6 | 01 | 00 | 11 | 11 | 4 |

"cs": current FSM-state
"ns": next FSM-state

For each of these input patterns, the channel bitstream would become, by use of the code tables of the PP-version (Code-Table (C) above):

|000|000|000|000|            (97)

By use of the substitutions, the channel bitstream is replaced by:

|000|101|010|010|            (98)

It should be noted that the latter 12-bit string in the channel bitstream is unique since it cannot be generated by use of the FSM-encoder. Further, the current-state (cs) and next-state (ns) in the FSM-encoder at the beginning and end of the 12-but string are not changed: this makes it possible to perform the backward substitution at the side of the decoder on the channel bitstream without requiring the knowledge of the encoder state. This is beneficial for minimization of error propagation. Further, these substitutions preserve the overall PP-property of the code. It can be checked that a k=13 constraint can be realized in this way.

SECTION 6

A d=1, r=2, k=12 RLL Code with Compact 2-to-3 Mapping, Suitable for Soft-Decision RLL Decoding As a convenient approximate eigenvector for this example, one can chose $v=\{6,10,10,5,9,4,6\}$, or, $v=\{10,10,9,6,6,5,4\}$. For the numbers $p_j$ which is the number of coding states in a coding class, we then have $p=\{4,5,6,6,9,10,10\}$. There is no trivial empty coding class, so, the number of non-trivial coding classes, denoted T or $N_{cc}$, equals $T=T_{max}=7$. Denoting the coding classes by $CC_j$, the following represents the distribution of coding states over the coding classes:

TABLE 5

Coding States for Coding Classes in 2-to-3 d = 1 and r = 2 RLL Code.

| Coding Class | Coding States |
|---|---|
| $CC_1$ | $\Sigma_1, \Sigma_2, \Sigma_3, \Sigma_4$ |
| $CC_2$ | $\Sigma_1, \Sigma_2, \Sigma_3, \Sigma_4, \Sigma_5$ |
| $CC_3$ | $\Sigma_1, \Sigma_2, \Sigma_3, \Sigma_4, \Sigma_5, \Sigma_6$ |
| $CC_4$ | $\Sigma_1, \Sigma_2, \Sigma_3, \Sigma_4, \Sigma_5, \Sigma_6$ |
| $CC_5$ | $\Sigma_1, \Sigma_2, \Sigma_3, \Sigma_4, \Sigma_5, \Sigma_6, \Sigma_7, \Sigma_8, \Sigma_9$ |
| $CC_6$ | $\Sigma_1, \Sigma_2, \Sigma_3, \Sigma_4, \Sigma_5, \Sigma_6, \Sigma_7, \Sigma_8, \Sigma_9, \Sigma_{10}$ |
| $CC_7$ | $\Sigma_1, \Sigma_2, \Sigma_3, \Sigma_4, \Sigma_5, \Sigma_6, \Sigma_7, \Sigma_8, \Sigma_9, \Sigma_{10}$ |

Code-Words that can be used in Each of the Coding Classes

Coding Class $CC_1$

| Code-Word | "Next-States" | nr of entries |
|---|---|---|
| \|000\| | $\Sigma_1$ up to $\Sigma_{10}$ | 10 |
| \|001\| | $\Sigma_1$ up to $\Sigma_6$ | 6 |
| Total: | | 16 fits exactly for first 4 states $\Sigma_1$ up to $\Sigma_4$. |

Coding Class $CC_2$

| Code-Word | "Next-States" | nr of entries |
|---|---|---|
| \|010\| | $\Sigma_1$ up to $\Sigma_6$ | 6 |
| Total: | | 6 2 left after use of 4 for 1 extra state $\Sigma_5$. |

Coding Class $CC_3$

| Code-Word | "Next-States" | nr of entries |
|---|---|---|
| \|010\| | $\Sigma_1$ up to $\Sigma_9$ | 9 − 4 = 5 |
| Total: | | 5 1 left after use of 4 for 1 extra state $\Sigma_6$. |

Coding Class $CC_4$

| Code-Word | "Next-States" | nr of entries |
|---|---|---|
| \|010\| | $\Sigma_1$ up to $\Sigma_{10}$ | 10 − 8 = 2 |
| Total: | | 2 2 left for further use |

Coding Class $CC_5$

| Code-Word | "Next-States" | nr of entries |
|---|---|---|
| \|100\| | $\Sigma_1$ up to $\Sigma_{10}$ | 10 |
| Total: | | 10 with 2 left from $CC_4$ fits exactly for 3 extra states $\Sigma_7$ up to $\Sigma_9$. |

Coding Class $CC_6$

| Code-Word | "Next-States" | nr of entries |
|---|---|---|
| \|101\| | $\Sigma_1$ up to $\Sigma_4$ | 4 |
| Total: | | 4 fits exactly for 1 extra state $\Sigma_{10}$. |

Coding Class $CC_7$

| Code-Word | "Next-States" | nr of entries |
|---|---|---|
| \|101\| | $\Sigma_1$ up to $\Sigma_5$ | 5 − 4 = 1 |
| Total: | | 1 not needed; useful substitution for k-constraint. |

Code-Table without k-constraint

The resulting Code-Table for the 10-state FSM with the d=1, k=∞, r=2 RLL constraints is shown below:

| CODE TABLE d = 1 k = infinity r = 2 WITH 10-STATE FINITE-STATE-MACHINE | | | | | |
|---|---|---|---|---|---|
| State-S1 | State-S2 | State-S3 | State-S4 | State-S5 | State-S6 |
| 0 000 1 | 0 000 6 | 0 000 5 | 0 001 1 | 0 010 1 | 0 010 6 |
| 1 000 2 | 1 000 7 | 1 000 10 | 1 001 2 | 1 010 2 | 1 010 7 |

-continued

CODE TABLE d = 1 k = infinity r = 2 WITH
10-STATE FINITE-STATE-MACHINE

| 2 000 3 | 2 000 8 | 2 001 5 | 2 001 3 | 2 010 3 | 2 010 8 |
| 3 000 4 | 3 000 9 | 3 001 6 | 3 001 4 | 3 010 4 | 3 010 9 |

| State-S7 | State-S8 | State-S9 | State-S10 |
| --- | --- | --- | --- |
| 0 100 5 | 0 100 1 | 0 100 6 | 0 101 1 |
| 1 100 10 | 1 100 2 | 1 100 7 | 1 101 2 |
| 2 010 5 | 2 100 3 | 2 100 8 | 2 101 3 |
| 3 010 10 | 3 100 4 | 3 100 9 | 3 101 4 |

Code-Table with k=12-constraint

It should be noted that in the above Code-Table, the code-word |101| with next-state $\Sigma_5$ (as available from Coding-Class $CC_7$) is not used. Therefore, it can be used to realize a finite k-constraint, that is, k=12, by duplicating state $\Sigma_1$ with its first entry (|000| with next-state $\Sigma_1$) replaced by said unused code-word |101| with next-state $\Sigma_5$ into an additional coding state, denoted $\Sigma_{11}$; also, the first entry of the 1 st Coding State $\Sigma_1$ itself is changed from |000| with next-state $\Sigma_1$ into |000| with next-state $\Sigma_{11}$.

The resulting Code-Table for the 11-state FSM with the d=1, k=12, r=2 RLL constraints is shown below:

CODE TABLE d = 1 k = 12 r = 2 WITH
11-STATE FINITE-STATE-MACHINE

| State-S1 | State-S2 | State-S3 | State-S4 | State-S5 | State-S6 |
| --- | --- | --- | --- | --- | --- |
| 0 000 11 | 0 000 6 | 0 000 5 | 0 001 1 | 0 010 1 | 0 010 6 |
| 1 000 2 | 1 000 7 | 1 000 10 | 1 001 2 | 1 010 2 | 1 010 7 |
| 2 000 3 | 2 000 8 | 2 001 5 | 2 001 3 | 2 010 3 | 2 010 8 |
| 3 000 4 | 3 000 9 | 3 001 6 | 3 001 4 | 3 010 4 | 3 010 9 |

| State-S7 | State-S8 | State-S9 | StateS10 | StateS11 |
| --- | --- | --- | --- | --- |
| 0 100 5 | 0 100 1 | 0 100 6 | 0 101 1 | 0 101 5 |
| 1 100 10 | 1 100 2 | 1 100 7 | 1 101 2 | 1 000 2 |
| 2 010 5 | 2 100 3 | 2 100 8 | 2 101 3 | 2 000 3 |
| 3 010 10 | 3 100 4 | 3 100 9 | 3 101 4 | 3 000 4 |

The invention claimed is:

1. A method of converting a user bitstream into a coded bitstream by means of an overall channel code comprising the steps of converting M-bit information words into N-bit code words, realizing said overall channel code by concatenating a number S of sub-codes in a cyclically repeated order with a predetermined repeat period, wherein each of the sub-codes receives $m_i$-bit information words, wherein $m_i$ is an integer characteristic for each of the sub-codes, that are converted into $n_i$-bit code words, wherein $n_i$ is an integer characteristic for each of the sub-codes, and wherein for each sub-code, said characteristic integer number $n_i$ is greater than said characteristic integer number $m_i$, such that a sum of the $m_i$-numbers of all sub-codes within said repeat period equals M, and that a sum of the $n_i$-numbers of all sub-codes within said repeat period equals N, and:

dividing for each sub-code, its $n_i$-bit code words into a number of $T_{max}$ different code-word types and arranging its $n_i$-bit code words into $T_{max}$ coding classes of coding states such that, for a given sub-code, an $n_i$-bit code word of type t, wherein t is an integer number between 1 and $T_{max}$, can be concatenated into a concatenated set of code words, realizing said N-bit code-words of said overall channel code that generates said coded bitstream, with an $n_{i+1}$-bit code word of the next sub-code if a subsequent code word of said next sub-code belongs to one of coding states of the coding class with index $T_{max}+1-t$.

2. A method as claimed in claim 1, wherein the code-word type is determined by a number of trailing bits of said code-word.

3. A method as claimed in claim 1, wherein the code-word type is determined by all bits of said code-word, together with at least one bit of a preceding code-word.

4. A method as claimed in claim 2, wherein the concatenated set of N-bit code words realizing said coded bitstream satisfy a dkr-constraint, wherein d refers to a minimum number of zero-bits between two consecutive one-bits in the coded bitstream, and k refers to a maximum number of zero-bits between two consecutive one-bits in the coded bitstream, and wherein r indicates a maximum number of consecutive minimum runs of d zero-bits each preceded by a one-bit.

5. A method as claimed in claim 4, wherein the number of different code-word types $\underline{T}$ and non-empty coding classes, wherein a non-empty coding class is defined to have at least one coding state, is not larger than $T_{max}=1+(d+1)\times(r+1)$.

6. A method as claimed in claim 4, wherein the number of different code-word types T and the number of different non-empty coding classes T, wherein T equals $T_{max}=1+(d+1)\times(r+1)$.

7. A method as claimed in claim 5, wherein d=1 and r=2, and $T_{max}$ equals 7.

8. A method as claimed in claim 7, wherein $T=T_{max}=7$ and wherein the number of sub-codes S equals 6.

9. A method as claimed in claim 8, wherein one of the sub-codes has a mapping with m=8 and n=11, and the other sub-codes have a mapping with m=8 and n=12.

10. A method as claimed in claim 7, wherein $T=T_{max}=7$ and wherein the number of sub-codes S equals 3.

11. A method as claimed in claim 10, wherein one of the sub-codes has m=9 and n=14, and the other sub-codes have m=9 and n=13.

12. A method as claimed in claim 7, wherein $T=T_{max}=7$ and wherein the number of sub-codes S equals 1.

13. A method as claimed in claim 12, wherein the sub-code has a mapping with m=4 and n=6.

14. A method as claimed in claim 12, wherein the single sub-code has a mapping with m=2 and n=3.

15. A method as claimed in claim 5, wherein, for each of the sub-codes, each of said $T \leq T_{max}$ non-empty coding classes of coding states comprises $p_1, p_2, \ldots, p_{max}$ coding states, wherein the trivial empty coding classes are omitted, such that for the numbers representing the non-zero number of states of the non-empty coding classes $p_1 \leq p_2 \leq \ldots \leq p_{max}$, and with $p_{max}$ giving the total number of coding states for said considered sub-code, further characterized in that each of the $p_i$ coding states of a given considered class "i", is also a coding state of all classes that have an index larger than "i".

16. A method as claimed in claim 7, wherein for each sub-code trailing bits are specified for the different code word types by the following set of rules, that is, the n-bit code words of the 1st type end with "00", the n-bit code words of the 2nd type end with "0010", the n-bit code words of the 3rd type end with "001010", the n-bit code words of the 4th type end with "00101010",
the n-bit code words of the 5th type end with
"001",
the n-bit code words of the 6th type end with
"00101",
the n-bit code words of the 7th type end with
"0010101",
and wherein leading bits of the code words belonging to the different coding classes are determined by the following set of rules, that is,
the n-bit code words of a coding state of the 1st class start with
"00",
the n-bit code words of a coding state of the 2nd class start with
"00" or "0100",
the n-bit code words of a coding state of the 3rd class start with
"00", "0100" or "010100",
the n-bit code words of a coding state of the 4th class start with
"00", "0100", "010100" or "01010100",
the n-bit code words of a coding state of the 5th class start with
"00", "0100", "010100", "01010100" or "100",
the n-bit code words of a coding state of the 6th class start with
"00", "0100", "010100", "01010100", "100" or "10100",
the n-bit code words of a coding state of the 7th class start with
"00", "0100", "010100", "01010100", "100", "10100" or "1010100".

17. A method as claimed in claim 9, wherein for the first sub-code the number $p_1,p_2,p_3,p_4,p_5,p_6,p_7$ of coding states for each of the T=7 classes of coding states amounts to $p_1=11$, $p_2=15$, $p_3=17$, $p_4=17$, $p_5=24$, $p_6=27$ and $p_7=28$, and wherein for the second sub-code the number $p_1,p_2,p_3,p_4,p_5,p_6,p_7$ of coding states for each of the 7 classes of coding states amounts to $p_1=10$, $p_2=14$, $p_3=15$, $p_4=16$, $p_5=22$, $p_6=25$ and $p_7=26$, and wherein for the third sub-code the number $p_1,p_2,p_3,p_4,p_5,p_6,p_7$ of coding states for each of the 7 classes of coding states amounts to $p_1=9$, $p_2=13$, $p_3=14$, $p_4=14$, $p_5=20$, $p_6=23$ and $p_7=24$ and wherein for the fourth sub-code the number $p_1,p_2,p_3,p_4,p_5,p_6,p_7$ of coding states for each of the 7 classes of coding states amounts to $p_1=8$, $p_2=11$, $p_3=13$, $p_4=13$, $p_5=19$, $p_6=21$ and $p_7=22$ and wherein for the fifth sub-code the number $p_1,p_2,p_3,p_4,p_5,p_6,p_7$ of coding states for each of the 7 classes of coding states amounts to $p_1=8$, $p_2=11$, $p_3=12$, $p_4=12$, $p_5=17$, $p_6=19$ and $p_7=20$ and wherein for the sixth sub-code the number $p_1,p_2,p_3,p_4,p_5,p_6,p_7$ of coding states for each of the 7 classes of coding states amounts to $p_1=7$, $p_2=10$, $p_3=11$, $p_4=12$, $p_5=16$, $p_6=18$ and $p_7=19$.

18. A method as claimed in claim 11, wherein for the first sub-code the number $p_1,p_2,p_3,p_4,p_5,p_6,p_7$ of coding states for each of the T=7 classes of coding states amounts to $p_1=7$, $p_2=10$, $p_3=11$, $p_4=11$, $p_5=16$, $p_6=18$ and $p_7=19$, and wherein for the second sub-code the number $p_1,p_2,p_3,p_4,p_5,p_6,p_7$ of coding states for each of the 7 classes of coding states amounts to $p_1=8$, $p_2=12$, $p_3=13$, $p_4=13$, $p_5=19$, $p_6=21$ and $p_7=22$, and wherein for the third sub-code the number $p_1,p_2,p_3,p_4,p_5,p_6,p_7$ of coding states for each of the 7 classes of coding states amounts to $p_1=10$, $p_2=14$, $p_3=15$, $p_4=16$, $p_5=22$, $p_6=25$ and $p_7=26$.

19. A method as claimed in claim 13, wherein the number $p_1,p_2,p_3,p_4,p_5,p_6,p_7$ of coding states for each of the T=7 classes of coding states amounts to $p_1=3$, $p_2=4$, $p_3=5$, $p_4=5$, $p_5=7$, $p_6=8$ and $p_7=8$.

20. A method as claimed in claim 19, wherein a finite k-constraint is realized through an extra coding state.

21. A method as claimed in claim 14, wherein a number of non-trivial coding classes T equals 6, with coding class number 4 being the empty one, yielding $p_4=0$, and wherein the number $p_1,p_2,p_3,p_5,p_6,p_7$ of coding states for each of the non-trivial coding classes T of coding states amounts to $p_1=2$, $p_2=2$, $p_3=3$, $p_5=4$, $p_6=5$ and $p_7=5$.

22. A method as claimed in claim 21, wherein a parity-preserve property is realized through at least one extra coding state.

23. A method as claimed in claim 21, wherein a finite k-constraint is realized through an extra coding shell on top of a Finite-State Machine with a basic 2-to-3 mapping of the code.

24. A method as claimed in claim 5, wherein d=2 and r=2, and $T_{max}$ equals 10.

25. A method as claimed in claim 24, wherein $T=T_{max}=10$ and wherein the number of sub-codes S equals 4.

26. A method as claimed in claim 25, wherein a one of the sub-codes has a mapping with m=8 and n=14 and the other sub-codes have a mapping with m=8 and n=15.

27. A method as claimed in claim 24, wherein for each sub-code trailing bits are specified for the different code word types by the following set of rules, that is,
the n-bit code words of the 1st type end with
"000",
the n-bit code words of the 2nd type end with
"000100",
the n-bit code words of the 3rd type end with
"000100100",
the n-bit code words of the 4th type end with
"000100100100",
the n-bit code words of the 5th type end with
"00010",
the n-bit code words of the 6th type end with
"00010010",
the n-bit code words of the 7th type end with
"00010010010",
the n-bit code words of the 8th type end with
"0001",
the n-bit code words of the 9th type end with
"0001001",
the n-bit code words of the 10th type end with
"0001001001",
and wherein leading bits of the code words belonging to the different coding classes are determined by the following set of rules, that is,
the n-bit code words of a coding state of the 1st class start with
"000",
the n-bit code words of a coding state of the 2nd class start with
"000" or "001000",
the n-bit code words of a coding state of the 3rd class start with
"000", "001000" or "001001000",
the n-bit code words of a coding state of the 4th class start with
"000", "001000", "001001000" or "001001001000",
the n-bit code words of a coding state of the 5th class start with
"000", "001000", "001001000", "001001001000" or "01000",
the n-bit code words of a coding state of the 6th class start with "000", "001000", "001001000", "001001001000", "01000" or "01001000",
the n-bit code words of a coding state of the 7th class start with
"000", "001000", "001001000", "001001001000", "01000", "01001000" or "01001001000",
the n-bit code words of a coding state of the 8th class start with
"000", "001000", "001001000", "001001001000", "01000", "01001000", "01001001000" or "1000",
the n-bit code words of a coding state of the 9th class start with
"000", "001000", "001001000", "001001001000", "01000", "01001000", "01001001000", "1000" or "1001000",
the n-bit code words of a coding state of the 10th class start with
"000", "001000", "001001000", "001001001000", "01000", "01001000", "01001001000", "1000", "1001000" or "1001001000".

28. A method as claimed in claim 26, wherein for the first sub-code the number $p_1,p_2,p_3,p_4,p_5,p_6,p_7,p_8,p_9,p_{10}$ of coding states for each of the T=10 classes of coding states amounts to $p_1=8$, $p_2=11$, $p_3=12$, $p_4=12$, $p_5=16$, $p_6=17$, $p_7=18$, $p_8=24$, $p_9=26$ and $p_{10}=26$, and wherein for the second sub-code the number $p_1,p_2,p_3,p_4,p_5,p_6,p_7,p_8,p_9,p_{10}$ of coding states for each of the 10 classes of coding states amounts to $p_1=7$, $p_2=10$, $p_3=11$, $p_4=11$, $p_5=15$, $p_6=16$, $p_7=16$, $p_8=21$, $p_9=23$ and $p_{10}=24$, and wherein for the third sub-code the number $p_1,p_2,p_3,p_4,p_5,p_6,p_7,p_8,p_9,p_{10}$ of coding states for each of the 10 classes of coding states amounts to $p_1=7$, $p_2=9$, $p_3=10$, $p_4=10$, $p_5=13$, $p_6=14$, $p_7=15$, $p_8=19$, $p_9=21$ and $p_{10}=22$, and wherein for the fourth sub-code the number $p_1,p_2,p_3,p_4,p_5,p_6,p_7,p_8,p_9,p_{10}$ of coding states for each of the 10 classes of coding states amounts to $p_1=6$, $p_2=8$, $p_3=9$, $p_4=9$, $p_5=12$, $p_6=13$, $p_7=13$, $p_8=18$, $p_9=19$ and $p_{10}=20$.

29. A method as claimed in claim 14, wherein the number of non-trivial coding classes T equals 7, and wherein the number $p_1,p_2,p_3,p_4,p_5,p_6,p_7$ of coding states for each of the 7 non-trivial coding classes of coding states amounts to $p_1=4$, $p_2=5$, $p_3=6$, $p_4=6$, $p_5=9$, $p_6=10$ and $p_7=10$.

30. A method as claimed in claim 29, wherein a k=12 constraint is realized through an extra coding state in the finite-state-machine of the code.

31. A method as claimed in claim 29, wherein a method of guided scrambling is used for DC-control.

32. A coder for of converting a user bitstream into a coded bitstream by means of an overall channel code by converting M-bit information words into N-bit code words, the coder comprising sub-coders repeated in a cyclical order with a predetermined repeat period, each sub-coder using a sub-code, wherein each sub-coder is arranged to receive $m_i$-bit information words, wherein $m_i$ is an integer characteristic for each of the sub-codes, and is arranged to convert the received $m_i$-bit information words into $n_i$-bit code words, wherein $n_i$ is an integer characteristic for each of the sub-codes, and wherein for each sub-code, said characteristic integer number $n_i$ is greater than said characteristic integer number $m_i$, such that the sum of the $m_i$-numbers of all sub-codes within said repeat period equals M, and that the sum of the $n_i$-numbers of all sub-codes within said repeat period equals N, wherein for each sub-code, its $n_i$-bit code words are divided into a number of $T_{max}$ different code-word types and arranging its $n_i$-bit code words into $T_{max}$ coding classes of coding states such that, for a given sub-code, an $n_i$-bit code word of type t, wherein t is an integer number between 1 and $T_{max}$, can be concatenated into a concatenated set of code words thus generating said coded bitstream and realizing said N-bit code-words of said overall channel code, with an $n_{i+1}$-bit code word of the next sub-code if said subsequent code word of said next sub-code belongs to one of coding states of the coding class with index $T_{max}+1-t$.

33. A coder as claimed in claim 32, wherein the code-word type is determined by a number of trailing bits of said code-word.

34. A coder as claimed in claim 32, wherein the code-word type is determined by all bits of said code-word, together with at least one bit of a preceding code-word.

35. A coder claimed in claim 33, wherein the concatenated set of N-bit code words realizing said coded bitstream satisfy a dkr-constraint, wherein d refers to a minimum number of zero-bits between two consecutive one-bits in the coded bitstream, and k refers to a maximum number of zero-bits between two consecutive one-bits in the coded bitstream, and wherein r indicates a maximum number of consecutive minimum runs of d zero-bits each preceded by a one-bit.

36. A coder as claimed in claim 35, wherein the number of different code-word types $\underline{T}$ and non-empty coding classes, wherein a non-empty coding class is defined to have at least one coding state, is not larger than $T_{max}=1+(d+1)\times(r+1)$.

37. A coder as claimed in claim 35, wherein the number of different code-word types T and the number of different non-empty coding classes T, wherein T equals $T_{max}=1+(d+1)\times(r+1)$.

38. A coder as claimed in claim 36, wherein d=1 and r=2, and $T_{max}$ equals 7.

39. A coder as claimed in claim 38, wherein $T=T_{max}=7$ and wherein the number of sub-coders S equals 6.

40. A coder as claimed in claim 39, wherein one of the sub-coders uses a mapping with m=8 and n=11, and the other sub-coders use a mapping with m=8 and n=12.

41. A coder as claimed in claim 40, wherein $T=T_{max}=7$ and wherein the number of sub-coders S equals 3.

42. A coder as claimed in claim 41, wherein one of the sub-coders uses m=9 and n=14, and the other sub-coders use m=9 and n=13.

43. A coder as claimed in claim 38, wherein $T=T_{max}=7$ and wherein the number of sub-coders S equals 1.

44. A coder as claimed in claim 43, wherein the sub-coder uses a mapping with m=4 and n=6.

45. A coder as claimed in claim 43, wherein the single sub-coder uses a mapping with m=2 and n=3.

46. A coder as claimed in claim 36, wherein, for each of the sub-coders, each of said $T \leq T_{max}$ non-empty coding classes of coding states comprises $p_1, p_2, \ldots, p_{max}$ coding states, wherein the trivial empty coding classes are omitted, such that for the numbers representing the non-zero number of states of the non-empty coding classes $p_1 \leq p_2 \leq \ldots \leq p_{max}$, and with $p_{max}$ giving the total number of coding states for said considered sub-coder, further characterized in that each of the $p_i$ coding states of a given considered class "i", is also a coding state of all classes that have an index larger than "i".

47. A coder as claimed in claim 38, wherein for each sub-coder trailing bits are specified for the different code word types by the following set of rules, that is,
the n-bit code words of the 1st type end with "00",
the n-bit code words of the 2nd type end with "0010",
the n-bit code words of the 3rd type end with "001010",
the n-bit code words of the 4th type end with "00101010", the n-bit code words of the 5th type end with
"001",
the n-bit code words of the 6th type end with
"00101",
the n-bit code words of the 7th type end with
"0010101",
and wherein leading bits of the code words belonging to the different coding classes are determined by the following set of rules, that is,
the n-bit code words of a coding state of the 1st class start with
"00",
the n-bit code words of a coding state of the 2nd class start with
"00" or "0100",
the n-bit code words of a coding state of the 3rd class start with
"00", "0100" or "010100",
the n-bit code words of a coding state of the 4th class start with
"00", "0100", "010100" or "01010100",
the n-bit code words of a coding state of the 5th class start with
"00", "0100", "010100", "01010100" or "100",
the n-bit code words of a coding state of the 6th class start with
"00", "0100", "010100", "01010100", "100" or "10100",
the n-bit code words of a coding state of the 7th class start with
"00", "0100", "010100", "01010100", "100", "10100" or "1010100".

48. A coder as claimed in claim 40, wherein for the first sub-coder the number $p_1, p_2, p_3, p_4, p_5, p_6, p_7$ of coding states for each of the T=7 classes of coding states amounts to $p_1=11$, $p_2=15$, $p_3=17$, $p_4=17$, $p_5=24$, $p_6=27$ and $p_7=28$, and wherein for the second sub-coder the number $p_1, p_2, p_3, p_4, p_5, p_6, p_7$ of coding states for each of the 7 classes of coding states amounts to $p_1=10$, $p_2=14$, $p_3=15$, $p_4=16$, $p_5=22$, $p_6=25$ and $p_7=26$, and wherein for the third sub-coder the number $p_1, p_2, p_3, p_4, p_5, p_6, p_7$ of coding states for each of the 7 classes of coding states amounts to $p_1=9$, $p_2=13$, $p_3=14$, $p_4=14$, $p_5=20$, $p_6=23$ and $p_7=24$ and wherein for the fourth sub-coder the number $p_1, p_2, p_3, p_4, p_5, p_6, p_7$ of coding states for each of the 7 classes of coding states amounts to $p_1=8$, $p_2=11$, $p_3=13$, $p_4=13$, $p_5=19$, $p_6=21$ and $p_7=22$ and wherein for the fifth sub-coder the number $p_1, p_2, p_3, p_4, p_5, p_6, p_7$ of coding states for each of the 7 classes of coding states amounts to $p_1=8$, $p_2=11$, $p_3=12$, $p_4=12$, $p_5=17$, $p_6=19$ and $p_7=20$ and wherein for the sixth sub-coder the number $p_1, p_2, p_3, p_4, p_5, p_6, p_7$ of coding states for each of the 7 classes of coding states amounts to $p_1=7$, $p_2=10$, $p_3=11$, $p_4=12$, $p_5=16$, $p_6=18$ and $p_7=19$.

49. A coder as claimed in claim 42, wherein for the first sub-coder the number $p_1, p_2, p_3, p_4, p_5, p_6, p_7$ of coding states for each of the T=7 classes of coding states amounts to $p_1=7$, $p_2=10$, $p_3=11$, $p_4=11$, $p_5=16$, $p_6=18$ and $p_7=19$, and wherein for the second sub-coder the number $p_1, p_2, p_3, p_4, p_5, p_6, p_7$ of coding states for each of the 7 classes of coding states amounts to $p_1=8$, $p_2=12$, $p_3=13$, $p_4=13$, $p_5=19$, $p_6=21$ and $p_7=22$, and wherein for the third sub-coder the number $p_1, p_2, p_3, p_4, p_5, p_6, p_7$ of coding states for each of the 7 classes of coding states amounts to $p_1=10$, $p_2=14$, $p_3=15$, $p_4=16$, $p_5=22$, $p_6=25$ and $p_7=26$.

50. A coder as claimed in claim 44, wherein the number $p_1, p_2, p_3, p_4, p_5, p_6, p_7$ of coding states for each of the T=7 classes of coding states amounts to $p_1=3$, $p_2=4$, $p_3=5$, $p_4=5$, $p_5=7$, $p_6=8$ and $p_7=8$.

51. A coder as claimed in claim 50, wherein a finite k-constraint is realized through an extra coding state.

52. A coder as claimed in claim 45, wherein a number of non-trivial coding classes T equals 6, with coding class number 4 being the empty one, yielding $p_4=0$, and wherein the number $p_1, p_2, p_3, p_5, p_6, p_7$ of coding states for each of the non-trivial coding classes T of coding states amounts to $p_1=2$, $p_2=2$, $p_3=3$, $p_5=4$, $p_6=5$ and $p_7=5$.

53. A coder as claimed in claim 52, wherein a parity-preserve property is realized through at least one extra coding state.

54. A coder as claimed in claim 52, wherein the sub-coder comprises a Finite-State Machine with a basic 2-to-3 mapping of the code and wherein a finite k-constraint is realized through an extra coding shell on top of the Finite-State Machine.

55. A coder as claimed in claim 36, wherein d=2 and r=2, and $T_{max}$ equals 10.

56. A coder as claimed in claim 55, wherein $T=T_{max}=10$ and wherein the number of sub-coders S equals 4.

57. A coder as claimed in claim 56, wherein a one of the sub-coders uses a mapping with m=8 and n=14 and the other sub-coders use a mapping with m=8 and n=15.

58. A coder as claimed in claim 55, wherein for each sub-coder trailing bits are specified for the different code word types by the following set of rules, that is,
the n-bit code words of the 1st type end with
"000",
the n-bit code words of the 2nd type end with
"000100",
the n-bit code words of the 3rd type end with
"000100100",
the n-bit code words of the 4th type end with
"000100100100",
the n-bit code words of the 5th type end with
"00010",
the n-bit code words of the 6th type end with
"00010010",
the n-bit code words of the 7th type end with
"00010010010",
the n-bit code words of the 8th type end with
"0001",
the n-bit code words of the 9th type end with
"0001001",
the n-bit code words of the 10th type end with
"0001001001",
and wherein leading bits of the code words belonging to the different coding classes are determined by the following set of rules, that is,
the n-bit code words of a coding state of the 1st class start with
"000",
the n-bit code words of a coding state of the 2nd class start with
"000" or "001000",
the n-bit code words of a coding state of the 3rd class start with
"000", "001000" or "001001000",
the n-bit code words of a coding state of the 4th class start with
"000", "001000", "001001000" or "001001001000",
the n-bit code words of a coding state of the 5th class start with
"000", "001000", "001001000", "001001001000" or "01000",
the n-bit code words of a coding state of the 6th class start with "000", "001000", "001001000", "001001001000", "01000" or "01001000", the n-bit code words of a coding state of the 7th class start with "000", "001000", "001001000", "001001001000", "01000", "01001000" or "01001001000", the n-bit code words of a coding state of the 8th class start with "000", "001000", "001001000", "001001001000", "01000", "01001000", "01001001000" or "1000", the n-bit code words of a coding state of the 9th class start with "000", "001000", "001001000", "001001001000", "01000", "01001000", "01001001000", "1000" or "1001000", the n-bit code words of a coding state of the 10th class start with "000", "001000", "001001000", "001001001000", "01000", "01001000", "01001001000", "1000", "1001000" or "1001001000".

59. A method as claimed in claim 26, wherein for the first sub-code the number $p_1,p_2,p_3,p_4,p_5,p_6,p_7,p_8,p_9,p_{10}$ of coding states for each of the T=10 classes of coding states amounts to $p_1=8$, $p_2=11$, $p_3=12$, $p_4=12$, $p_5=16$, $p_6=17$, $p_7=18$, $p_8=24$, $p_9=26$ and $p_{10}=26$, and wherein for the second sub-code the number $p_1,p_2,p_3,p_4,p_5,p_6,p_7,p_8,p_9,p_{10}$ of coding states for each of the 10 classes of coding states amounts to $p_1=7$, $p_2=10$, $p_3=11$, $p_4=11$, $p_5=15$, $p_6=16$, $p_7=16$, $p_8=21$, $p_9=23$ and $p_{10}=24$, and wherein for the third sub-code the number $p_1,p_2,p_3,p_4,p_5,p_6,p_7,p_8,p_9,p_{10}$ of coding states for each of the 10 classes of coding states amounts to $p_1=7$, $p_2=9$, $p_3=10$, $p_4=10$, $p_5=13$, $p_6=14$, $p_7=15$, $p_8=19$, $p_9=21$ and $p_{10}=22$, and wherein for the fourth sub-code the number $p_1,p_2,p_3,p_4,p_5,p_6,p_7,p_8,p_9,p_{10}$ of coding states for each of the 10 classes of coding states amounts to $p_1=6$, $p_2=8$, $p_3=9$, $p_4=9$, $p_5=12$, $p_6=13$, $p_7=13$, $p_8=18$, $p_9=19$ and $p_{10}=20$.

60. A coder as claimed in claim 45, wherein the number of non-trivial coding classes T equals 7, and wherein the number $p_1,p_2,p_3,p_4,p_5,p_6$, $p_7$ of coding states for each of the 7 non-trivial coding classes of coding states amounts to $p_1=4$, $p_2=5$, $p_3=6$, $p_4=6$, $p_5=9$, $p_6=10$ and $p_7=10$.

61. A coder as claimed in claim 60, wherein a k=12 constraint is realized through an extra coding state in the finite-state-machine of the sub coder.

62. A coder as claimed in claim 60, wherein a method of guided scrambling is used for DC-control.

63. A record carrier comprising a signal comprising a coded bit stream that is coded using a method as claimed in claim 1.

64. Recorder comprising a coder as claimed in claim 32.

* * * * *